United States Patent
Ito et al.

(10) Patent No.: US 7,459,322 B2
(45) Date of Patent: Dec. 2, 2008

(54) METHOD FOR DISPOSING MATERIAL BY DROPLET EJECTION, DISPLAY DEVICE, METHOD FOR MANUFACTURING DISPLAY DEVICE, AND ELECTRONIC APPARATUS

(75) Inventors: Tatsuya Ito, Matsumoto (JP); Satoru Katagami, Hara-mura (JP); Tomomi Kawase, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 242 days.

(21) Appl. No.: 10/375,144

(22) Filed: Feb. 28, 2003

(65) Prior Publication Data

US 2004/0009303 A1 Jan. 15, 2004

(30) Foreign Application Priority Data

Mar. 14, 2002 (JP) .............................. 2002-070948

(51) Int. Cl.
*H01L 21/20* (2006.01)
(52) U.S. Cl. .......................................... 438/29; 438/99
(58) Field of Classification Search .................. 438/22, 438/29, 30, 99; 427/66; 428/690; 257/40; 313/504; 445/24
See application file for complete search history.

(56) References Cited

U.S. PATENT DOCUMENTS

| | | | | |
|---|---|---|---|---|
| 6,008,582 | A * | 12/1999 | Asano et al. ................. | 313/582 |
| 6,630,274 | B1 * | 10/2003 | Kiguchi et al. ................. | 430/7 |
| 6,800,871 | B2 * | 10/2004 | Matsuda et al. ............... | 257/30 |
| 6,870,584 | B2 * | 3/2005 | Kawase et al. .............. | 349/106 |
| 2001/0007733 | A1 * | 7/2001 | Matsuyama et al. ............ | 430/7 |
| 2002/0048730 | A1 * | 4/2002 | Hatori et al. ................ | 430/322 |
| 2003/0171059 | A1 * | 9/2003 | Kawase et al. ................ | 445/24 |

FOREIGN PATENT DOCUMENTS

| | | |
|---|---|---|
| JP | 8-271720 | 10/1996 |
| JP | 11-326625 | 11/1999 |

* cited by examiner

*Primary Examiner*—Savitri Mulpuri
(74) *Attorney, Agent, or Firm*—Oliff & Berridge, PLC

(57) ABSTRACT

The invention provides a method for suppressing insufficient spread of droplets or mixing of the droplets in neighboring regions when a liquid material is disposed in the regions on a substrate by ejecting the droplets composed of the liquid material. In addition, for a display device, the structure in which insufficient spread of droplets or mixing of the droplets in neighboring regions can be suppressed and the manufacturing method therefor are provided. To accomplish the above, substantially square regions can be formed by a partition provided on a substrate. In each region, among internal surfaces and of the partition surrounding this region, the internal surfaces forming the long sides of the region have irregularities. In addition, the distance between parts of the partition opposing each other with one of regions provided therebetween is increased and decreased along the long side of the region. Furthermore, along the long side of the region, the width of the partition will be increased and decreased.

6 Claims, 24 Drawing Sheets

(a)

(b)

(c)

(a)

(b)

(c)

(a)

(b)

(c)

(a)

(b)

(c)

METHOD FOR DISPOSING MATERIAL BY DROPLET EJECTION, DISPLAY DEVICE, METHOD FOR MANUFACTURING DISPLAY DEVICE, AND ELECTRONIC APPARATUS

BACKGROUND OF THE INVENTION

1. Field of Invention

The present invention relates to methods for disposing a material by droplet ejection, display devices, methods for manufacturing a display device, and electronic apparatuses. More particularly, the invention relates to the structure suitably used for a color filter or an electrooptic device and a method for manufacturing the same.

2. Description of Related Art

In various display devices, color filters have been generally used for performing color display. In the color filter, dot-shaped filter elements in various colors, R (red), G (green), and B (blue), are arranged on a substrate composed of glass, plastic, or the like in a predetermined pattern, such as a stripe pattern, delta pattern, or a mosaic pattern.

In addition, as display devices represented by electrooptic devices, such as liquid crystal devices or EL (electroluminescent) devices, for example, there have been display devices each having the structure in which display dots are arranged on a substrate formed of glass or plastic, and the optical state of each display dot can be controlled independently. In this case, liquid crystal or an EL part is provided at each dot. As the arrangement of the display dots, for example, a lattice pattern (dot matrix) is generally formed in which dots are arranged in the longitudinal and lateral directions.

In display devices capable of performing color display, for example, display dots (liquid crystal or EL parts) corresponding to the colors R, G, and B described above are generally formed, and for example, three display dots capable of displaying an image in every color form one pixel. Accordingly, when gray scale of each of the display dots included in one pixel is independently controlled, color display can be performed.

In a process for manufacturing the display device described above, display elements (that is, liquid crystal or EL parts which form filter elements of the color filter or display dots, described above) may be formed in some cases, for example, by applying a photosensitive resin to a substrate, performing exposure and development of this photosensitive resin to form a lattice-shaped partition (bank), and supplying droplets which are ejected by a head or the like to regions defined by the partition mentioned above followed by drying. In the process described above, since the display elements are not necessarily patterned for each color by a photolithographic method, compact display devices used for mobile electronic apparatuses, such as mobile phones or mobile information terminals, can be efficiently formed, and in addition, an advantage can be obtained in that highly precise and fine display devices for use in projectors or the like can also be easily formed.

SUMMARY OF THE INVENTION

In conventional methods for manufacturing color filters or display devices (electrooptic devices), as shown in FIG. 13, when droplets 8 are supplied in regions (filter element-forming regions, liquid crystal-enclosing regions, or EL part-forming regions) 7 defined by a partition 6, liquid material A and B is received in one region 7 by supplying one or more (three droplets are shown in the figure by way of example) droplets 8. However, when the amount of the droplet 8 is relatively small as shown in FIG. 13(a), spread of liquid materials A and B in the regions 7 is not sufficient, and as a result, void portions (non-colored portions) which are not filled with the liquid materials A and B may be formed in the regions 7 in some cases. In this case, the contrast of display is decreased. On the contrary, as shown in FIG. 13(b), when the amount of the droplet 8 is relatively large, the liquid materials A and B are excessively spread when being supplied in the regions 7 and may overflow the partition 6 and enter neighboring regions 7 in some cases. In this case, mixing of different types of materials or color mixture occurs in neighboring regions 7, and hence, the contrast of display is also decreased as described above.

In particular, as shown in FIG. 13(c), when the droplet 8 is ejected to a substrate 12, the material A is temporarily spread widely by the impact generated by this hit as shown in FIG. 13(d). Accordingly, when being finally disposed on the substrate 12, as shown in FIG. 13(e), a part of the liquid material A may remain in a region other than the region at which the liquid material A should be disposed in some cases. Hence, when an ejection speed of the droplets 8 is fast, although the amount of the liquid material A scarcely fills the region 7 described above, a part of the liquid material A may enter neighboring regions 7 with high probability.

Accordingly, in order to suppress the degradation of display quality caused by the reasons described above, the amount of the droplet 8 must be set to a predetermined amount in accordance with the size of the region 7, and the amount actually ejected must be precisely controlled. However, when a highly precise and fine display device is formed, since the amount of the droplet 8 is extremely small, it is generally difficult to precisely control the amount of the droplet, and in addition, decrease in yield of the product may occur in some cases together with decrease in production efficiency.

In addition, in order to prevent defects caused by insufficient spread of the liquid material or mixing of the droplets in the neighboring regions, as described above, the distance between the neighboring regions must be increased to some extent. However, this increase may cause decrease in aperture ratio required for display devices, and as a result, a problem may occur in that it becomes difficult to realize a highly precise and fine display structure.

Accordingly, the present invention was made to solve the problems described above, and an object of the present invention is to provide a method for suppressing insufficient spread of droplets and mixing of droplets in neighboring regions when a liquid material in the form of droplets is ejected to a substrate. In addition, another object of the present invention is to provide a display device having the structure in which the insufficient spread of droplets and mixing thereof in neighboring regions can be suppressed and a method for manufacturing the same.

To these ends, a method for disposing a material by droplet ejection, according to the present invention, is a method for disposing a liquid material on a substrate by ejecting droplets of the liquid material. The method described above comprises a step of forming a partition on the substrate, and a step of hitting substantially square or strip regions defined by the partition with the droplets. The distance between parts of the partition opposing each other with each of the regions provided therebetween is increased and decreased along the extending direction of the partition, and the droplets hit positions each corresponding to that at which the distance between the parts of the partition is maximum.

According to the present invention, when the droplets hit the regions defined by the partition, the distance between the parts of the partition with each region provided therebetween is increased and decreased along the extending direction of the partition, and the droplets hit the positions each corresponding to that at which the distance of the parts of the partition is maximum. Accordingly, even when the droplets are spread around upon hitting the regions, since the distance of the parts of the partition is maximum at each hitting position, the liquid material is likely to remain in the regions, in other words, the liquid material becomes unlikely to overflow the partition, and as a result, mixing of liquid materials in neighboring regions hardly occurs. Hence, the margin for the droplet amount can be increased, production can be easily performed, and production efficiency can be increased. In addition, by increasing the droplet amount to some extent, insufficient spread of the liquid material in the regions can also be suppressed, and in addition, product quality (such as display quality) can be improved.

As the extending direction of the partition, when the square regions are formed, the extending direction is the direction along one of the sides thereof, and when the strip regions are formed, the extending direction is the direction in which the region itself extends. In addition, the distance of the parts of the partition is preferably increased and decreased smoothly, and the internal surfaces of the partition facing the regions preferably have curved surfaces. Accordingly, due to the smoothly curved internal surfaces, the liquid material is easily spread in the regions, and hence insufficient spread of the liquid material can be suppressed.

In the present invention, the regions may be substantially rectangular, and the distance between the parts of the partition is preferably increased and decreased along the long side of said each of the regions.

According to the present invention, in the rectangular region, since the distance of the parts of the partition is increased and decreased along the long side, defects in which the liquid material overflows the short sides, at which mixing is essentially likely to occur, and then enters neighboring regions can be reduced, thereby obtaining particularly significant advantage.

In the present invention, it is preferable that the width of a part of the partition surrounding each of the regions be substantially constant along the extending direction of the partition.

According to the present invention, since the width of the partition is substantially constant along the extending direction thereof, an enclosing effect of enclosing the liquid material by the partition can be made approximately constant along the extending direction described above, mixing of materials in neighboring regions can be more reliably suppressed, and a ratio of the regions to the total area (for example, an aperture ratio of a display device) can be increased. In this case, in more particular, when the distance between parts of the partition is increased at a position of one region, the distance between parts of the partition at a corresponding position thereto of a neighboring region is more preferably decreased in order to increase the ratio of the regions.

In the present invention, the width of a part of the partition surrounding each of the regions is preferably increased and decreased along the extending direction of the partition.

According to the present invention, since the width of the partition is increased and decreased along the extending direction thereof, the partition may have the structure in which the distance between parts of the partition can be increased and decreased by the increase and decrease of the width of the partition. Accordingly, for example, since the distance can be increased at which the width of the partition is decreased, and the distance can be decreased at which the width of the partition is increased, without changing a pattern of the regions, mixing of materials in neighboring regions can be suppressed.

Next, another method for disposing a material by droplet ejection, according to the present invention, is a method for disposing a liquid material on a substrate by ejecting droplets of the liquid material. The method described above comprises a step of forming a partition on the substrate, and a step of hitting substantially square or strip regions defined by the partition with the droplets. A width of a part of the partition surrounding each of the regions is increased and decreased along the extending direction of the partition, and the droplets hit positions each corresponding to that at which the width of the part of the partition is maximum.

According to the present invention, since the droplets hit the positions each corresponding to that at which the width of the partition is maximum, even when the droplets are spread around upon hitting the regions, due to the maximum width of the partition of the hitting position of each droplet, the liquid material is unlikely to overflow the partition, and as a result, mixing of liquid materials in neighboring regions hardly occurs. Hence, the margin for the droplet amount can be increased, production can be easily performed, and production efficiency can be increased. In addition, by increasing the droplet amount to some extent, insufficient spread of the liquid material in the regions can also be suppressed, and in addition, product quality (such as display quality) can be improved.

As the extending direction of the partition, when the square regions are formed, the extending direction is the direction along one of the sides thereof, and when the strip regions are formed, the extending direction is the direction in which the region itself extends. In addition, the width of the partition is preferably increased and decreased smoothly, and the internal surfaces of the partition facing the regions preferably have curved surfaces. Accordingly, due to the smoothly curved internal surfaces, the liquid material is easily spread in the regions, and hence insufficient spread of the liquid material can be suppressed.

In the present invention, the regions may be substantially rectangular, and the width of the partition is preferably increased and decreased along the long side of said each of the regions.

According to the present invention, in the rectangular region, since the width of the partition is increased and decreased along the long side, defects in which the liquid material overflows the short sides, at which mixing is essentially likely to occur, and then enters neighboring regions can be reduced, thereby obtaining particularly significant advantage.

Next, another method for disposing a material by droplet ejection, according to the present invention, is a method for disposing a liquid material on a substrate by ejecting droplets of the liquid material. The method described above comprises a step of forming a partition on the substrate, and a step of hitting substantially square regions defined by the partition with the droplets, wherein the width of the region is large at a position corresponding to an approximately central position of one side of each of the regions and is small at positions corresponding to the two ends of said one side thereof, and the droplets hit approximately central positions of the regions.

According to the present invention, since the width of the partition is large at a position corresponding to an approximately central portion of one side of each of the square regions and is small at positions corresponding to the two ends of said one side thereof, when the droplets of the liquid material hit the approximately central positions of the regions, the spread of the droplet can be prevented by the large width of the partition, and hence defects in which the liquid material enters neighboring regions can be reduced. In this case, it is preferable that the regions be rectangular, and that the width of the partition be large at a position corresponding to an approximately central portion of the long side and be small at the two ends thereof. In addition, when hitting the approximately central positions of the regions, the droplets may also hit another position additionally in each of the regions.

In addition, as is the case described above, when the width of the partition is large at a position corresponding to an approximately central portion of one side of the square region and is small at positions corresponding to the two ends of the side thereof, even in the static state after the liquid material is supplied in the regions, mixing (such as color mixture) of liquid materials in neighboring regions can be suppressed. Differing from what described above, this advantage can be obtained regardless of the hitting positions of the droplets (that is, even when the droplets do not hit the central positions of the regions).

Next, another method for disposing a material by droplet ejection, according to the present invention, is a method for disposing a liquid material on a substrate by ejecting droplets of the liquid material. The method described above comprises a step of forming a shade portion on the substrate, and a step of hitting with the droplets substantially square or strip opening portions at which the shade portion is not provided. A distance between parts of the shade portion opposing each other with each of the opening portions provided therebetween is increased and decreased along the extending direction of the shade portion, and the droplets hit positions each corresponding to that at which the distance between the parts of the shade portion is maximum.

According to the present invention, when the droplets hit the opening portions at which the shade portion is not provided, the distance between the parts of the shade portion with each of the opening portions provided therebetween is increased and decreased along the extending direction of the partition, and the droplets hit the positions each corresponding to that at which the distance of the parts of the shade portion is maximum. Accordingly, even when the droplets are spread around upon hitting the opening portions, since the distance between the parts of the shading portion is maximum, if the shade portion has a physical thickness or properties preventing the liquid material from spreading (such as properties repelling the liquid material), the liquid material is prevented from entering neighboring opening portions by the presence of the shade portion, and hence mixing of liquid materials in neighboring opening portions hardly occurs. In addition, when the shade portion has no physical thickness nor properties preventing the liquid material from spreading, and when insufficient spread of the liquid material occurs in an area away from the hitting position of the droplet, the area at which the insufficient spread occurs becomes easily shaded with the shade portion. Hence, the margin for the droplet amount can be increased, production can be easily performed, and production efficiency can be increased. In addition, for example, by increasing the droplet amount to some extent, insufficient spread of the liquid material in the opening portion can be suppressed, and by decreasing the droplet amount to some extent, mixing of liquid materials can be suppressed, thereby increasing the allowance for adjustment of the material amount and further improving product quality (such as display quality).

As the extending direction of the shade portion, when the square opening portions are formed, the extending direction is the direction along one of the sides thereof, and when the strip opening portions are formed, the extending direction is the direction in which the opening portion itself extends. In addition, the distance of the parts of the shade portion is preferably increased and decreased smoothly, and the shade portion preferably has curved outlines facing the opening portions. Accordingly, due to the smoothly curved outlines, the liquid material is easily filled in the opening portions, and hence insufficient spread of the liquid material can be suppressed.

In the present invention, the opening portions may be substantially rectangular, and the distance between the parts of the shade portion is preferably increased and decreased along the long side of said each of the opening portions.

According to the present invention, in the rectangular opening portion, since the distance of the parts of the shade portion is increased and decreased along the long side, when the shade portion has a physical thickness or properties preventing the liquid material from spreading, defects in which the liquid material overflows the short sides, at which mixing is essentially likely to occur, and then enters neighboring opening portions can be reduced. In addition, even when the shade portion has no physical thickness nor properties preventing the liquid material from spreading, insufficient spread of the liquid material, which occurs at a place away from the hitting position of the droplet, can be easily shaded with the shade portion, thereby obtaining particularly significant advantage.

In the present invention, it is preferable that the width of a part of the shade portion surrounding each of the opening portions be substantially constant along the extending direction of the shade portion.

According to the present invention, since the width of the shade portion is substantially constant along the extending direction thereof, when the shade portion has a physical thickness or properties preventing the liquid material from spreading, the effect of preventing the liquid material from entering neighboring opening portions can be made approximately constant along the extending direction described above, and mixing of materials in neighboring opening portions can be more reliably suppressed. In addition, even when the shade portion has no physical thickness nor properties preventing the liquid material from spreading, a ratio of the opening portions to the total area (for example, an aperture ratio of a display device) can be increased. In this case, in more particular, when the distance between parts of the shade portion is increased at a position of one opening portion, the width between parts of the shade portion at a corresponding position thereto of a neighboring opening portion is more preferably decreased in order to increase the ratio of the opening portions.

In the present invention, the width of a part of the shade portion surrounding each of the opening portions is preferably increased and decreased along the extending direction of the shade portion.

According to the present invention, since the width of the shade portion is increased and decreased along the extending direction thereof, the shading portion may have the structure in which the distance between parts of the shade portion can be increased and decreased by the increase and decrease of the width of the shade portion. Accordingly, for example, since the distance of the parts of the shade portion can be increased at which the width of the shade portion is decreased, and the distance can be decreased at which the width of the shade portion is increased, without changing a pattern of the opening portions, mixing of materials in neighboring opening portions can be suppressed (when the shade portion has a physical thickness and properties of preventing the liquid material from spreading), or insufficient spread of the liquid material can be shaded (when the shade portion has nor physical thickness nor properties of preventing the liquid material from spreading).

Next, another method for disposing a material by droplet ejection, according to the present invention, is a method for disposing a liquid material on a substrate by ejecting droplets of the liquid material. The method described above comprises a step of forming a shade portion on the substrate, and a step of hitting with the droplets substantially square or strip opening portions at which the shade portion is not provided, wherein the width of a part of the shade portion surrounding each of the opening portion is increased and decreased along the extending direction of the shade portion, and the droplets hit positions each corresponding to that at which the width of the part of the shade portion is maximum.

According to the present invention, the droplets hit positions each corresponding to that at which the width of the shade portion is maximum. Hence, even when the droplets are spread around upon hitting the opening portions, since the width of the shade portion is maximum at the hitting position of the droplet, if the shade portion has a physical thickness or properties preventing the liquid material from spreading, the liquid material becomes unlikely to overflow the shade portion, and hence mixing of liquid materials in neighboring opening portions hardly occurs. In addition, even when the shade portion has no physical thickness nor properties preventing the liquid material from spreading, an effect of shading areas at which liquid materials in neighboring opening portions are mixed with each other can be obtained by the shade portion. Hence, the margin for the droplet amount can be increased, production can be easily performed, and production efficiency can be increased. In addition, for example, by increasing the droplet amount to some extent, insufficient spread of the liquid material in the opening portions can be suppressed, and by decreasing the droplet amount to some extent, mixing of liquid materials can be suppressed, thereby improving product quality (such as display quality).

As the extending direction of the shade portion, when the square opening portions are formed, the extending direction is the direction along one of the sides thereof, and when the strip opening portions are formed, the extending direction is the direction in which the opening portion itself extends. In addition, the width of the shade portion is preferably increased and decreased smoothly, and the shade portion preferably has curved outlines facing the opening portions. Accordingly, due to the smoothly curved outline, the liquid material is easily spread in the opening portions, and hence insufficient spread of the liquid material can be suppressed.

In the present invention, the opening portions may be substantially rectangular, and the width of the shade portion is preferably increased and decreased along the long side of said each of the opening portions.

According to the present invention, in the rectangular opening portion, since the width of the shade portion is increased and decreased along the long side, when the shade portion has a physical thickness or properties preventing the liquid material from spreading, defects in which the liquid material overflows the short sides, at which mixing is essentially likely to occur, and then enters neighboring opening portions can be reduced. In addition, even when the shade portion has no physical thickness nor properties preventing the liquid material from spreading, mixing of liquid materials in neighboring opening portions can be easily shaded with the shade portion, thereby obtaining particularly significant advantage.

In the present invention, the shade portion is preferably formed of a partition provided on the substrate.

According to the present invention, since the shade portion is formed of the partition, the partition has both the enclosing effect of enclosing liquid material and the shading function, manufacturing process can be simplified, production cost can be reduced, and the structure can also be simplified, thereby easily increasing the arrangement density of the opening portions.

Next, another method for disposing a material by droplet ejection, according to the present invention, is a method for disposing a liquid material on a substrate by ejecting droplets of the liquid material. The method described above comprises a step of forming a shade portion on the substrate, and a step of hitting with the droplets substantially square opening portions at which the shade portion is not provided, wherein the width of the shade portion is large at a position corresponding to an approximately central portion of one side of each of the opening portions and is small at positions corresponding to the two ends of said one side thereof, and the droplets hit approximately central positions of the opening portions.

According to the present invention, since the width of the shade portion is large at a position corresponding to an approximately central portion of one side of each of the square opening portions and is small at positions corresponding to the two ends of said one side thereof, when the droplets hit the approximately central positions of the opening portions, the spread of the droplet can be received by the large width of the shade portion. Accordingly, when the shade portion has a physical thickness or properties preventing the liquid material from spreading, mixing of liquid materials in neighboring opening portions can be suppressed. In addition, even when the shade portion has no physical thickness nor properties preventing the liquid material from spreading, areas at which mixing of liquid materials in neighboring opening portions occurs can be easily shaded by the shade portion. In this case, it is preferable that the opening portions be rectangular, and that the width of the shade portion be large at a position corresponding to an approximately central portion of the long side and be small at the two ends thereof. In addition, when hitting the approximately central positions of the opening portions, the droplets may also hit another position additionally in each of the opening portions.

In addition, as is the case described above, when the width of the shade portion is large at a position corresponding to an approximately central portion of one side of the square opening portion and is small at positions corresponding to the two ends of said one side thereof, if the shade portion has a physical thickness or properties preventing the liquid material from spreading, even in the static state after the liquid material is supplied in the opening portions, mixing (such as color mixture) of the liquid materials in neighboring opening portions can be suppressed. In addition, even when the shade portion has no physical thickness nor properties preventing the liquid material from spreading, areas at which mixing of liquid materials occurs in the vicinity of the central portions of neighboring opening portions can be easily shaded with the shade portion. Being different from those described above, this advantage can be obtained regardless of the hitting positions of the droplets (that is, even when the droplets do not hit the central positions of the opening portions).

Next, a display device of the present invention comprises a substrate, a partition provided on the substrate, and display elements disposed in substantially square or strip regions defined by the partition, wherein the distance between parts of the partition with each of the regions provided therebetween is increased and decreased along the extending direction of the partition.

According to the present invention, when the display elements are formed by supplying the droplets of the liquid material in the regions, and the droplets hit the regions defined by the partition, the distance between the parts of the partition with each region provided therebetween is increased and decreased along the extending direction of the partition, and the droplets hit the positions each corresponding to that at which the distance of the parts of the partition is maximum. Accordingly, even when the droplets are spread around upon hitting the regions, since the distance of the parts of the partition is maximum at the hitting position, the liquid material is likely to remain in each of the regions, in other words, the liquid material is unlikely to overflow the partition, and as a result, mixing of liquid materials in neighboring regions hardly occurs. Hence, the margin for the droplet amount can be increased, production can be easily performed, and production efficiency can be increased. In addition, by increasing the droplet amount to some extent, insufficient spread of the liquid material in the region can be suppressed. Furthermore, since mixing of materials and insufficient spread can be suppressed, the width of the partition can be decreased, the density of the display elements can be easily increased thereby, and as a result, highly precise and fine display can be realized. In addition, since color mixture caused by mixing of materials and formation of non-colored portions caused by insufficient spread of materials can be suppressed, product quality (such as display quality) can also be improved.

As the extending direction of the partition, when the square regions are formed, the extending direction is the direction along one of the sides thereof, and when the strip regions are formed, the extending direction is the direction in which the regions itself extend. In addition, the distance of the parts of the partition is preferably increased and decreased smoothly, and the internal surfaces of the partition facing the regions preferably have curved surfaces.

Accordingly, due to the smoothly curved internal surfaces, the liquid material is easily spread in the regions, and hence insufficient spread of the liquid material can be suppressed.

In the present invention, the regions may be substantially rectangular, and the distance between the parts of the partition is preferably increased and decreased along the long side of said each of the regions.

According to the present invention, in the rectangular region, since the distance of the parts of the partition is increased and decreased along the long side, defects in which the liquid material overflows the short sides, at which mixing is essentially likely to occur, and enters neighboring regions can be reduced, thereby obtaining particularly significant advantage.

In the present invention, it is preferable that the width of a part of the partition surrounding each of the regions be substantially constant along the extending direction of the partition.

According to the present invention, since the width of the partition is substantially constant along the extending direction thereof, the enclosing effect of enclosing the liquid material by the partition can be made approximately constant along the extending direction described above, mixing of materials in neighboring regions can be more reliably suppressed, and a ratio of the regions to the total area, i.e., an aperture ratio of a display device, can be increased. In this case, in more particular, when the distance between parts of the partition is increased at a position of one region, the distance of parts of the partition at a corresponding position thereto of a neighboring region is more preferably decreased in order to increase the aperture ratio.

In the present invention, the width of a part of the partition surrounding each of the regions is preferably increased and decreased along the extending direction of the partition.

According to the present invention, since the width of the partition is increased and decreased along the extending direction thereof, the partition may have the structure in which the distance between parts of the partition can be increased and decreased by the increase and decrease of the width of the partition. Accordingly, for example, since the distance can be increased at which the width of the partition is decreased, and the distance can be decreased at which the width of the partition is increased, without changing a pattern of the regions, mixing of materials in neighboring regions can be suppressed.

Next, another display device of the present invention comprises a substrate, a partition provided on the substrate, and display elements disposed in regions defined by the partition, wherein the width of a part of the partition surrounding each of the regions is increased and decreased along the extending direction of the partition.

According to the present invention, when the display elements are formed by supplying the droplets of the liquid material in the regions, the droplets hit the positions each corresponding to that at which the width of the part of the partition is maximum. The droplets are spread around upon hitting the regions; however, since the width of the partition is maximum at the hitting position, the liquid material is unlikely to overflow the partition, and as a result, mixing of liquid materials in neighboring regions hardly occurs. Hence, the margin for the droplet amount can be increased, production can be easily performed, and production efficiency can be increased. In addition, by increasing the droplet amount to some extent, insufficient spread of the liquid material in the region can be suppressed, and in addition, product quality (such as display quality) can be improved.

As the extending direction of the partition, when the square regions are formed, the extending direction is the direction along one of the sides thereof, and when the strip regions are formed, the extending direction is the direction in which the region itself extends. In addition, the width of the partition is preferably increased and decreased smoothly, and the internal surfaces of the partition facing the regions preferably have curved surfaces. Accordingly, due to the smoothly curved internal surfaces, the liquid material is easily spread in the regions, and hence insufficient spread of the liquid material can be suppressed.

In the present invention, the regions may be substantially rectangular, and the width of the partition is preferably increased and decreased along the long side of said each of the regions.

According to the present invention, in the rectangular region, since the width of the partition is increased and decreased along the long side, defects in which the liquid material overflows the short sides, at which mixing is essentially likely to occur, and enters neighboring regions can be reduced, thereby obtaining particularly significant advantage.

Next, another display device of the present invention comprises a substrate, a partition provided on the substrate, and display elements disposed in substantially square regions defined by the partition, wherein the width of a part of the partition surrounding each of the regions is large at a position corresponding to an approximately central portion of one side of said each of the regions and is small at positions corresponding to the two ends of said one side thereof.

According to the present invention, in the case in which the display elements are formed by hitting the regions described above with ejected droplets of the liquid material, since the width of the partition is large at a position corresponding to an approximately central portion of one side of each of the square regions and is small at positions corresponding to the two ends of said one side thereof, when the droplets of the liquid material hit the approximately central positions of the regions, the spread of the droplet can be prevented by the large width of the partition, and hence mixing of liquid material in neighboring regions can be suppressed. In this case, it is preferable that the regions be rectangular, and that the width of the partition be large at a position corresponding to an approximately central portion of the long side and be small at the two ends thereof.

Next, another display device of the present invention comprises a substrate, a shade portion, and display elements disposed in substantially square or strip opening portions at which the shade portion is not provided, wherein the distance between parts of the shade portion opposing each other with each of the opening portions provided therebetween is increased and decreased along the extending direction of the shade portion.

According to the present invention, when the display elements are formed by supplying the droplets of the liquid material in the opening portions, and the droplets hit the opening portions at which the shade portion is not provided, the distance between the parts of the shade portion with each of the opening portions provided therebetween is increased and decreased along the extending direction of the shade portion, and the droplets hit the positions each corresponding to that at which the distance of the parts of the shade portion is maximum. Accordingly, even when the droplets are spread around upon hitting the opening portions, since the distance of the parts of the shade portion is maximum at the hitting position of the droplet, it becomes difficult for the liquid material to overflow the shade portion, and insufficient spread of the liquid material at a position away from the hitting position of the droplet can be easily shaded by the parts of the shade portion having a decreased distance therebetween. Hence, the margin for the droplet amount can be increased, production can be easily performed, and production efficiency can be increased. In addition, for example, by increasing the droplet amount to some extent, insufficient spread of the liquid material in the opening portions can be suppressed, and by decreasing the droplet amount to some extent, mixing of liquid materials can be suppressed, thereby increasing the allowance for adjustment of the material amount. Furthermore, since mixing of materials or insufficient spread can be suppressed, the width of the shade portion can be decreased, and the density of the display elements can be easily increased, thereby being able to perform highly precise and fine display.

In addition, since color mixture caused by mixing of materials, formation of non-colored portions caused by insufficient spread of materials can be reduced, product quality (such as display quality) can also be improved.

As the extending direction of the shade portion, when the square opening portions are formed, the extending direction is the direction along one of the sides thereof, and when the strip opening portions are formed, the extending direction is the direction in which the opening portion itself extends. In addition, the distance of the parts of the shade portion is preferably increased and decreased smoothly, and the shade portion preferably has curved outlines facing the opening portions. Accordingly, due to the smoothly curved outlines, the liquid material is easily spread in the opening portions, and hence insufficient spread of the liquid material can be suppressed.

In the present invention, the opening portions may be substantially rectangular, and the distance between the parts of the shade portion is preferably increased and decreased along the long side of said each of the opening portions.

According to the present invention, in the rectangular opening portion, since the distance of the parts of the shade portion is increased and decreased along the long side, defects in which the liquid material overflows the short sides, at which mixing is essentially likely to occur, and then enters neighboring opening portions can be reduced. In addition, insufficient spread of the liquid material at a place away from the hitting position of the droplet can be easily shaded with the shade portion, thereby obtaining particularly significant advantage.

In the present invention, it is preferable that the width of a part of the shade portion described above surrounding each of the opening portions be substantially constant along the extending direction of the shade portion.

According to the present invention, since the width of the shade portion is substantially constant along the extending direction thereof, mixing of materials in neighboring opening portions can be more reliably suppressed, and in addition, an aperture ratio of a display device, i.e., a ratio of the opening portions to the total area, can be increased. In this case, in more particular, when the distance between parts of the shade portion is increased at a position of one opening portion, the width of parts of the shading portion at a corresponding position thereto of a neighboring opening portion is more preferably decreased in order to increase the aperture ratio.

In the present invention, the width of a part of the shade portion surrounding each of the opening portions is preferably increased and decreased along the extending direction of the shade portion.

According to the present invention, since the width of the shade portion is increased and decreased along the extending direction thereof, the shading portion may have the structure in which the distance between parts of the shade portion can be increased and decreased by the increase and decrease of the width of the shade portion. Accordingly, for example, since the distance of the parts of the shade portion can be increased where the width of the shade portion is decreased, and the distance can be decreased where the width of the shade portion is increased, without changing a pattern of the opening portions, mixing of materials in neighboring opening portions can be suppressed, or insufficient spread of the liquid material can be shaded.

Next, another display device of the present invention comprises a substrate, a shade portion, and display elements disposed in substantially square or strip opening portions at which the shade portion is not provided, wherein the width of a part of the shade portion surrounding each of the opening portions is increased and decreased along the extending direction of the shade portion.

According to the present invention, when the display elements are formed by supplying the droplets of the liquid material in the opening portions, the droplets hit positions each corresponding to that at which the width of the shade portion is maximum. Hence, even when the droplets are spread around upon hitting the opening portions, since the width of the shade portion is maximum at the hitting position of the droplet, the liquid material becomes unlikely to overflow the shade portion, and as a result, mixing of liquid materials in neighboring opening portions hardly occurs, or an effect of shading areas at which mixing of materials in neighboring opening portions occurs can be obtained. Accordingly, the margin for the droplet amount can be increased, production can be easily performed, and production efficiency can be increased. In addition, for example, by increasing the droplet amount to some extent, insufficient spread of the liquid material in the opening portions can be suppressed, and by decreasing the droplet amount to some extent, mixing of liquid materials can be suppressed, thereby increasing the allowance for adjustment of the material amount. Accordingly, product quality (such as display quality) can be further improved.

As the extending direction of the shade portion, when the square opening portions are formed, the extending direction is the direction along one of the sides thereof, and when the strip opening portions are formed, the extending direction is the direction in which the opening portion itself extends. In addition, the width of the shade portion is preferably increased and decreased smoothly, and the shade portion preferably has curved outlines facing the opening portions. Accordingly, due to the smoothly curved outlines, the liquid material is easily spread in the opening portions, and hence insufficient spread of the liquid material can be suppressed.

In the present invention, the opening portions may be substantially rectangular, and the width of the part of the shade portion is preferably increased and decreased along the long side of said each of the opening portions.

According to the present invention, since the width of the shade portion is increased and decreased along the extending direction thereof, the shading portion may have the structure in which the distance between parts of the shade portion can be increased and decreased by the increase and decrease of the width of the shade portion. Accordingly, for example, since the distance of the parts of the shade portion can be increased where the width of the shade portion is decreased, and the distance can be decreased where the width of the shade portion is increased, without changing a pattern of the opening portions, mixing of materials in neighboring opening portions can be suppressed, or areas at which mixing of liquid materials in neighboring opening portions occurs can be shaded.

Another display device of the present invention comprises a substrate, a shade portion, and display elements disposed in substantially square opening portions at which the shade portion is not provided, wherein the width of a part of the shade portion surrounding each of the opening portions is large at a position corresponding to an approximately central portion of one side of said each of the opening portions and is small at positions corresponding to the two ends of said one side thereof.

According to the present invention, in the case in which the display elements are formed by hitting the opening portions described above with ejected droplets of the liquid material, since the width of the part of the shade portion is large at a position corresponding to an approximately central portion of one side of each of the square opening portions and is small at positions corresponding to the two ends of said one side thereof, when the droplets of the liquid material hit the approximately central positions of the opening portions, the spread of the droplet can be received by the large width of the shade portion, and hence, when the shade portion has a physical thickness or properties of preventing the liquid material from spreading, defects in which the liquid material enters neighboring opening portions can be reduced. In addition, even when the shade portion has nor physical thickness nor properties of preventing the liquid material from spreading, mixing of liquid materials in neighboring opening portions can be easily shaded by the shade portion. In this case, it is preferable that the opening portions be rectangular, and that the width of the shade portion be large at a position corresponding to an approximately central portion of the long side and be small at the two ends thereof.

In the present invention, the shade portion is preferably formed of a partition provided on the substrate.

According to the present invention, since the shade portion is formed of the partition, the partition has the enclosing function of enclosing the liquid material and the shading function. Hence, the manufacturing process can be simplified, the production cost can be reduced, and in addition, the structure can be simplified, thereby easily increasing arrangement density of the opening portions.

In the present invention, the display elements may be filter elements used as constituent elements of a color filter in some cases. Related to this, as the filter elements, for example, a plurality of color elements are arranged in a predetermined pattern, such as a stripe pattern, delta pattern, or mosaic pattern. Accordingly, while preventing color mixture between neighboring regions or opening portions and formation of non-colored portions in regions or opening portions, the margin for the droplet amount can be secured, and the width of the shade portion can be decreased.

In the present invention, the display elements may be electroluminescents (EL) parts forming display dots in some cases. As the EL parts, parts emitting various colors are preferably arranged in a predetermined pattern, such as a stripe pattern, delta pattern, or mosaic pattern. In the case described above, while preventing color mixture between neighboring regions or opening portions and formation of non-colored portions in regions or opening portions, the margin for the droplet amount can be secured, and the width of the shade portion can be decreased.

Next, an electronic apparatus of the present invention comprises one of the display devices described above. As the electronic apparatus, in particular, mobile electronic apparatuses, such as mobile phones or mobile information terminals, are preferable. In addition, electronic apparatuses incorporating a display device capable of displaying highly precise and fine images, such as a projector, are also preferable.

Next, a method for manufacturing a display device, according to the present invention, is a method for manufacturing a display device comprising a substrate, a partition on the substrate, and display elements disposed in substantially square or strip regions defined by the partition. The method described above comprises a step of forming the partition on the substrate, and a step of hitting the regions with ejected droplets composed of a liquid material. A distance between parts of the partition opposing each other with each of the regions provided therebetween is increased and decreased along the extending direction of the partition, and the droplets hit positions each corresponding to that at which the distance between the parts of the partition is maximum.

According to the present invention, when the droplets hit the regions defined by the partition, the distance between the parts of the partition in each region is increased and decreased along the extending direction of the partition, and the droplets hit the positions each corresponding to that at which the distance of the parts of the partition is maximum. Accordingly, even when the droplets are spread around upon hitting the regions, since the distance of the parts of the partition is maximum, the liquid material is likely to remain in the regions, in other words, the liquid material becomes unlikely to overflow the partition, and as a result, mixing of liquid materials in neighboring regions hardly occur. Hence, the margin for the droplet amount can be increased, production can be easily performed, and production efficiency can be increased. In addition, by increasing the droplet amount to some extent, insufficient spread of the liquid material in the region can be suppressed. Furthermore, by suppressing mixing of materials and insufficient spread, the width of the partition can be decreased, and the density of the display elements can be easily increased, resulting in highly precise and fine display. In addition, since color mixture caused by mixing of materials and formation of non-colored portions caused by insufficient spread of the material can be suppressed, product quality, such as display quality, can also be improved.

As to the extending direction of the partition, when the square regions are formed, the extending direction is the direction along one of the sides thereof, and when the strip regions are formed, the extending direction is the direction in which the region itself extends. In addition, the distance of the parts of the partition is preferably increased and decreased smoothly, and the internal surfaces of the partition facing the regions preferably have curved surfaces.

Accordingly, due to the smoothly curved internal surfaces, the liquid material is easily spread in the regions, and hence insufficient spread of the liquid material can be suppressed.

In the present invention, the regions may be substantially rectangular, and the distance between the parts of the partition is preferably increased and decreased along the long side of said each of the regions.

According to the present invention, in the rectangular region, since the distance of the parts of the partition is increased and decreased along the long side, defects in which the liquid material overflows the short sides, at which mixing is essentially likely to occur, and enters neighboring regions can be reduced, thereby obtaining particularly significant advantage.

In the present invention, it is preferable that the width of a part of the partition surrounding each of the regions be substantially constant along the extending direction of the partition.

According to the present invention, since the width of the partition is substantially constant along the extending direction thereof, the enclosing effect of enclosing the liquid material by the partition can be made approximately constant along the extending direction described above, mixing of materials in neighboring regions can be more reliably suppressed, and a ratio of the regions to the total area, that is, an aperture ratio of a display device, can be increased. In this case, in more particular, when the distance between parts of the partition is increased at a position of one region, the distance of parts of the partition at a corresponding position thereto of a neighboring region is more preferably decreased in order to increase the aperture ratio.

In the present invention, the width of a part of the partition surrounding each of the regions is preferably increased and decreased along the extending direction of the partition.

According to the present invention, since the width of the partition is increased and decreased along the extending direction thereof, the partition may have the structure in which the distance between parts of the partition can be increased and decreased by the increase and decrease of the width of the partition. Accordingly, for example, since the distance can be increased where the width of the partition is decreased, and the distance can be decreased where the width of the partition is increased, without changing a pattern of the regions, mixing of liquid materials in neighboring regions can be suppressed.

Next, a method for manufacturing a display device, according to the present invention, is a method for manufacturing a display device comprising a substrate, a partition on the substrate, and display elements disposed in substantially square or strip-regions defined by the partition. The method described above comprises a step of forming the partition on the substrate, and a step of hitting the regions with ejected droplets composed of a liquid material. A width of a part of the partition surrounding each of the regions is increased and decreased along the extending direction of the partition, and the droplets hit positions each corresponding to that at which the width of the part of the partition is maximum.

According to the present invention, in the case in which the display elements are formed by supplying the droplets of the liquid material in the regions, the droplets hit the positions each corresponding to that at which the width of the part of the partition is maximum. Accordingly, even when the droplets are spread upon hitting the regions, due to the maximum width of the partition at the hitting position of each droplet, the liquid material is unlikely to overflow the partition, and as a result, mixing of liquid materials in neighboring regions hardly occurs. Hence, the margin for the droplet amount can be increased, production can be easily performed, and production efficiency can be increased. In addition, by increasing the droplet amount to some extent, insufficient spread of the liquid material in the region can be suppressed, and in addition, product quality, such as display quality, can be improved.

As to the extending direction of the partition, when the square regions are formed, the extending direction is the direction along one of the sides thereof, and when the strip regions are formed, the extending direction is the direction in which the region itself extends. In addition, the width of the partition is preferably increased and decreased smoothly, and the internal surfaces of the partition facing the regions preferably have curved surfaces. Accordingly, due to the smoothly curved internal surfaces, the liquid material is easily spread in the regions, and hence insufficient spread of the liquid material can be suppressed.

In the present invention, the regions may be substantially rectangular, and the width of the partition is preferably increased and decreased along the long side of said each of the regions.

According to the present invention, in the rectangular region, since the width of the partition is increased and decreased along the long side, defects in which the liquid material overflows the short sides, at which mixing is essentially likely to occur, and enters neighboring regions can be reduced, thereby obtaining particularly significant advantage.

Next, another method for manufacturing a display device, according to the present invention, is a method for manufacturing a display device comprising a substrate, a partition on the substrate, and display elements disposed in substantially square regions defined by the partition. The method described above comprises a step of forming the partition on the substrate, and a step of hitting the regions with ejected droplets composed of a liquid material, wherein the width of a part of the partition surrounding each of the regions is large at a position corresponding to an approximately central portion of one side of said each of the regions and is small at positions corresponding to the two ends of said one side thereof, and the droplets hit approximately central positions of the regions.

According to the present invention, since the width of the part of the partition is large at a position corresponding to an approximately central portion of one side of each of the square regions and is small at positions corresponding to the two ends of said one side thereof, when the droplets of the liquid material hit the approximately central positions of the regions, the spread of the droplet can be prevented by the large width of the partition, and hence mixing of materials in neighboring regions can be suppressed. In this case, it is preferable that the regions be rectangular, and that the width of the partition be large at a position corresponding to an approximately central portion of the long side and be small at the two ends thereof. In addition, when hitting the approximately central positions of the regions, the droplets may also hit another position additionally in each of the regions.

Next, a method for manufacturing a display device, according to the present invention, is a method for manufacturing a display device comprising a substrate, a shade portion on the substrate, and display elements disposed in substantially square or strip opening portions at which the shade portion is not provided. The method described above comprises a step of forming the shade portion on the substrate, and a step of hitting the opening portions with ejected droplets composed of a liquid material. A distance between parts of the shade portion opposing each other with each of the opening portions provided therebetween is increased and decreased along the extending direction of the shade portion, and the droplets hit positions each corresponding to that at which the distance between the parts of the shade portion is maximum.

According to the present invention, when the droplets hit the opening portions at which the shade portion is not provided, the distance between the parts of the shade portion with each of the opening portions provided therebetween is increased and decreased along the extending direction of the shade portion, and the droplets hit the positions each corresponding to that at which the distance of the parts of the shade portion is maximum. Accordingly, even when the droplets are spread around upon hitting the opening portions, due to the maximum distance of the parts of the shade portion at the hitting position of the droplet, the liquid material becomes difficult to overflow the shade portion, and hence mixing of liquid materials in neighboring opening portions hardly occurs. In addition, insufficient spread, which occurs at a place away from the hitting position of the droplet, is easily shaded with parts of the shade portion having a decreased distance therebetween. Hence, the margin for the droplet amount can be increased, production can be easily performed, and production efficiency can be increased. In addition, for example, by increasing the droplet amount to some extent, insufficient spread of the liquid material in the opening portion can be suppressed, and by decreasing the droplet amount to some extent, mixing of liquid materials can be suppressed, thereby easily increasing the allowance for adjustment of the material amount. Furthermore, since mixing of materials or insufficient spread can be suppressed, the width of the shade portion can be decreased, and the density of the display elements can be easily increased, thereby being able to perform highly precise and fine display. In addition, since color mixture caused by mixing of materials and formation of non-colored portions caused by insufficient spread can be suppressed, product quality, such as display quality, can also be improved.

As to the extending direction of the shade portion, when the square opening portions are formed, the extending direction is the direction along one of the sides thereof, and when the strip opening portions are formed, the extending direction is the direction in which the opening portion itself extends. In addition, the distance of the parts of the shade portion is preferably increased and decreased smoothly, and the shade portion preferably has curved outlines facing the opening portions. Accordingly, due to the smoothly curved outlines, the liquid material is easily spread in the opening portions, and hence insufficient spread of the liquid material can also be reduced.

In the present invention, the opening portions may be substantially rectangular, and the distance between the parts of the shade portion is preferably increased and decreased along the long side of said each of the opening portions.

According to the present invention, in the rectangular opening portion, since the distance of the parts of the shade portion is increased and decreased along the long side, defects in which the liquid material overflows the short sides, at which mixing is essentially likely to occur, and then enters neighboring opening portions can be reduced. In addition, insufficient spread of the liquid material, which occurs in an area away from the hitting position of the droplet, can be easily shaded, thereby obtaining particularly significant advantage.

In the present invention, it is preferable that the width of a part of the shade portion surrounding each of the opening portions be substantially constant along the extending direction of the shade portion.

According to the present invention, since the width of the shade portion is substantially constant along the extending direction thereof, mixing of materials in neighboring opening portions can be more reliably suppressed, and in addition, a ratio of the opening portions to the total area, i.e., an aperture ratio of the display device, can be increased. In this case, in more particular, when the distance between parts of the shade portion is increased at a position of one opening portion, the distance between parts of the shade portion at a corresponding position thereto of a neighboring opening portion is more preferably decreased in order to increase the aperture ratio.

In the present invention, the width of a part of the shade portion surrounding each of the opening portions is preferably increased and decreased along the extending direction of the shade portion.

According to the present invention, since the width of the shade portion is increased and decreased along the extending direction thereof, the shade portion may have the structure in which the distance between the parts of the shade portion can be increased and decreased by the increase and decrease of the width of the shade portion. Accordingly, for example, since the distance of the parts of the shade portion can be increased where the width of the shade portion is decreased, and the distance can be decreased where the width of the shade portion is increased, without changing a pattern of the opening portions, mixing of materials in neighboring opening portions can be suppressed, or insufficient spread of the liquid material can be shaded.

Next, a method for manufacturing a display device, according to the present invention, is a method for manufacturing a display device comprising a substrate, a shade portion on the substrate, and display elements disposed in substantially square or strip opening portions at which the shade portion is not provided. The method described above comprises a step of forming the shade portion on the substrate, and a step of hitting the opening portions with ejected droplets composed of a liquid material, wherein the width of a part of the shade portion surrounding each of the opening portions is increased and decreased along the extending direction of the shade portion, and the droplets hit positions each corresponding to that at which the width of the part of the shade portion is maximum.

According to the present invention, the droplets hit positions each corresponding to that at which the width of the shade portion is maximum. Hence, even when the droplets are spread around upon hitting the opening portions, since the width of the shade portion is maximum at the hitting position of the droplet, the liquid material becomes unlikely to overflow the shade portion, and hence mixing of liquid materials in neighboring opening portions hardly occurs or insufficient spread of the liquid material can be shaded by the shade portion, advantageously. Hence, the margin for the droplet amount can be increased, production can be easily performed, and production efficiency can be increased. In addition, for example, by increasing the droplet amount to some extent, insufficient spread of the liquid material in the opening portions can be suppressed, and by decreasing the droplet amount to some extent, mixing of liquid materials can be suppressed, thereby increasing the allowance for adjustment of the material amount and improving product quality (such as display quality).

As to the extending direction of the shade portion, when the square opening portions are formed, the extending direction is the direction along one of the sides thereof, and when the strip opening portions are formed, the extending direction is the direction in which the opening portion itself extends. In addition, the width of the shade portion is preferably increased and decreased smoothly, and the shade portion preferably has curved outlines facing the opening portions. Accordingly, due to the smoothly curved outline, the liquid material is easily spread in the opening portions, and hence insufficient spread of the liquid material can be suppressed.

In the present invention, the opening portions may be substantially rectangular, and the width of the part of the shade portion is preferably increased and decreased along the long side of said each of the opening portions.

According to the present invention, since the width of the shade portion is increased and decreased along the extending direction thereof, the shading portion may have the structure in which the distance between the parts of the shade portion can be increased and decreased by the increase and decrease of the width of the shade portion. Accordingly, for example, since the distance of the parts of the shade portion can be increased where the width of the shade portion is decreased, and the distance of the parts of the shading portion can be decreased where the width of the shade portion is increased, without changing a pattern of the opening portions, mixing of materials in neighboring opening portions can be suppressed, or insufficient spread of the liquid material can be shaded.

Next, another method for manufacturing a display device, according to the present invention, is a method for manufacturing a display device comprising a substrate, a shade portion on the substrate, and display elements disposed in substantially square opening portions at which the shade portion is not provided. The method described above comprises a step of forming the shade portion on the substrate, and a step of hitting the opening portions with ejected droplets composed of a liquid material, wherein the width of a part of the shade portion surrounding each of the opening portions is large at a position corresponding to an approximately central portion of one side of said each of the opening portions and is small at positions corresponding to the two ends of said one side thereof, and the droplets hit approximately central positions of the opening portions.

According to the present invention, since the width of the shade portion is large at a position corresponding to an approximately central portion of one side of each of the square opening portions and is small at positions corresponding to the two ends of said one side thereof, when the droplets hit the approximately central positions of the opening portions, the spread of the droplet can be received by the large width of the part of the shade portion. Accordingly, when the shade portion has a physical thickness or properties preventing the liquid material from spreading, defects in which the liquid material enters neighboring opening portions can be reduced. In addition, even when the shade portion has no physical thickness nor properties preventing the liquid material from spreading, mixing of liquid materials in neighboring opening portions can be easily shaded by the shade portion. In this case, it is preferable that the opening portions be rectangular, and that the width of the shade portion be large at a position corresponding to an approximately central portion of the long side of each of the opening portions and be small at the two ends thereof. In addition, when hitting the approximately central positions of the opening portions, the droplets may also hit another position additionally in each of the opening portions.

In addition, as in the case described above, when the width of the shade portion is large at a position corresponding to an approximately central portion of one side of the square opening portion and is small at positions corresponding to the two ends of said one side thereof, if the shade portion has a physical thickness or properties preventing the liquid material from spreading, even in the static state after the liquid material is supplied in the opening portions, mixing (such as color mixture) of the liquid materials in neighboring opening portions can be suppressed. In addition, even when the shade portion has no physical thickness nor properties preventing the liquid material from spreading, mixing of liquid materials which occurs in the vicinity of the central portions of neighboring opening portions can be easily shaded with the shade portion. Different from those described above, this advantage can be obtained regardless of the hitting positions of the droplets. In other words, this advantage can be obtained even when the droplets do not hit the central positions of the opening portions.

In the present invention, the shade portion is preferably formed of a partition provided on the substrate.

According to the present invention, since the shade portion is formed of the partition, the partition has the enclosing function of enclosing the liquid material and the shading function. Hence, the manufacturing process can be simplified, the production cost can be reduced, and in addition, the structure can be simplified, thereby easily increasing arrangement density of the opening portions.

In the present invention, the display elements may be filter elements used as constituent elements of a color filter in some cases. Related to this, as the filter elements, for example, a plurality of color elements in various colors is arranged in a predetermined pattern, such as a stripe pattern, delta pattern, or mosaic pattern. Accordingly, while preventing color mixture between neighboring regions or opening portions and formation of non-colored portions in regions or opening portions, the margin for the droplet amount can be secured, and the width of the shade portion can be decreased.

In the present invention, the display elements may be EL parts forming display dots in some cases. As the EL parts, parts emitting various colors are preferably arranged in a predetermined pattern, such as a stripe pattern, delta pattern, or mosaic pattern. In the case described above, while preventing color mixture between neighboring regions or opening portions and formation of non-colored portions in regions or opening portions, the margin for the droplet amount can be secured, and the width of the shade portion can be decreased.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

Next, referring to accompanying drawings, a method for disposing a material by droplet ejection, a display device, a method for manufacturing the display device, and an embodiment of an electronic apparatus will be described in detail. Before the characteristic structure and method of the present invention are described, the structure of a color filter substrate and a manufacturing method therefor, and the structure of an EL panel and a manufacturing method therefor will first be described.

Figure 5:
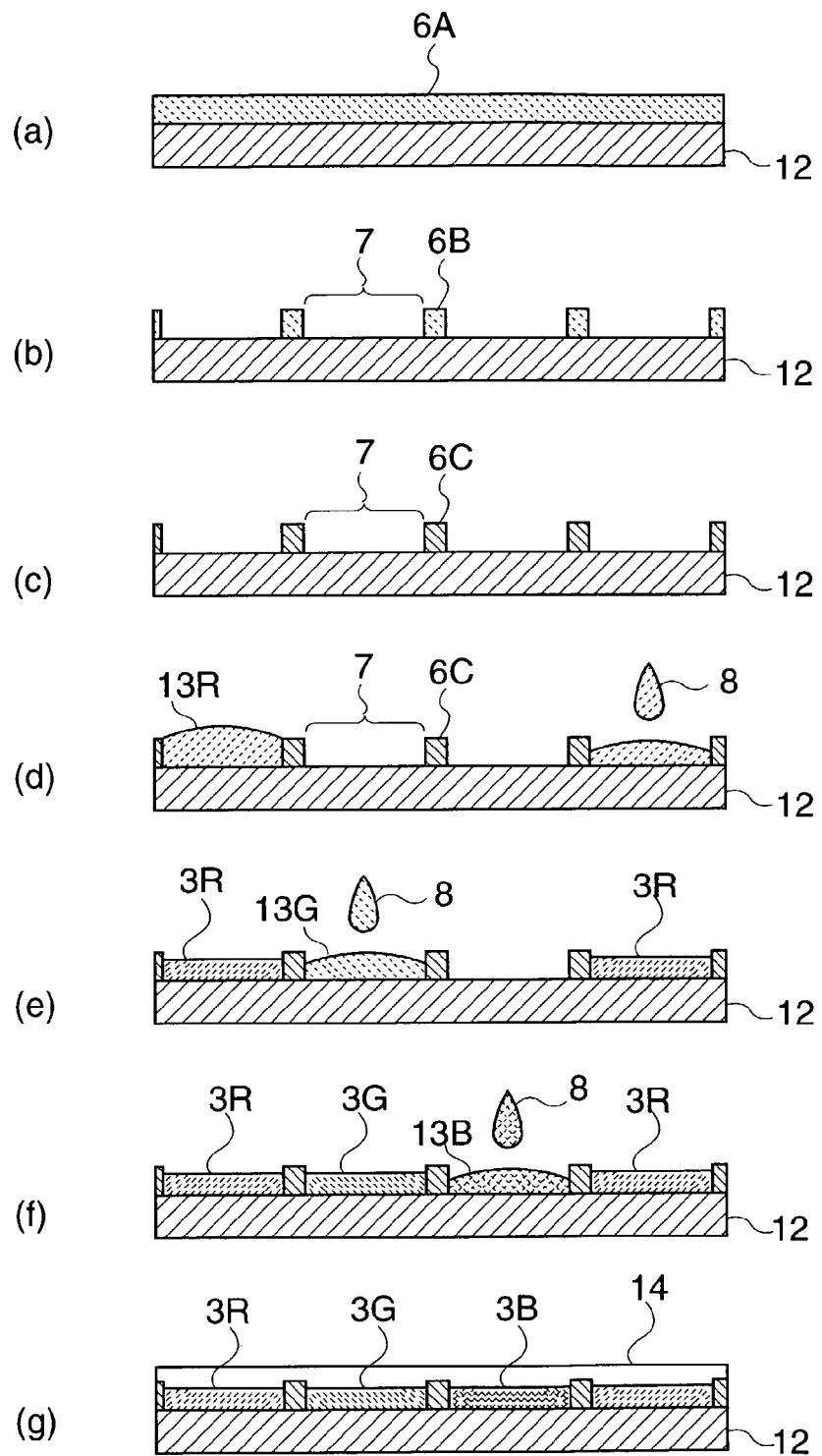
FIG. 5 includes schematic cross-sectional views showing steps (a) to (g) of a process for manufacturing a color filter substrate as an embodiment of a manufacturing method for a display device according to the present invention.
Figure 6:
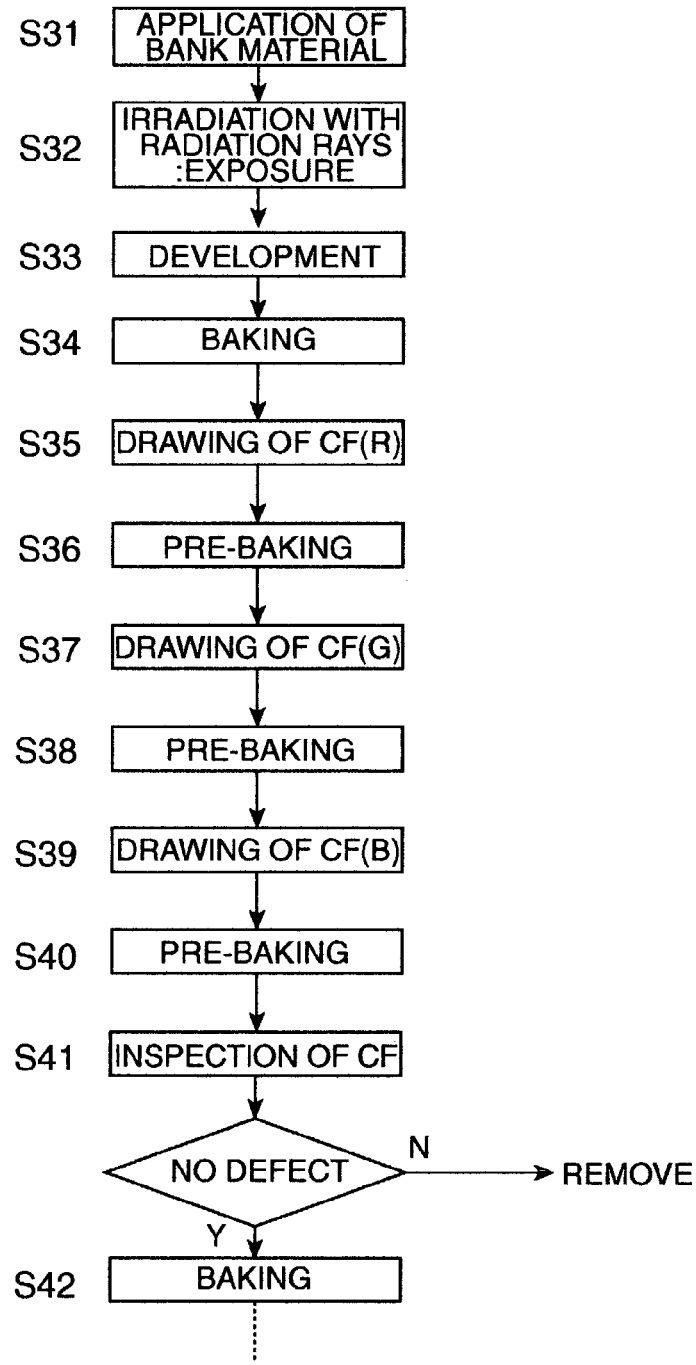
FIG. 6 is a brief flow chart showing steps of the process for manufacturing the color filter substrate of the above embodiment.

FIG. 5 shows cross-sectional views for illustrating steps (a) to (g) of a process for manufacturing a color filter substrate, and FIG. 6 is a brief flow chart showing a procedure of the process for manufacturing the color filter substrate.

First, as shown in FIG. 5(a), to a surface of a substrate 12 having light transparency formed of glass, plastic, or the like, a radiation-sensitive material 6A is applied by one of various methods, such as spin coating (rotation coating), flow coating, or roll coating (Step S31 in FIG. 6). As the radiation-sensitive material 6A, a resin composition is preferably used. The thickness of the material 6A after coating is generally 0.1 to 10 μm, and more preferably, 0.5 to 3.0 μm.

As the above resin composition, for example, there may be mentioned (i) a radiation-sensitive resin composition, cured by irradiation with radiation rays, containing a binder resin, a polyfunctional monomer, a photopolymerization-initiator, and so on, or (ii) a radiation-sensitive resin composition curable by irradiation with radiation rays, including a binder resin, a compound generating an acid when being irradiated with radiation rays, a cross-linkable compound capable of being cross-linked by operation of the acid generated upon irradiation with radiation rays, and so on. In general, these resin compositions are each a liquid composition prepared by mixing with a solvent when it is used, and as the solvent, both high boiling point and low boiling point solvents may be used. As the material 6A of the present invention, as disclosed in Japanese Unexamined Patent Application Publication No. 10-86456, a preferable composition contains (a) a copolymer of hexafluoropropylene, unsaturated carboxylic acid (anhydride), and another copolymerable ethylenic unsaturated monomer, (b) a compound generating an acid when irradiated with radiation rays, (c) a cross-linkable compound capable of being cross-linked by operation of the acid generated when irradiated with radiation rays, (d) a fluorine-containing organic compound other than the above compound (a), and (e) a solvent dissolving the compounds (a) to (d) described above.

Next, the material 6A is irradiated (exposure) with radiation rays using a pattern mask having a predetermined pattern (Step S32 in FIG. 6) provided thereon. The radiation rays in the present invention includes visible light, UV light, x-rays, electron rays, and the like. However, radiation rays (light) having a wavelength in the range of from 190 to 450 nm is preferable.

Subsequently, by developing the material 6A (Step S33 in FIG. 6), a partition (bank) 6B shown in FIG. 5(b) is formed. This partition 6B is formed having a shape (negative pattern or positive pattern) corresponding to the pattern mask described above. As the shape of the partition 6B, for example, preferably used is a lattice shape which can define square filter element-forming regions 7 in a longitudinal and a lateral direction in plan view. As the developing solution for developing the material 6A, an alkaline solution is used. As this alkaline solution, for example, there may be mentioned an aqueous solution containing sodium carbonate, sodium hydroxide, potassium hydroxide, sodium silicate, sodium metasilicate, ammonia water, ethylamine, n-propylamine, diethylamine, di-n-propylamine, triethylamine, methyldiethylamine, dimethylethanolamine, triethanolamine, tetramethylammonium hydroxide, choline, pyrrole, piperidine, 1,8-diazobicyclo[5,4,0]-7-undecene, or 1,5-diazobicyclo[4,3,0]-5-nonene. To these alkaline developing solution mentioned above, an appropriate amount of water soluble organic solvent such as methanol or ethanol, surfactant, and the like may be added. In addition, after development using an alkaline developing solution, washing with water is generally performed.

Next, as shown in FIG. 5(c), the partition 6B is baked (fired), for example, at approximately 200° C., thereby forming a partition 6C (Step S34 in FIG. 6). The firing temperature is appropriately adjusted in accordance with the material 6A described above. In addition, depending on the material 6A, baking treatment may not be performed in some cases. In this embodiment, since being formed of a material having shading properties, in addition to the literally parting function for forming (defining) the regions 7, the partition 6C also functions as a shading layer for shading every region other than the regions 7. However, the partition 6C may be formed to function only as the partition. In this case, in addition to the partition, a shading layer composed of a metal or the like may be formed.

Next, filter element materials 13 (13R (red coloring material, 13G (green coloring material), and 13B (blue coloring material) are shown in the figure by way of example) each composed of a base material such as an acrylic resin mixed with a coloring agent (pigment, dye, or the like) are supplied in the regions 7 defined by the partition 6C formed as described above. As a method for supplying the filter element materials 13 in the regions 7, each filter element material 13 is mixed with a solvent to form a liquid material and is then supplied to the respective regions 7. In more particular, in this embodiment, droplet ejection using a droplet ejecting head described later enables a liquid material in a droplet 8 form to hit the regions 7, thereby supplying the material therein.

The filter element material 13 described above is supplied in a liquid form, and by subsequently performing drying or pre-baking (pre-firing) at a low temperature (for example, 60° C.), the filter element material is presolidified or precured. For example, the filter element material 13R is first supplied (FIG. 5(d) and Step S35 in FIG. 6) and is prebaked to form a filter element 3R (Step S36 in FIG. 6), the filter element material 13G is then supplied (FIG. 5(e) and Step S37 in FIG. 6) and is prebaked to form a filter element 3G (Step S38 in FIG. 6), and the filter element material 13B is finally supplied (FIG. 5(f) and Step S39 in FIG. 6) and is prebaked to form a filter element 3B (Step S40 in FIG. 6). As described above, these color filter element materials are supplied in the respective regions 7 and are presolidified or precured to form the filter elements 3 (3R, 3G, and 3B), thereby forming a display substrate (color filter substrate).

Next, inspection is performed for the color filter substrate thus formed as the display substrate (Step S41 in FIG. 6). This inspection is performed, for example, by observing the partition 6C and the filter elements 3 functioning as display elements with the naked eye, microscope, or the like. In this case, by taking a picture of a color filter substrate, inspection may be automatically performed using this picture mentioned above. By this inspection, when a defect of the filter element 3 functioning as a display element is detected, this color filter substrate is transferred to a substrate recycling step described below.

Related to this, as the defect of the filer element 3, for example, there may be mentioned absence of the filter element 3 (a so-called missing dot), an inadequate amount, that is, too large or too small amount of the material provided in the region 7 although the filter element 3 is formed, or foreign materials such as dust mixed with or adhered to the formed filter element 3.

When no defects are detected in the inspection described above, baking (firing) treatment is performed, for example, at approximately 200° C., so that the filter elements 3 as a display element (3R, 3G, and 3B) are fully solidified or cured (Step S42 in FIG. 6). The temperature in this baking treatment is optionally determined in accordance with the composition of the filter element material 13 or the like. In addition, without heating to a high temperature, drying or aging may be simply performed in an atmosphere different from general conditions (for example, in a nitrogen gas or dry air atmosphere).

Figure 7:
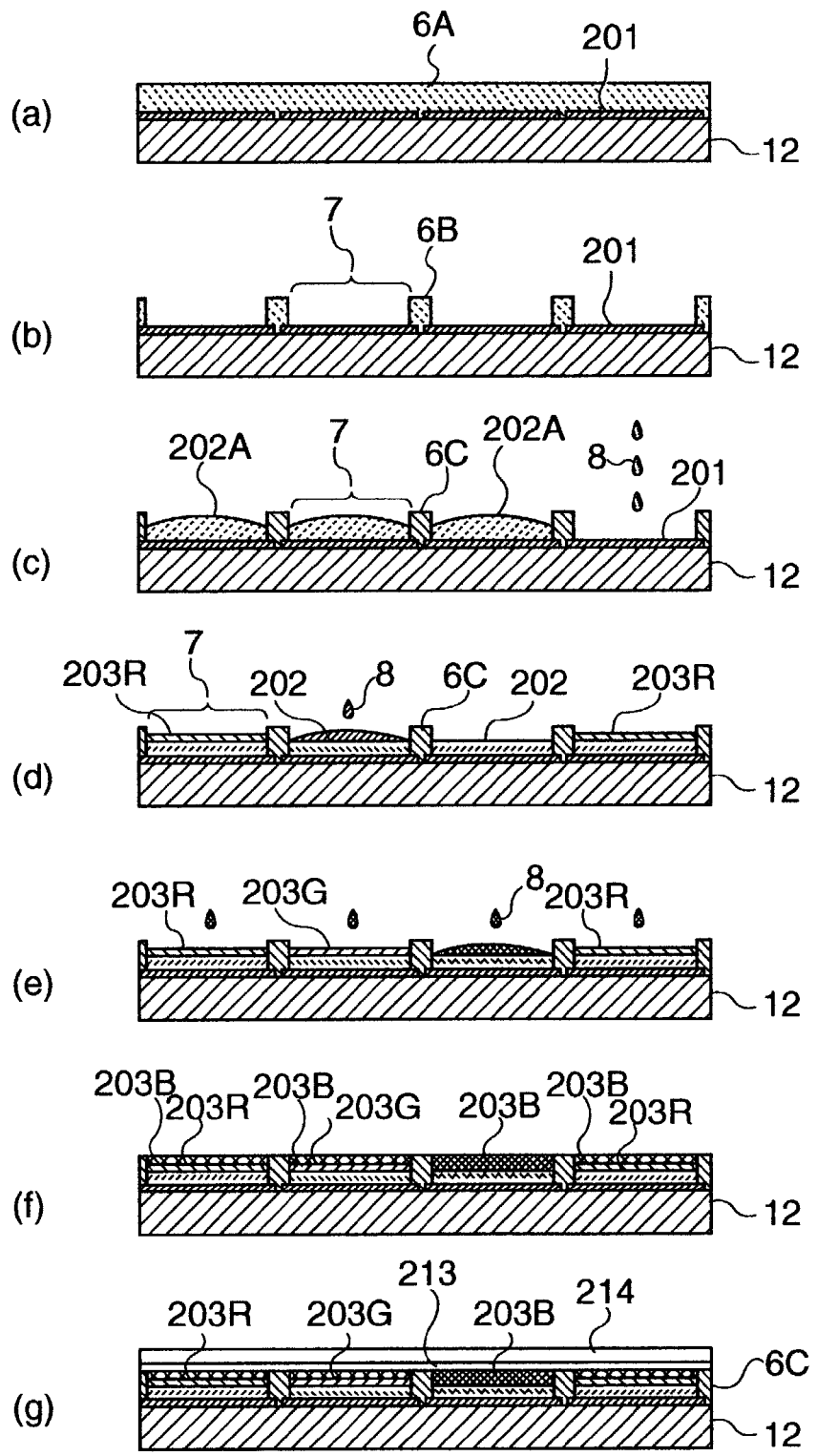
FIG. 7 includes schematic cross-sectional views showing steps (a) to (g) of a process for manufacturing an EL panel as an embodiment of a manufacturing method for a display device according to the present invention.

Next, referring to FIGS. 7 and 8, an EL panel and a manufacturing method therefor will be described. FIG. 7 includes cross-sectional views for illustrating steps (a) to (g) of a process for manufacturing the EL panel, and FIG. 8 is a brief flow chart showing a procedure of the process for manufacturing the EL panel.

When this EL panel is manufactured, on the substrate 12 composed of light transparent glass, plastic, or the like, first electrodes 201 shown in FIG. 7(a) by way of example are formed. When the EL panel is a passive matrix type, the first electrodes 201 have a stripe pattern, and when the EL panel is an active matrix type in which active elements such as TFDs or TFTs are mounted (not shown in the figure) on the substrate 12, the first electrodes 201 are formed independently at display dots. As methods for manufacturing these structures described above, for example, suitably used are a photolithographic method, vacuum deposition method, sputtering method, and Pyrosol method. As a material for the first electrode 201, for example, preferably used are ITO (Indium Tin Oxide), tin oxide, and a composite oxide of indium oxide and zinc oxide.

Figure 8:
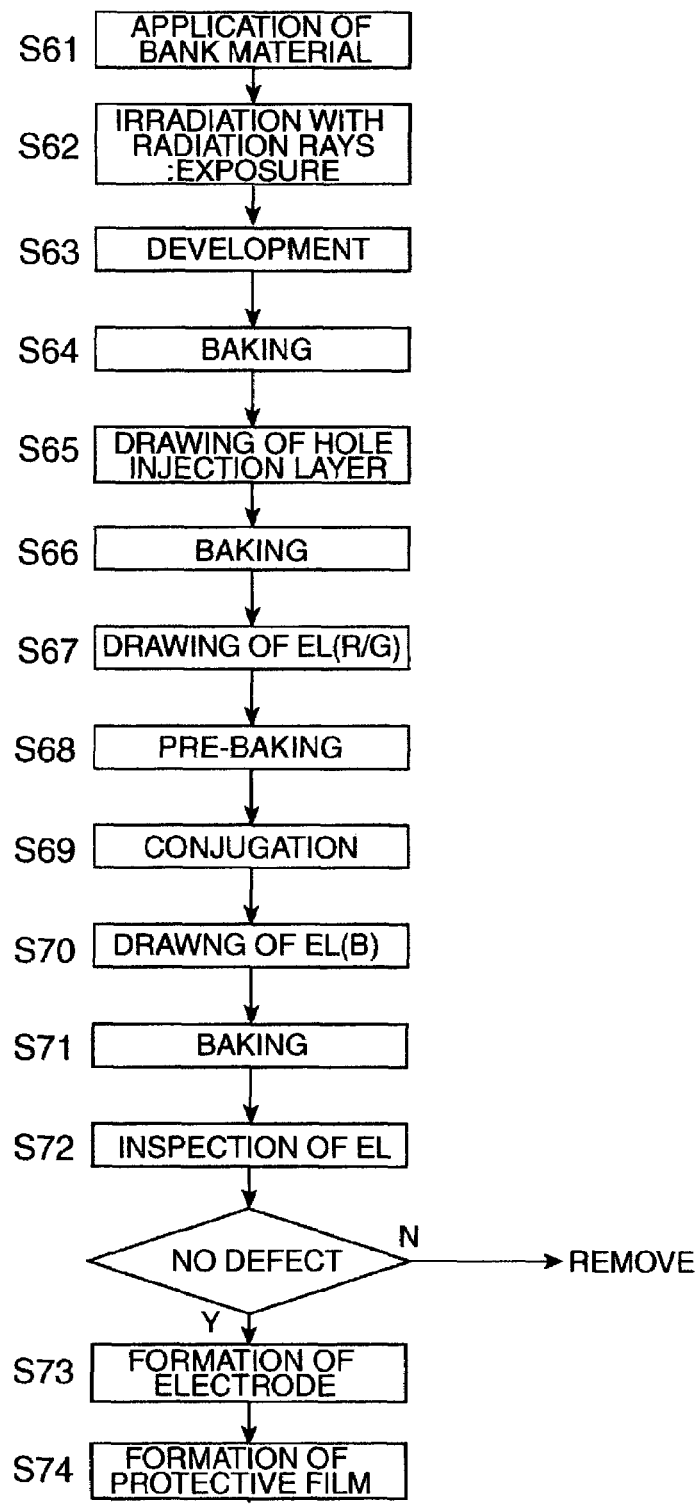
FIG. 8 is a brief flow chart showing steps of the process for manufacturing the EL panel of the above embodiment.

Next, as in the case of the color filter substrate described above, the radiation-sensitive material 6A is applied to the first electrodes 201 (Step S61 in FIG. 8). In addition, in a manner similar to that described above, irradiation with radiation rays (exposure) (Step S62 in FIG. 8) and development (Step S63 in FIG. 8) are performed, thereby forming the partition (bank) 6B as shown in FIG. 7(b).

This bank 6B is formed into a lattice shape, so that the first electrodes 201 formed at the display dots are isolated thereby, in other words, EL part-forming regions 7 corresponding to the respective display dots are formed. In addition, as in the case of the color filter substrate described above, the partition preferably has a shading function. In this case, improvement in contrast, prevention of color mixture of light-emitting materials, prevention of light leakage between pixels, and so on can be performed. As a material for the partition 6B, various materials used for forming the partition of the color filter substrate may be essentially used. However, in particular in this case, preferably used are materials having good durability against a solvent for EL materials described later, and in addition, an organic material, which is able to have tetrafluoroethylene segments therein by plasma treatment using a fluorocarbon gas, such as an acrylic, epoxy, or photosensitive polyimide resin, may be preferably used.

Next, right before a functional liquid material for forming a hole injection layer is applied, sequential plasma treatment using an oxygen gas and a fluorocarbon gas is performed for the substrate 12. Accordingly, the surface of a polyimide film becomes hydrophobic, the surface of an ITO becomes hydrophilic, and hence wettability of the substrate for arranging droplets in a fine pattern can be controlled. As an apparatus generating plasma, both apparatuses generating plasma in vacuum and in the air may be satisfactory used. In addition, besides this step or instead thereof, baking (firing) at approximately 200° C. is performed for the partition 6B (Step S64 in FIG. 8). By this step, the partition 6C is formed.

Next, as shown in FIG. 7(c), a material 202A for hole injection layer in a droplet 8 form is ejected to hit the regions 7 (Step S65 in FIG. 8). This material 202A for hole injection layer is a liquid composed of a material for hole injection layer and a solvent therefor.

Subsequently, after the solvent is removed by pre-baking performed at room temperature for 20 minutes in an evacuated state (one Torr), by heat treatment at 20° C. (on a hot plate) for 10 minutes in the air, hole injection layers 202, which is not compatible with a material for light-emitting layer, are formed (Step S66 in FIG. 8). By the conditions described above, the thickness of the hole injection layer 202 is 40 nm.

Next, as shown in FIG. 7(d), on the hole injection layers 202 in the regions 7, a material for R light-emitting layer and a material for G light-emitting layer, which are functional liquid EL materials, are supplied in a droplet form as described above (Step S68 in FIG. 8). Next, after these materials for light-emitting layers are applied, the solvent is removed by pre-baking performed, for example, at room temperature for 20 minutes in an evacuated state (one Torr) (Step S67 in FIG. 8). Subsequently, conjugation is performed by heat treatment at 150° C. for 4 hours in a nitrogen atmosphere, thereby forming R light-emitting layers 203R and G light-emitting layers 203G (Step S69 in FIG. 8). The light-emitting layers thus conjugated by heat treatment are insoluble in a solvent. By the conditions described above, the thicknesses of the R light-emitting layer 203R and the G light-emitting layer 203G are each 50 nm.

In addition, sequential plasma treatment using an oxygen gas and a fluorocarbon gas may be performed for the hole injection layers 202 before the light-emitting layers are formed. By this step, since fluorinated compound layers are formed on the hole injection layers 202, hole injection efficiency is increased by an ionization potential increased thereby, and hence an organic EL apparatus having high light-emitting efficiency can be provided.

Next, as shown in FIG. 7(e), in a manner as described above, a material for B light-emitting layer 203B, which is a functional liquid for EL light-emitting layer, is supplied in the regions 7 at which the R light-emitting layers 203R and the G light-emitting layers 203G are not formed and is also supplied over the R light-emitting layers 203R and the G light-emitting layers 203G (Step S70 in FIG. 8). Subsequently, the solvent is removed by pre-baking performed at room temperature for 20 minutes in an evacuated state (one Torr) (Step S71 in FIG. 8), thereby forming the B light-emitting layers 203B as shown in FIG. 7(f). Since the B light-emitting layers 203B are formed over the preciously formed layers, three primary colors R, G, and B are formed, and in addition to that, steps formed between the bank and the R light-emitting layers 203 R and the G light-emitting layers 203G are filled with the light-emitting layers 203B, thereby performing planarization. Accordingly, short circuiting which may occur between upper and lower electrodes can be reliably prevented. In addition, by adjusting the thickness of the B light-emitting layer 203B, the B light-emitting layer 203B in the laminate structure formed together with the R light-emitting layer 203R and the G light-emitting layer 203G serves as an electron injection transfer layer and do not emit blue color light. As a method for forming the B light-emitting layer 203B, for example, a general spin coating method may be used as a wet method, or a method equivalent to that for the R light-emitting layer 203R and the G light-emitting layer 203G may also be used.

As an arrangement of the R light-emitting layers 203R, the G light-emitting layers 203G, and the B light-emitting layers 203B, in accordance with required display performance, a known pattern such as a stripe pattern, a delta pattern, or a mosaic pattern may be optionally used.

Next, inspection is performed for the EL panel including the hole injection layer 202, the R light-emitting layer 203R, the G light-emitting layer 203G, and the B light-emitting layer 203B in each dot by observation with the naked eye or a microscope, or by image processing (Step S72 in FIG. 8). By this inspection, when a defect (missing dot, defect of laminate structure, inappropriate amount of material for light-emitting portion, presence of foreign materials such as dust, or the like) of the EL part (laminate formed of the combination of the hole injection layer 202 and at least one of the R light-emitting layer 203R, the G light-emitting layer 203G, or the B light-emitting layer 203B) in each dot region is detected, the product is removed from the manufacturing process. In the case in which no defects are detected, as shown in FIG. 7(g), a counter electrode 213 is formed (Step S73 in FIG. 8). When being a surface electrode, the counter electrode 213 may be formed by a film-forming method such as deposition or sputtering using Mg, Ag, Al, Li, or the like. When being electrodes in a stripe pattern, the counter electrodes 213 may be formed by patterning an electrode layer formed beforehand by a photolithographic method or the like. Finally, as shown in FIG. 7(g), a protective film 214 composed of an optional material (molded resin material, inorganic insulating film, or the like) is formed on the counter electrodes 213 (Step S74 in FIG. 8), thereby forming a targeted EL panel.

Figure 1:
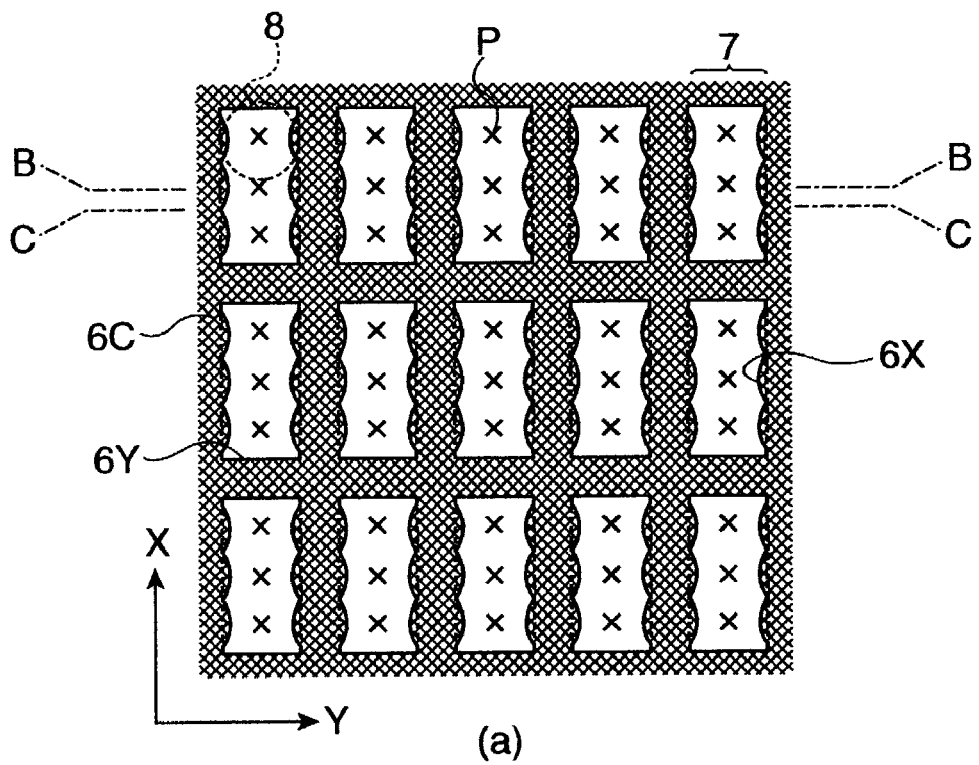
FIG. 1 includes a partial plan view (a) showing the structure of a first embodiment of the present invention, a cross-sectional view (b) showing the structure taken along the line B-B, and a cross-sectional view (c) showing the structure taken along the line C-C.
Figure 1:
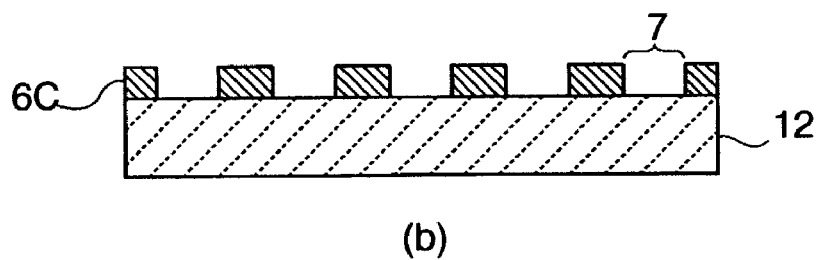
Figure 1:
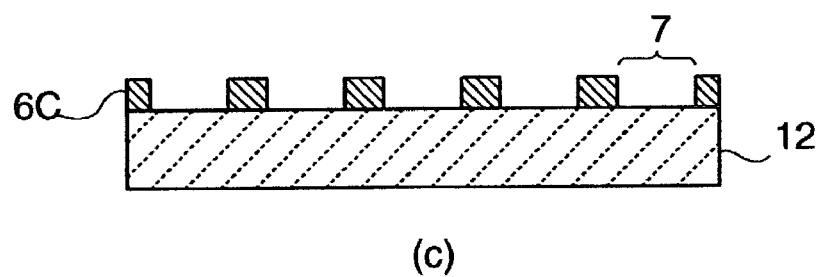

Next, important portions of a first embodiment of the present invention, which are applicable to the methods described above for manufacturing the color filter substrate and the El panel, will be described in detail. FIG. 1 includes a plan view (a) showing the structure on the substrate 12 according to the first embodiment, a schematic cross-sectional view (b) of the structure taken along the line B-B in (a), and a schematic cross-sectional view (c) of the structure taken along the line C-C.

In this embodiment, substantially square (rectangular shape is shown in the figure by way of example) regions 7 are formed by the partition 6C provided on the substrate 12. As shown in the figure by way of example, these regions 7 are arranged in a matrix in the longitudinal and the lateral directions. In FIG. 1, the state is shown before the materials for forming the display elements, such as the filter elements 3, the hole injection layers 202, the EL layers 203, and the like are supplied for the formation of the color filter substrate or EL panel described above.

In each region 7, of internal surfaces 6X and 6Y of the partition 6C surrounding the region 7, the internal surfaces 6X forming the long sides of the region 7 are formed to have irregularities. In addition, the distance between parts of the partition 6c which oppose each other with the region 7 provided therebetween is increased and decreased along the long side of the region 7 (the X direction in the figure). In addition, along the long side of the region 7 (the X direction in the figure), the width of the partition 6C is also increased and decreased.

In the regions 7 described above, the display elements, that is, the filter elements 3 of the color filter substrate, or the hole injection layers 202 and the EL layers 203 of the EL panel are formed. Accordingly, the various materials in a droplet 8 form are supplied in the regions 7. In the region 7 of this embodiment, the structure is formed so that the droplets hit hitting positions P shown in FIG. 1(*a*). As shown in the figure, the hitting positions P are set at positions each corresponding to that at which the width of the partition 6C, which is increased and decreased along the X direction, is maximum (cross-sectional portion taken along the line B-B in the figure). As shown in the figure by way of example, the three hitting positions P are provided in each region 7, and one display element is formed of three droplets.

Figure 13:
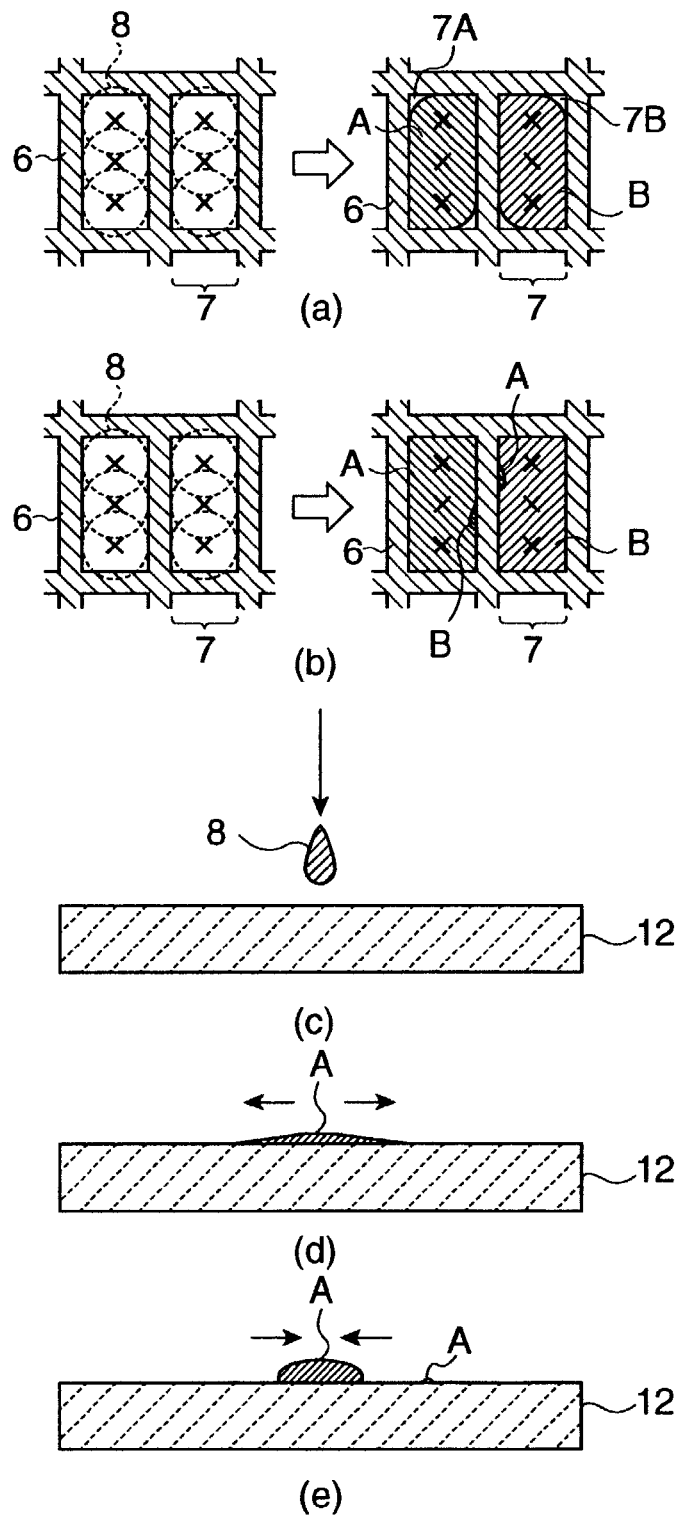
FIG. 13 includes partial, enlarged, plan views (a) and (b) showing details of a conventional structure in the state before and after a droplet is supplied, and views (c) to (e) showing the state of a droplet with time after its hitting.

According to this embodiment, when hitting the hitting position P, as shown in FIG. 13(*d*), the droplet 8 is temporarily spread widely. However, since the partition 6C located at both sides (right side and left side shown in the figure) of this hitting position P has a larger width, the probability in which the liquid material overflows the partition 6C and then enters both neighboring regions 7 can be reduced. Accordingly, since the margin for the droplet amount can be significantly increased, control of the droplet amount becomes easier, and hence insufficient spread (formation of non-colored portions or the like) of the display element can be prevented by increasing the droplet amount thereof. In addition, as a result, improvement in production efficiency and production yield can be achieved.

Figure 2:
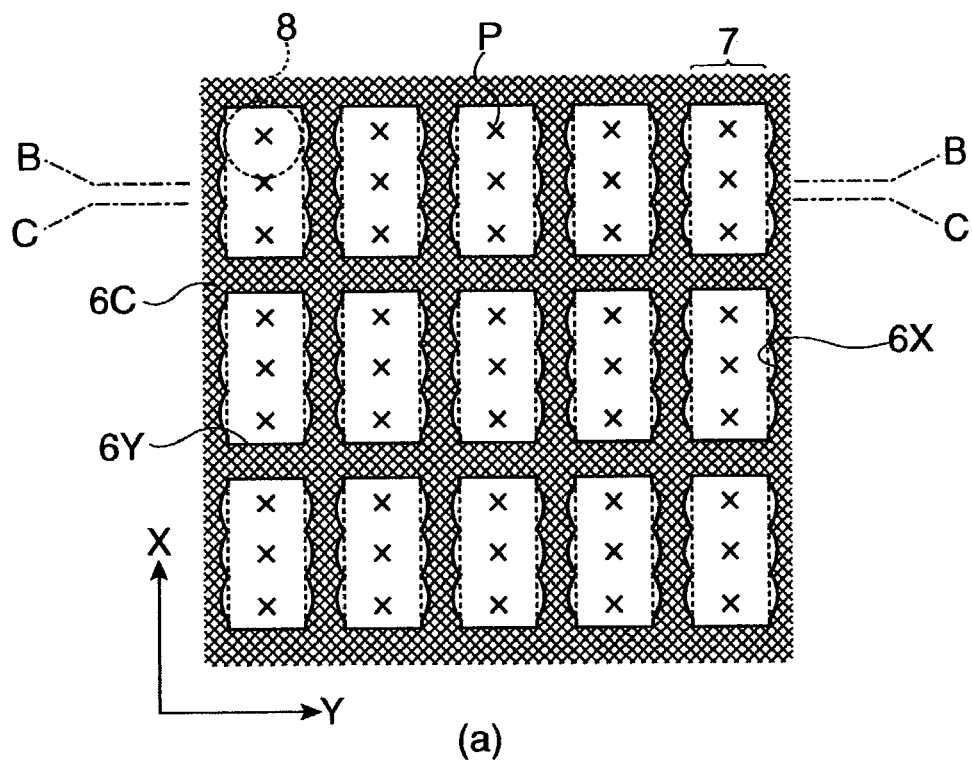
FIG. 2 includes a partial plan view (a) showing the structure of a second embodiment of the present invention, a cross-sectional view (b) showing the structure taken along the line B-B, and a cross-sectional view (c) showing the structure taken along the line C-C.
Figure 2:
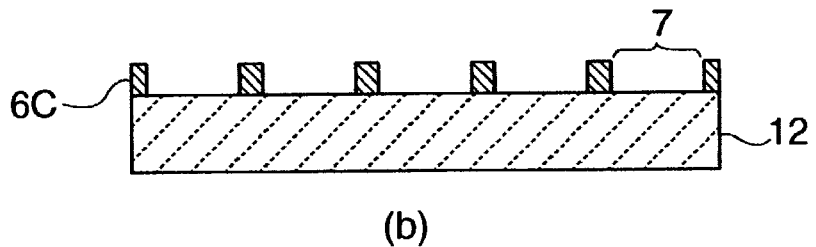
Figure 2:
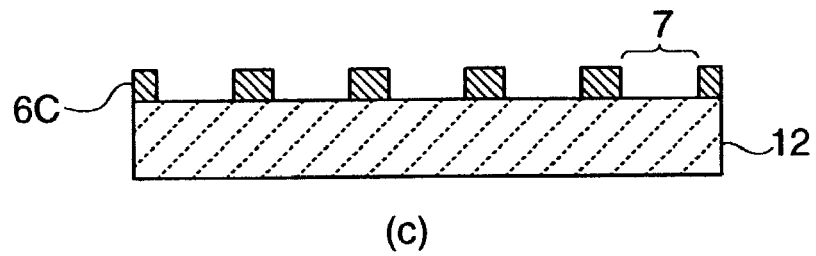

Next, important portions of a second embodiment of the present invention, which are applicable to the methods described above for manufacturing the color filter substrate and the El panel, will be described in detail. FIG. 2 includes a plan view (a) showing the structure on the substrate 12 according to the second embodiment, a schematic cross-sectional view (b) of the structure taken along the line B-B in (a), and a schematic cross-sectional view (c) of the structure taken along the line C-C.

In this embodiment, substantially square (rectangular shape is shown in the figure by way of example) regions 7 are formed by the partition 6C provided on the substrate 12. As shown in the figure by way of example, these regions 7 are arranged in a matrix in the longitudinal and the lateral directions. In FIG. 2, the state is shown before the materials for forming the display elements, such as the filter elements 3, the hole injection layers 202, the EL layers 203, and the like are supplied for the formation of the color filter substrate or EL panel described above.

In each region 7, of internal surfaces 6X and 6Y of the partition 6C surrounding this region 7, the internal surfaces 6X forming the long sides of the region 7 are formed to have irregularities. In addition, the distance between parts of the partition 6c which oppose each other with the region 7 provided therebetween is increased and decreased along the long side of the region 7 (the X direction in the figure). In addition, along the long side of the region 7 (the X direction in the figure), the width of the partition 6C is increased and decreased.

In the regions 7 described above, the display elements, that is, the filter elements 3 of the color filter substrate, or the hole injection layers 202 and the EL layers 203 of the EL panel are formed. Accordingly, the various materials in a droplet 8 form are supplied in the regions 7. In the region 7 of this embodiment, the structure is formed so that the droplets hit hitting positions P shown in FIG. 2(*a*). As shown in the figure, the hitting positions P are set at positions each corresponding to that at which the distance between parts of the partition 6C, which is increased and decreased along the X direction, is maximum, that is, at which the width of the region 7 is maximum (cross-sectional portion along the line B-B in the figure). In the example shown in the figure, the three hitting positions P are provided in each region 7, and one display element is formed of three droplets.

According to this embodiment, when hitting the hitting position P, as shown in FIG. 13(*d*), the droplet 8 is temporarily spread widely; however, since the distance between parts of the partition 6C opposing each other with this hitting position P therebetween is large, the temporary spread of the droplet 8 can be received in the region 7 having a large width, and hence the probability in which the liquid material overflows the partition 6C and enters both neighboring regions 7 can be reduced. Accordingly, since the margin for the droplet amount can be significantly increased, control of the droplet amount becomes easier, and insufficient spread (formation of non-colored portions or the like) of the display element can be prevented by increasing the droplet amount. In addition, as a result, improvement in production efficiency and production yield can be achieved.

Figure 3:
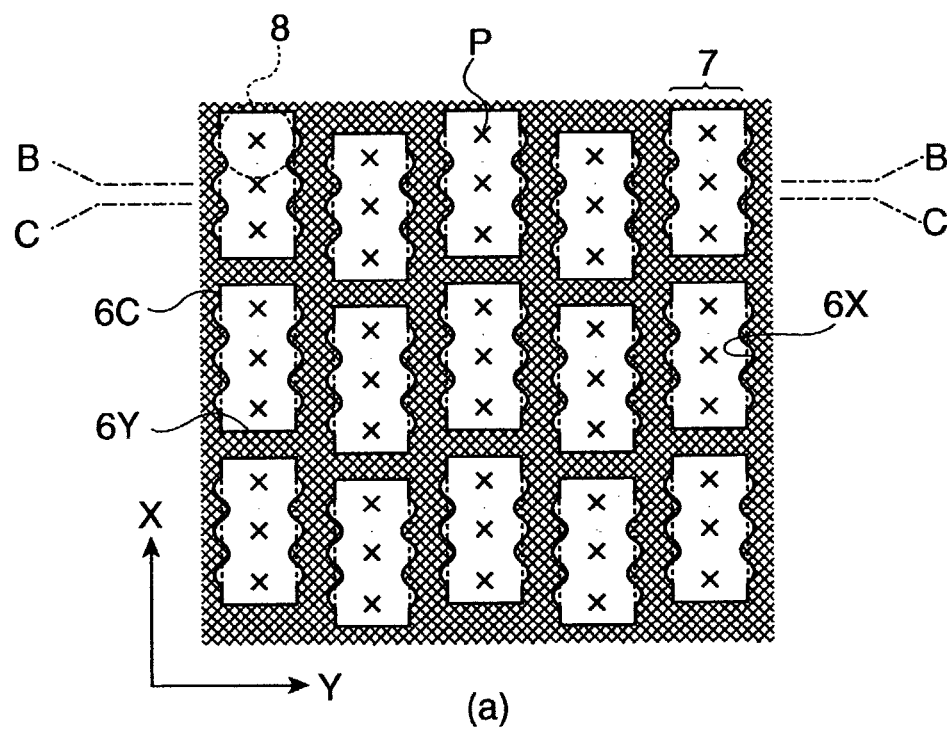
FIG. 3 includes a partial plan view (a) showing the structure of a third embodiment of the present invention, a cross-sectional view (b) showing the structure taken along the line B-B, and a cross-sectional view (c) showing the structure taken along the line C-C.
Figure 3:
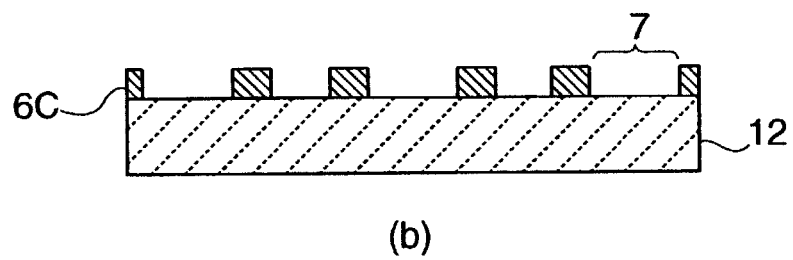
Figure 3:
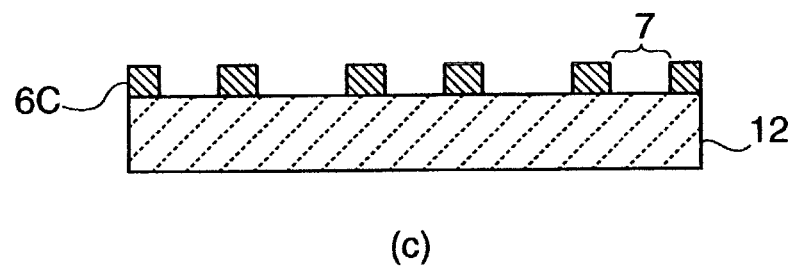

Next, important portions of a third embodiment of the present invention, which are applicable to the methods described above for manufacturing the color filter substrate and the El panel, will be described in detail. FIG. 3 includes a plan view (a) showing the structure on the substrate 12 according to the third embodiment, a schematic cross-sectional view (b) of the structure taken along the line B-B in (a), and a schematic cross-sectional view (c) of the structure taken along the line C-C.

In this embodiment, substantially square (rectangular shape is shown in the figure by way of example) regions 7 are formed by the partition 6C formed on the substrate 12. As shown in the figure by way of example, the regions 7 disposed on the same straight line are arranged in the same manner as those on the every other line, or the regions 7 are arranged in a staggered manner. In FIG. 3, the state is shown before the materials for forming the display elements, such as the filter elements 3, the hole injection layers 202, the EL layers 203, and the like are supplied for the formation of the color filter substrate or EL panel described above.

In each region 7, of internal surfaces 6X and 6Y of the partition 6C surrounding this region 7, the internal surfaces 6X forming the long sides of the region 7 are formed to have irregularities. In addition, the distance between parts of the partition 6c which oppose each other with the region 7 provided therebetween is increased and decreased along the long side of the region 7 (the X direction in the figure). In addition, along the long side of the region 7 (the X direction in the figure), the width of the partition 6C is formed to be substantially constant. In other words, in this embodiment, the partition 6C (portion extending in the X direction in the figure) separating the regions 7 adjacent to each other is formed to extend in the X direction on the whole while the width thereof is repeatedly increased and decreased in the Y direction.

In the regions 7 described above, the display elements, that is, the filter elements 3 of the color filter substrate, or the hole injection layers 202 and the EL layers 203 of the EL panel are formed. Accordingly, the various materials in a droplet 8 form are supplied in the regions 7. In the region 7 of this embodiment, the structure is formed so that the droplets hit hitting positions P shown in FIG. 3(a). As shown in the figure, the hitting positions P are set at positions each corresponding to that at which the distance between parts of the partition 6C, which is increased and decreased along the X direction, is maximum, that is, at which the width of the region 7 is maximum. In the example shown in the figure, the three hitting positions P are provided in each region 7, and one display element is formed of three droplets.

According to this embodiment, when hitting the hitting position P, as shown in FIG. 13(d), the droplet 8 is temporarily spread widely; however, since the distance between parts of the partition 6C is large, the temporary spread of the droplet 8 can be received in the region 7 having a large width, and hence the probability in which the liquid material overflows the partition 6C and enters both neighboring regions 7 can be reduced. Accordingly, since the margin for the droplet amount can be significantly increased, control of the droplet amount becomes easier, and insufficient spread (formation of non-colored portions or the like) of a display element can be prevented by increasing the droplet amount. In addition, as a result, improvement in production efficiency and production yield can be achieved.

In addition, in this embodiment, a part of the partition 6C provided between the neighboring regions 7 is formed to have a substantially constant width along the X direction, an enclosing effect of enclosing the liquid materials with the partition 6C can be approximately constant along the X direction, and as a result, mixing of materials in the neighboring regions can be further decreased. As a result, more reliable production yield can be obtained.

Figure 4:
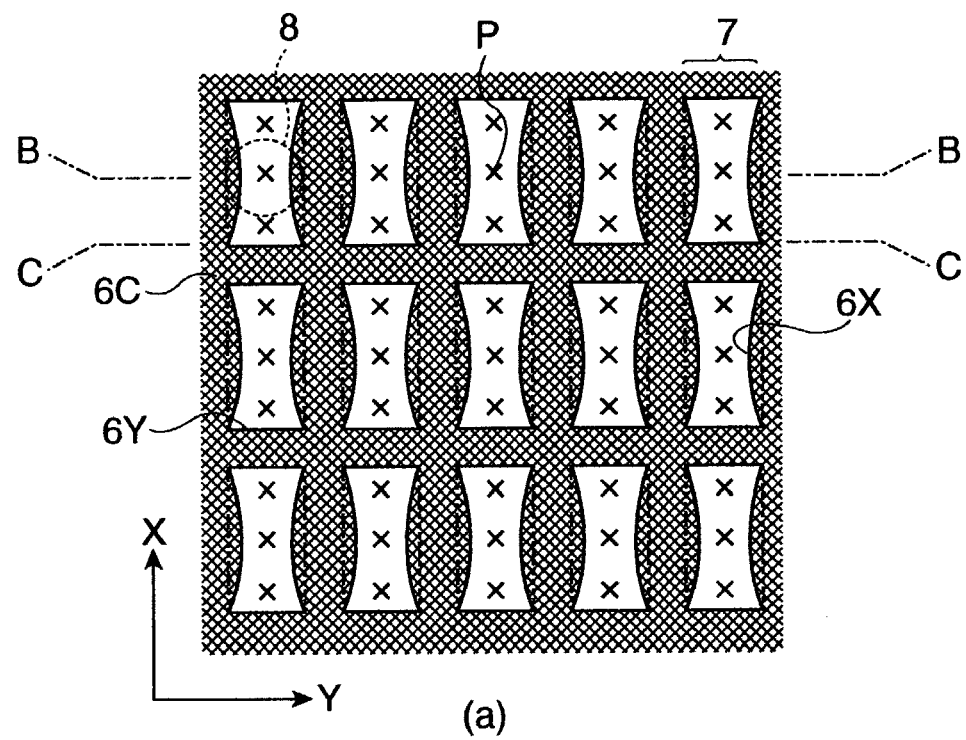
FIG. 4 includes a partial plan view (a) showing the structure of a fourth embodiment of the present invention, a cross-sectional view (b) showing the structure taken along the line B-B, and a cross-sectional view (c) showing the structure taken along the line C-C.
Figure 4:
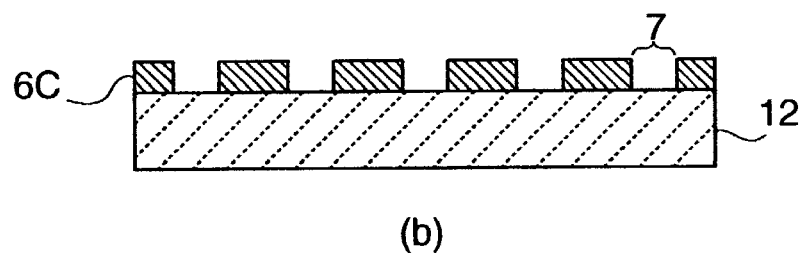
Figure 4:
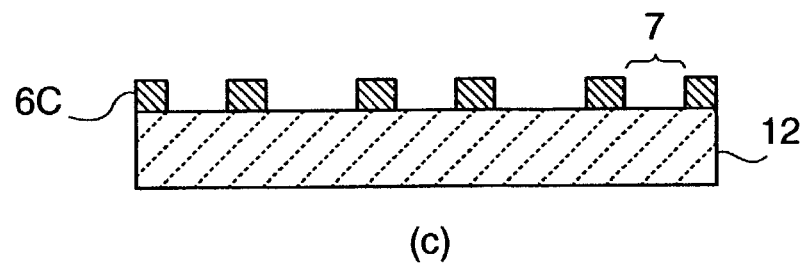

Next, important portions of a fourth embodiment of the present invention, which are applicable to the methods described above for manufacturing the color filter substrate and the El panel, will be described in detail. FIG. 4 includes a plan view (a) showing the structure on the substrate 12 according to the fourth embodiment, a schematic cross-sectional view (b) of the structure taken along the line B-B in (a), and a schematic cross-sectional view (c) of the structure taken along the line C-C.

In this embodiment, substantially square (rectangular shape is shown in the figure by way of example) regions 7 are formed by the partition 6C provided on the substrate 12. The regions 7 are arranged in a matrix in the longitudinal direction and the lateral direction. In FIG. 4, the state is shown before the materials for forming the display elements, such as the filter elements 3, the hole injection layers 202, the EL layers 203, and the like are supplied for the formation of the color filter substrate or EL panel described above.

In each region 7, of internal surfaces 6X and 6Y of the partition 6C surrounding this region 7, the internal surfaces 6X forming the long sides of the region 7 are formed to have irregularities. In addition, the distance between parts of the partition 6c which oppose each other with the region 7 provided therebetween is increased and decreased along the long side of the region 7 (the X direction in the figure). In addition, along the long side of the region 7 (the X direction in the figure), the width of the partition 6C is increased and decreased.

In particular in this embodiment, the width of the partition 6C provided between the regions 7 adjacent to each other is large at a position corresponding to an approximately central position of the region 7 in the X direction and is small at positions each corresponding to each end of the region 7 in the X direction.

In the regions 7 described above, the display elements, that is, the filter elements 3 of the color filter substrate, or the hole injection layers 202 and the EL layers 203 of the EL panel are formed. Accordingly, the various materials in a droplet 8 form are supplied in the regions 7. In the region 7 of this embodiment, the structure is formed so that the droplets hit hitting positions P shown in FIG. 4(a). As shown in the figure, the hitting positions P are each set at the approximately central position of the region 7 corresponding to that at which the width of the partition 6C, which is increased and decreased along the X direction, is maximum (cross-sectional position taken along the line B-B in the figure). In addition, at both sides (upper and lower sides in the figure) of the approximately central position, the hitting positions P are further provided respectively. In the example shown in the figure, the three hitting positions P are provided in each region 7, and one display element is formed of three droplets.

According to this embodiment, when hitting the hitting position P, as shown in FIG. 13(d), the droplet 8 is temporarily spread widely; however, since the widths of parts of the partition 6C located at both sides of this hitting position P are large, when the droplet 8 hits the approximately central position of the region 7, the probability in which the liquid material overflows the partition 6C and enters both neighboring regions 7 can be reduced. Accordingly, since the margin for the droplet amount can be significantly increased, control of the droplet amount becomes easier, and insufficient spread (formation of non-colored portions or the like) of a display element can be prevented by increasing the droplet amount. In addition, as a result, improvement in production efficiency and production yield can be achieved.

In addition, as described above, since the width of the partition is large or the distance between parts of the partition is small at a position corresponding to the central position of the region, in addition to the state in which droplet hits the substrate, even in the state in which the liquid material is statically received in the region, mixing (color mixture or the like) of liquid materials in the neighboring regions can be suppressed. Different from those described above, this effect can be obtained regardless of the hitting position of the droplet (that is, even in the case in which the droplet does not hit the central position of the region).

In addition, in the first to fourth embodiments described above, every partition 6C is preferably formed of a material having substantially no light transparency, that is, the partition 6C preferably serves as a shading layer. In this case, a region at which the partition 6C is formed becomes a shade portion.

However, in the present invention, the partition is not limited to a material having shading properties, and a material having light transparency to some extent may also be used.

Figure 9:
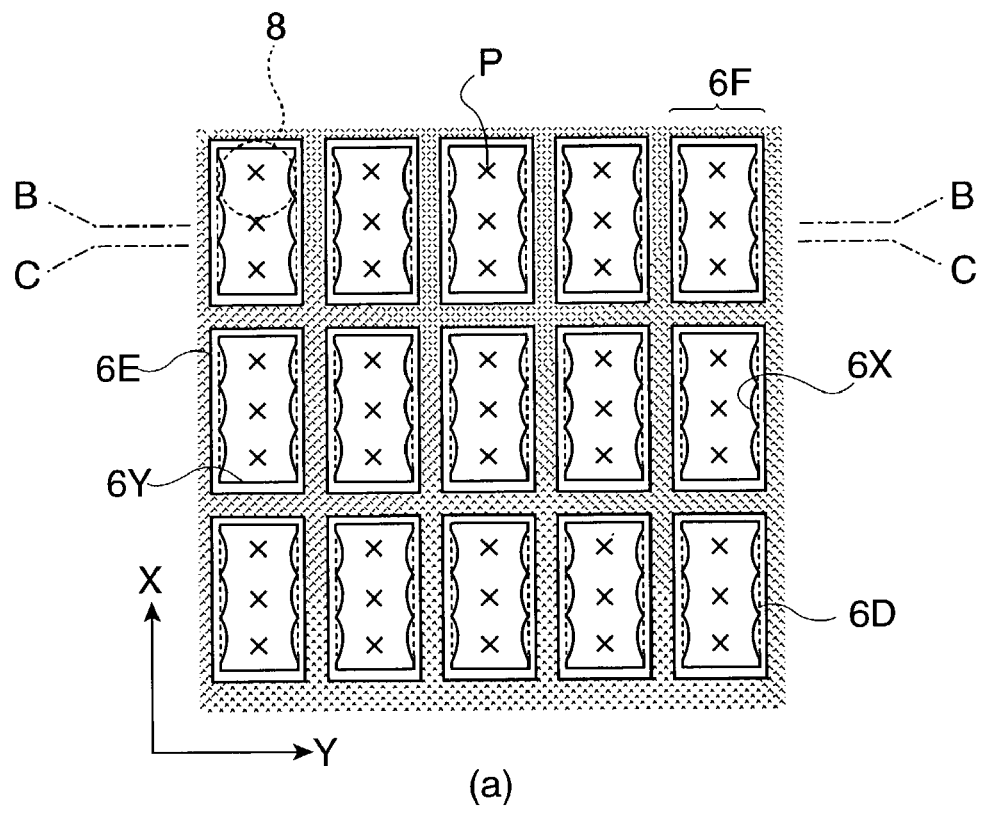
FIG. 9 includes a partial plan view (a) showing the structure of a fifth embodiment of the present invention, a cross-sectional view (b) showing the structure taken along the line B-B, and a cross-sectional view (c) showing the structure taken along the line C-C.
Figure 9:
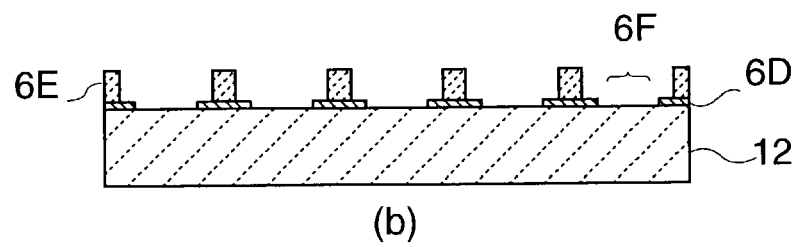
Figure 9:
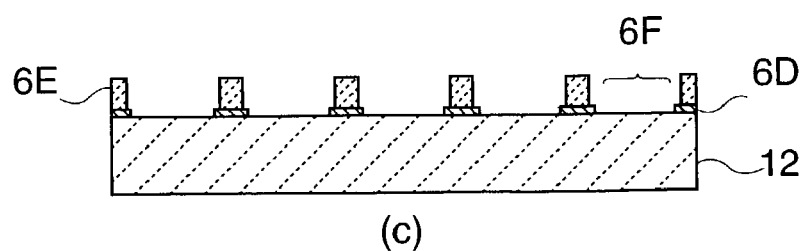

Next, important portions of a fifth embodiment of the present invention, which are applicable to the methods described above for manufacturing the color filter substrate and the El panel, will be described in detail. FIG. 9 includes a plan view (a) showing the structure on the substrate 12 according to the fifth embodiment, a schematic cross-sectional view (b) of the structure taken along the line B-B in (a), and a schematic cross-sectional view (c) of the structure taken along the line C-C.

In this embodiment, different from the first to the fourth embodiments, a shading layer 6D is formed on the substrate 12. In the present invention, a region which is optically shaded by shading means such as the above-mentioned shading layer is called a shade portion. Hereinafter, this region is referred to as "shade portion". Shading means such as a shading layer is not always necessarily provided on the substrate 12, and for example, in a display device (electrooptic device) in which two substrates are disposed to oppose each other, the shading means may be provided on a substrate different from that on which display elements are disposed. The point described above on the shading means can be equally applied to every embodiment described below. The shading layer 6D may be formed of a thin metal film of Cr, Al, Ag, an alloy thereof, or the like, or may be a black matrix formed of a black resin or the like. The shading layer 6D is formed by a known photolithographic method or a selective film-forming method. In addition, a partition 6E is formed on the shading layer 6D. This partition 6E may be formed of the same material as that used in the first to fourth embodiments described above; however, since the shading layer 6D is formed in this embodiment, a light transparent material may be used for the partition 6E.

In this embodiment, substantially square (rectangular shape is shown in the figure by way of example) opening portions 6F are formed in regions at which the shading layer 6D is not provided. This opening portions 6F shown in the figure by way of example are arranged in a matrix in the longitudinal and lateral directions. In FIG. 9, the state is shown before the materials for forming the display elements, such as the filter elements 3, the hole injection layers 202, the EL layers 203, and the like are supplied for the formation of the color filter substrate or EL panel described above.

In each opening portion 6F, of internal surfaces 6X and 6Y of the shading layer 6D surrounding this opening portion 6F, the internal surfaces 6X forming the long sides of the opening portion 6F are formed to have irregularities. In addition, the distance between parts of the shading layer 6D which oppose each other with the opening portion 6F provided therebetween is increased and decreased along the long side of the opening portion 6F (the X direction in the figure). Furthermore, along the long side of the opening portion 6F (the X direction in the figure), the width of the shading layer 6D is increased and decreased.

In the opening portions 6F described above, the display elements, that is, the filter elements 3 of the color filter substrate, or the hole injection layers 202 and the EL layers 203 of the EL panel are formed. Accordingly, the various materials in a droplet 8 form are supplied in the opening portions 6F. In the opening portion 6F of this embodiment, the structure is formed so that the droplets hit hitting positions P shown in FIG. 9(a). As shown in the figure, the hitting positions P are set at positions each corresponding to that at which the width of the shading layer 6D, which is increased and decreased along the X direction, is maximum (cross-sectional position taken along the line B-B in the figure). In the example shown in the figure, the three hitting positions P are provided in each opening portion 6F, and one display element is formed of three droplets.

According to this embodiment, when hitting the hitting position P, as shown in FIG. 13(d), the droplet 8 is temporarily spread widely; however, since the widths of parts of the shading layer 6D located at both sides (right and left sides in figure) of this hitting position P are large, when the shading layer 6D having a physical thickness is formed on the substrate 12 as shown in the figure by way of example, or the shading layer 6D has properties of preventing the spread of the liquid material (for example, the shading layer 6D has properties (low wettability) of repelling the liquid material), the probability in which the liquid material overflows the shading layer 6D and the partition 6E and enters both neighboring opening portions 6F can be reduced. In addition, when the shading layer 6D has a very small thickness although being formed on the substrate 12 or has substantially no physical thickness as in the case in which a shading layer is formed on the other substrate, and in addition, when the shading layer 6D has no properties of preventing the spread of the liquid material, the effect described above of preventing mixing of liquid materials in neighboring opening portions cannot be obtained by the shading layer 6D. However, even when the liquid materials in the neighboring opening portions are mixed with each other, since areas at which the mixing occurs are covered with the shading layer, defects caused by the mixing of materials, such as color mixture, can be prevented.

Accordingly, since the margin for the droplet amount can be significantly increased, control of the droplet amount becomes easier, and insufficient spread (formation of non-colored portions or the like) of display elements can be prevented, for example, by increasing the droplet amount thereof. In addition, as a result, improvement in production efficiency and production yield can be achieved.

Figure 10:
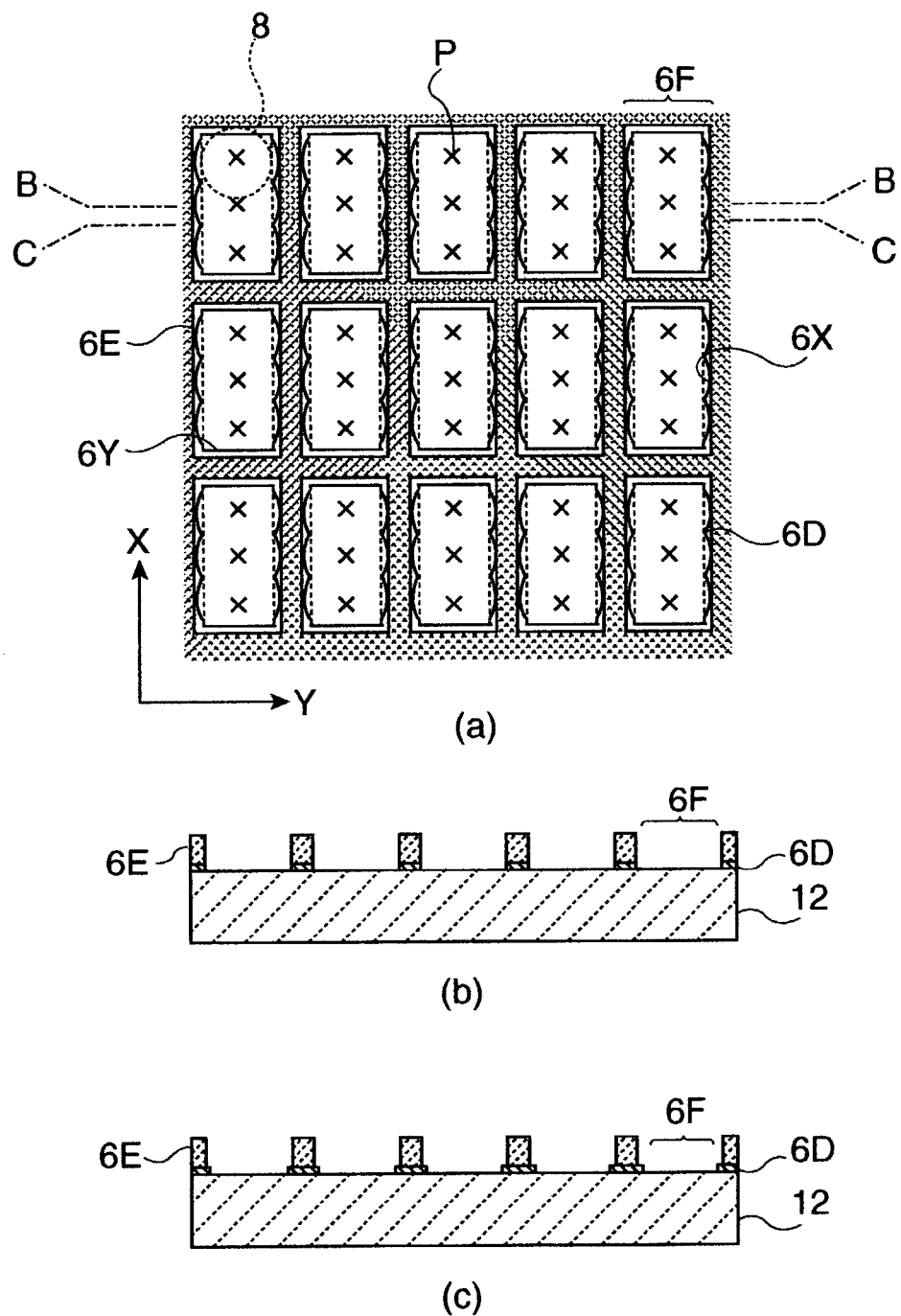
FIG. 10 includes a partial plan view (a) showing the structure of a sixth embodiment of the present invention, a cross-sectional view (b) showing the structure taken along the line B-B, and a cross-sectional view (c) showing the structure taken along the line C-C.

Next, important portions of a sixth embodiment of the present invention, which are applicable to the methods described above for manufacturing the color filter substrate and the El panel, will be described in detail. FIG. 10 includes a plan view (a) showing the structure on the substrate 12 according to the sixth embodiment, a schematic cross-sectional view (b) of the structure taken along the line B-B in (a), and a schematic cross-sectional view (c) of the structure taken along the line C-C.

Also in this embodiment, the shading layer 6D is formed on the substrate 12. The shading layer 6D may be formed of a thin metal film of Cr, Al, Ag, an alloy thereof, or the like, or may be a black matrix formed of a black resin or the like. The shading layer 6D is formed by a known photolithographic method or a selective film-forming method. In addition, the partition 6E is formed on the shading layer 6D. This partition 6E may be formed of the same material as that used in the first to fourth embodiments described above; however, since the shading layer 6D is formed in this embodiment, a light transparent material may be used for the partition 6E.

In this embodiment, substantially square (rectangular shape is shown in the figure by way of example) opening portions 6F are formed in regions of the substrate 12 at which the shading layer 6D is not provided. This opening portions 6F shown in the figure by way of example are arranged in a matrix in the longitudinal and lateral directions. In FIG. 10, the state is shown before the materials for forming the display elements, such as the filter elements 3, the hole injection layers 202, the EL layers 203, and the like are supplied for the formation of the color filter substrate or EL panel described above.

In each opening portion 6F, of internal surfaces 6X and 6Y of the shading layer 6D surrounding this opening portion 6F, the internal surfaces 6X forming the long sides of the opening portion 6F are formed to have irregularities. In addition, the distance between parts of the shading layer 6D which oppose each other with the opening portion 6F provided therebetween is increased and decreased along the long side of the opening portion 6F (the X direction in the figure). In addition, along the long side of the opening portion 6F (the X direction in the figure), the width of the shading layer 6D is increased and decreased.

In the opening portions 6F described above, the display elements, that is, the filter elements 3 of the color filter substrate, or the hole injection layers 202 and the EL layers 203 of the EL panel are formed. Accordingly, the various materials in a droplet 8 form are supplied in the opening portions 6F. In the opening portion 6F of this embodiment, the structure is formed so that the droplets hit hitting positions P shown in FIG. 10(a). As shown in the figure, the hitting positions P are set at positions each corresponding to that at which the distance between parts of the shading layer 6D, which is increased and decreased along the X direction, is maximum, that is, at which the width of the region 7 is maximum (cross-sectional position taken along the line B-B in the figure). In the example shown in the figure, the three hitting positions P are provided in each opening portion 6F, and one display element is formed of three droplets.

According to this embodiment, when hitting the hitting position P, as shown in FIG. 13(d), the droplet 8 is temporarily spread widely. However, since the distance between parts of the shading layer 6D at the position corresponding to this hitting position P is large, the temporary spread of the droplet 8 can be received in the opening portion 6F having a large width. Accordingly, when the shading layer 6D having a physical thickness is formed on the substrate 12 as shown in the figure by way of example, or the shading layer 6D has properties of preventing the spread of the liquid material (for example, the shading layer 6D has properties (low wettability) of repelling the liquid material), the probability in which the liquid material overflows the shading layer 6D and the partition 6E and enters both neighboring opening portions 6F can be reduced. In addition, when the shading layer 6D has a very small thickness although being formed on the substrate 12 or has substantially no physical thickness as in the case in which a shading layer is formed on the other substrate, and in addition, when the shading layer 6D has no properties of preventing the spread of the liquid material, the effect described above of preventing mixing of liquid materials in neighboring opening portions cannot be obtained by the shading layer 6D. However, since the distance between parts of the shading layer 6D at a position away from the hitting position is small, even when insufficient spread of the liquid material occurs at a position away from the hitting position of the droplet, the position at which the liquid material is not present because of the insufficient spread thereof is shaded with the shading layer, and hence defects caused by insufficient spread of the liquid material, such as formation of non-colored portions, can be prevented. Accordingly, since the margin for the droplet amount can be significantly increased, control of the droplet amount becomes easier, and mixing (for example, occurrence of color mixture) of the display elements can be prevented, for example, by decreasing the droplet amount. In addition, as a result, improvement in production efficiency and production yield can be achieved.

Figure 11:
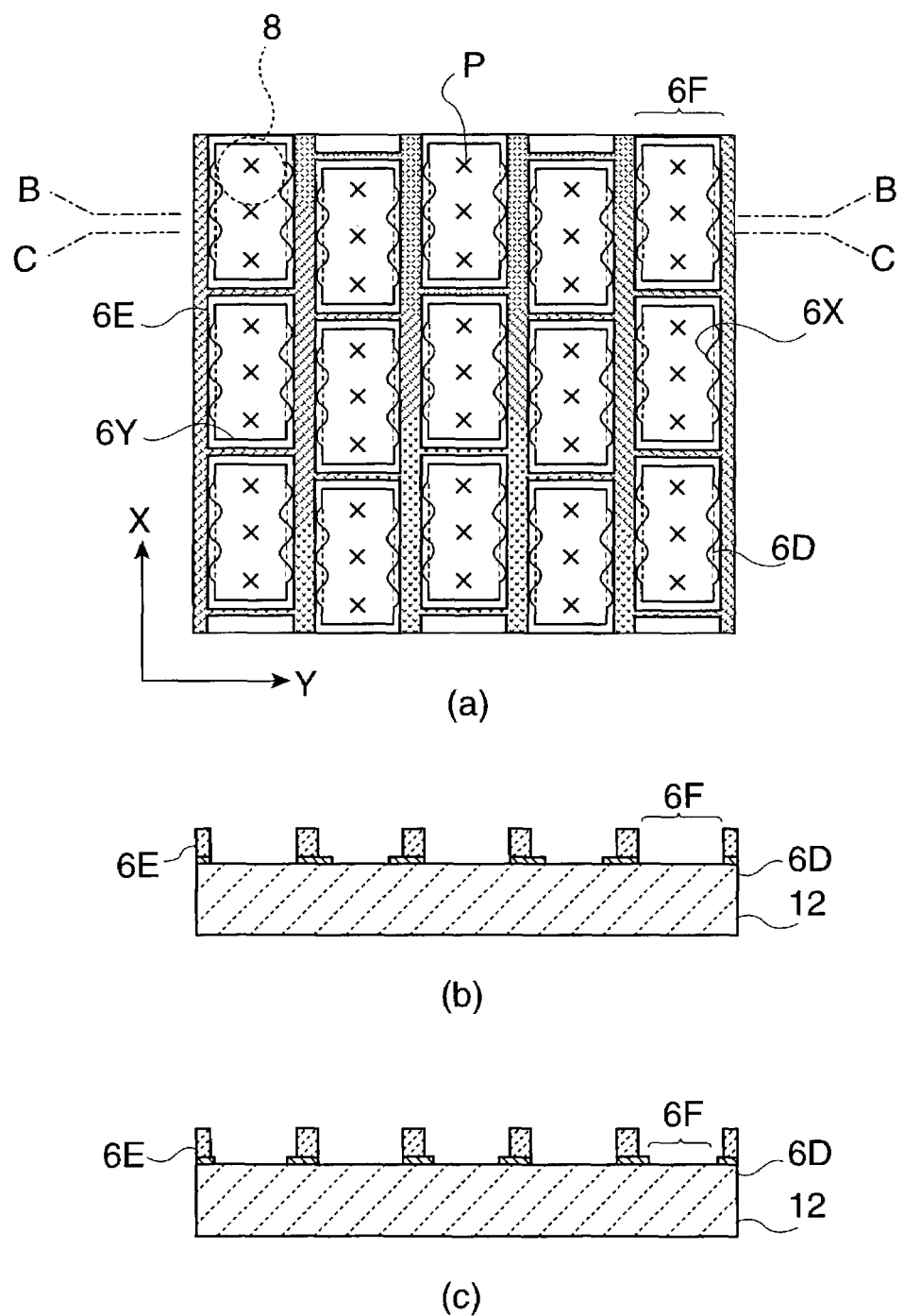
FIG. 11 includes a partial plan view (a) showing the structure of a seventh embodiment of the present invention, a cross-sectional view (b) showing the structure taken along the line B-B, and a cross-sectional view (c) showing the structure taken along the line C-C.

Next, important portions of a seventh embodiment of the present invention, which are applicable to the methods described above for manufacturing the color filter substrate and the El panel, will be described in detail. FIG. 11 includes a plan view (a) showing the structure on the substrate 12 according to the seventh embodiment, a schematic cross-sectional view (b) of the structure taken along the line B-B in (a), and a schematic cross-sectional view (c) of the structure taken along the line C-C.

Also in this embodiment, the shading layer 6D is formed on the substrate 12. The shading layer 6D may be formed of a thin metal film of Cr, Al, Ag, an alloy thereof, or the like, or may be a black matrix formed of a black resin or the like. The shading layer 6D is formed by a known photolithographic method or a selective film-forming method. In addition, the partition 6E is formed on the shading layer 6D. This partition 6E may be formed of the same material as that used in the first to fourth embodiments described above; however, since the shading layer 6D is formed in this embodiment, a light transparent material may be used for the partition 6E.

In this embodiment, substantially square (rectangular shape is shown in the figure by way of example) opening portions 6F are formed in regions at which the shading layer 6D is not provided. According to the example shown in the figure, the opening portions 6F disposed on the same straight line are arranged in the same manner as those on the every other line, or the opening portions 6F are arranged in a staggered manner. In FIG. 11, the state is shown before the materials for forming the display elements, such as the filter elements 3, the hole injection layers 202, the EL layers 203, and the like are supplied for the formation of the color filter substrate or EL panel described above.

In each opening portion 6F, of internal surfaces 6X and 6Y of the shading layer 6D surrounding this opening portion 6F, the internal surfaces 6X forming the long sides of the opening portion 6F are formed to have irregularities. In addition, the distance between parts of the shading layer 6D which oppose each other with the opening portion 6F provided therebetween is increased and decreased along the long side of the opening portion 6F (the X direction in the figure). In addition, along the long side of the opening portion 6F (the X direction in the figure), the width of the shading layer 6D is formed to be substantially constant. That is, in this embodiment, the shading layer 6D separating the opening portions 6F adjacent to each other is formed to extend in the X direction on the whole while the width thereof is increased and decreased in the Y direction repeatedly.

In the opening portions 6F described above, the display elements, that is, the filter elements 3 of the color filter substrate, or the hole injection layers 202 and the EL layers 203 of the EL panel are formed. Accordingly, the various materials in a droplet 8 form are supplied in the opening portion 6F. In the opening portion 6F of this embodiment, the structure is formed so that the droplets hit hitting positions P shown in FIG. 11(a). As shown in the figure, the hitting positions P are set at positions each corresponding to that at which the distance between parts of the shading layer 6D, which is increased and decreased along the X direction, is maximum, that is, at which the width of the opening portion 6F is maximum. In the example shown in the figure, the three hitting positions P are provided in each opening portion 6F, and one display element is formed of three droplets.

According to this embodiment, when hitting the hitting position P, as shown in FIG. 13(d), the droplet 8 is temporarily spread widely; however, since the distance between parts of the shading layer 6D at a position corresponding to this hitting position P is large, the temporary spread of the droplet 8 can be received in the opening portion 6F having a large width. Accordingly, when the shading layer 6D having a physical thickness is formed on the substrate 12 as shown in the figure by way of example, or the shading layer 6D has properties of preventing the spread of the liquid material (for example, the shading layer 6D has properties (low wettability) of repelling the liquid material), the probability in which the liquid material overflows the shading layer 6D and the partition 6E and enters both neighboring opening portions 6F can be reduced. In addition, when the shading layer 6D has a very small thickness although being formed on the substrate 12 or has substantially no physical thickness as in the case in which a shading layer is formed on the other substrate, and in addition, when the shading layer 6D has no properties of preventing the spread of the liquid material, the effect described above of preventing the mixing of liquid material cannot be obtained by the shading layer 6D. However, since the distance between parts of the shading layer 6D at a position away from the hitting position is small, even when insufficient spread of the liquid material occurs at a position away from the hitting position of the droplet, the position at which the liquid material is not present because of the insufficient spread thereof is shaded with the shading layer, and hence defects caused by insufficient spread of the liquid material, such as formation of non-colored portions, can be prevented. Accordingly, since the margin for the droplet amount can be significantly increased, control of the droplet amount becomes easier, and mixing (for example, occurrence of color mixture) of the display components can be prevented, for example, by decreasing the droplet amount. In addition, as a result, improvement in production efficiency and production yield can be achieved.

Figure 12:
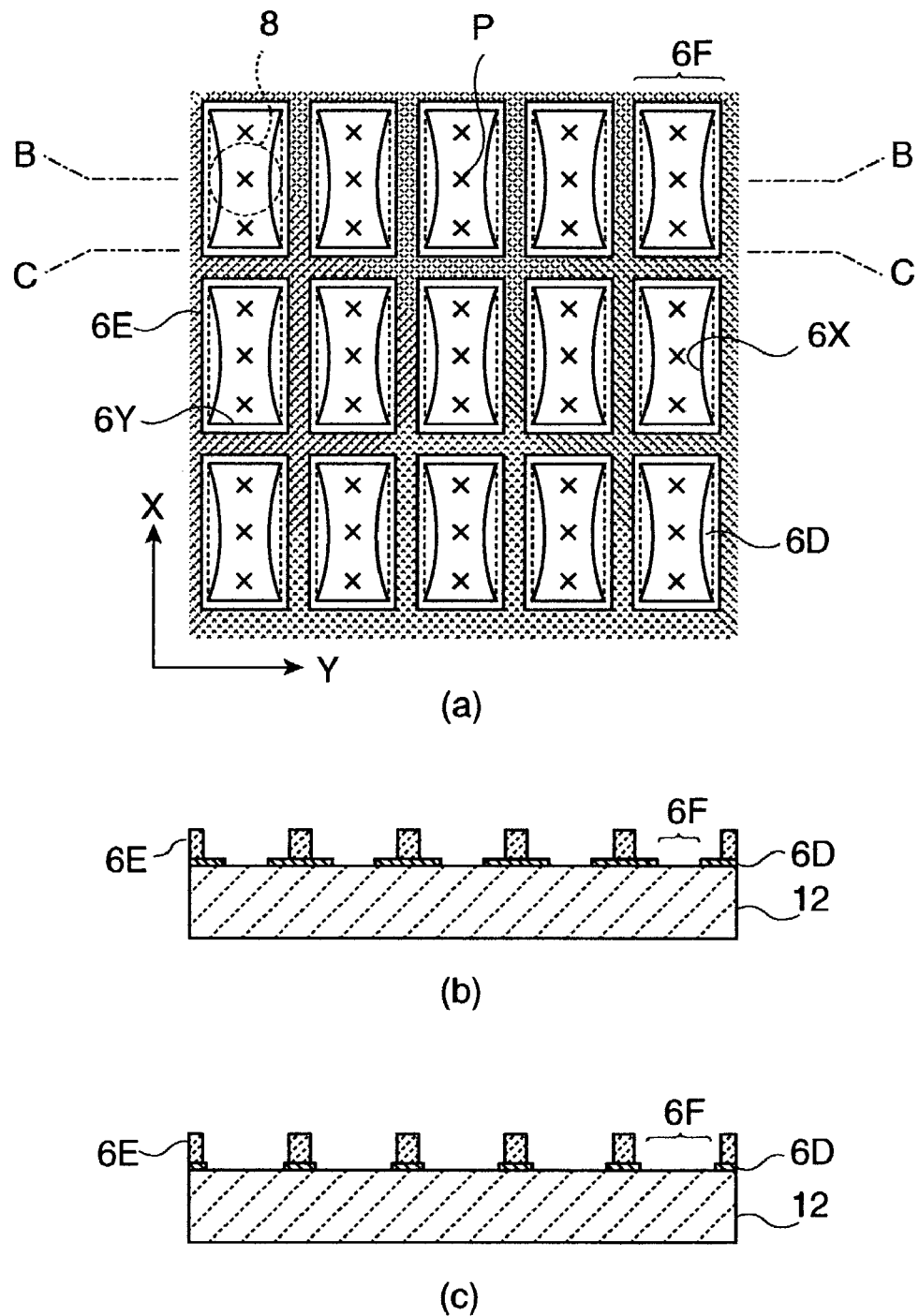
FIG. 12 includes a partial plan view (a) showing the structure of a eighth embodiment of the present invention, a cross-sectional view (b) showing the structure taken along the line B-B, and a cross-sectional view (c) showing the structure taken along the line C-C.

Next, important portions of an eighth embodiment of the present invention, which are applicable to the methods described above for manufacturing the color filter substrate and the El panel, will be described in detail. FIG. 12 includes a plan view (a) showing the structure on the substrate 12 according to the eighth embodiment, a schematic cross-sectional view (b) of the structure taken along the line B-B in (a), and a schematic cross-sectional view (c) of the structure taken along the line C-C.

Also in this embodiment, the shading layer 6D is formed on the substrate 12. The shading layer 6D may be formed of a thin metal film of Cr, Al, Ag, an alloy thereof, or the like, or may be a black matrix formed of a black resin or the like. The shading layer 6D is formed by a known photolithographic method or a selective film-forming method. In addition, the partition 6E is formed on the shading layer 6D. This partition 6E may be formed of the same material as that used in the first to fourth embodiments described above; however, since the shading layer 6D is formed in this embodiment, a light transparent material may be used for the partition 6E.

In this embodiment, substantially square (rectangular shape is shown in the figure by way of example) opening portions 6F are formed in regions of the substrate 12 at which the shading layer 6D is not provided. According to the example shown in the figure, the opening portions 6F are arranged in a matrix in the longitudinal and lateral directions. In FIG. 12, the state is shown before the materials for forming the display elements, such as the filter elements 3, the hole injection layers 202, the EL layers 203, and the like are supplied for the formation of the color filter substrate or EL panel described above.

In each opening portion 6F, of internal surfaces 6X and 6Y of the shading layer 6D surrounding this opening portion 6F, the internal surfaces 6X forming the long sides of the opening portion 6F are formed to have irregularities. In addition, the distance between parts of the shading layer 6D which oppose each other with the opening portion 6F provided therebetween is increased and decreased along the long side of the opening portion 6F (the X direction in the figure). In addition, along the long side of the opening portion 6F (the X direction in the figure), the width of the shading layer 6D is increased and decreased.

In particular in this embodiment, the width of the shading layer 6D provided between the opening portions 6F adjacent to each other is large at a position corresponding to an approximately central position of the opening portion 6F in the X direction and is small at positions corresponding to both ends of the opening portion 6F in the X direction.

In the opening portions 6F described above, the display elements, that is, the filter elements 3 of the color filter substrate, or the hole injection layers 202 and the EL layers 203 of the EL panel are formed. Accordingly, the various materials in a droplet form are supplied in the opening portions 6F. In the opening portion 6F of this embodiment, the structure is formed so that the droplets 8 hit hitting positions P shown in FIG. 12(a). As shown in the figure, the hitting positions P are each set at the approximately central position of the opening portion 6F corresponding to that at which the width of the shading layer 6D, which is increased and decreased along the X direction, is maximum. In addition, at both sides (upper and lower sides in the figure) of the approximately central position, the hitting positions P are further provided respectively. In the example shown in the figure, the three hitting positions P are provided in each opening portion 6F, and one display element is formed of three droplets.

According to this embodiment, when hitting the hitting position P, as shown in FIG. 13(d), the droplet 8 is temporarily spread widely. However, since the widths of parts of the shading layer 6D at both sides (right and left sides in the figure) of this hitting position P are large, when the droplet 8 hits the approximately central position of the opening portion 6F, and when the shading layer 6D has a physical thickness formed on the substrate 12 as shown in the figure by way of example or has properties of preventing the spread of the liquid material (for example, the shading layer 6D has properties (low wettability) of repelling the liquid material), the probability in which the liquid material overflows the shading layer 6D and the partition 6E and enters both neighboring opening portions 6F can be reduced. In addition, when the shading layer 6D has a very small thickness although being formed on the substrate 12 or has substantially no physical thickness as in the case in which a shading layer is formed on the other substrate, and in addition, when the shading layer 6D has no properties of preventing the spread of the liquid material, the effect described above of preventing mixing of liquid materials cannot be obtained by the shading layer 6D. However, even when liquid materials in the neighboring opening portions 6F are mixed with each other, areas at which the mixing occurs are covered with the shading layer, and hence defects caused by the mixing of the liquid materials, such as color mixture, can be prevented. Accordingly, since the margin for the droplet amount can be significantly increased, control of the droplet amount becomes easier, and insufficient spread (for example, formation of non-colored portions) of the display components can be prevented, for example, by increasing the droplet amount. In addition, as a result, improvement in production efficiency and production yield can be achieved.

In addition, as described above, since the width of the shade portion is large or the distance between parts of the shade portion is small at the central position of the opening portion, even in the state in which the liquid material is statically received in the opening portion not when but after the droplet hits the substrate, mixing (color mixture or the like) of liquid materials in neighboring opening portions can be suppressed when the shade portion has a physical thickness or properties of preventing the spread of the liquid material. In addition, even when the shade portion has no physical thickness nor properties of preventing the spread of the liquid material, mixing of liquid materials in neighboring opening portions which occurs in the vicinity of the central position can be easily shaded with the shade portion. Being different from those described above, these effects can be obtained regardless of the hitting position of the droplet (that is, even in the case in which the droplet does not hit the central position of the opening portion).

In the fifth to eighth embodiments described above, the shading layer 6D is always formed on the substrate 12, and the partition 6E is formed thereon. However, on the contrary, the shading layer 6D may be formed on the partition 6E. In addition, the shading layer 6D may be formed separately on a different member (a substrate opposing the substrate 12 or the like). Furthermore, without the partition 6E, only the shading layer 6D may be formed for defining a plurality of the opening portions 6F.

Figure 14:
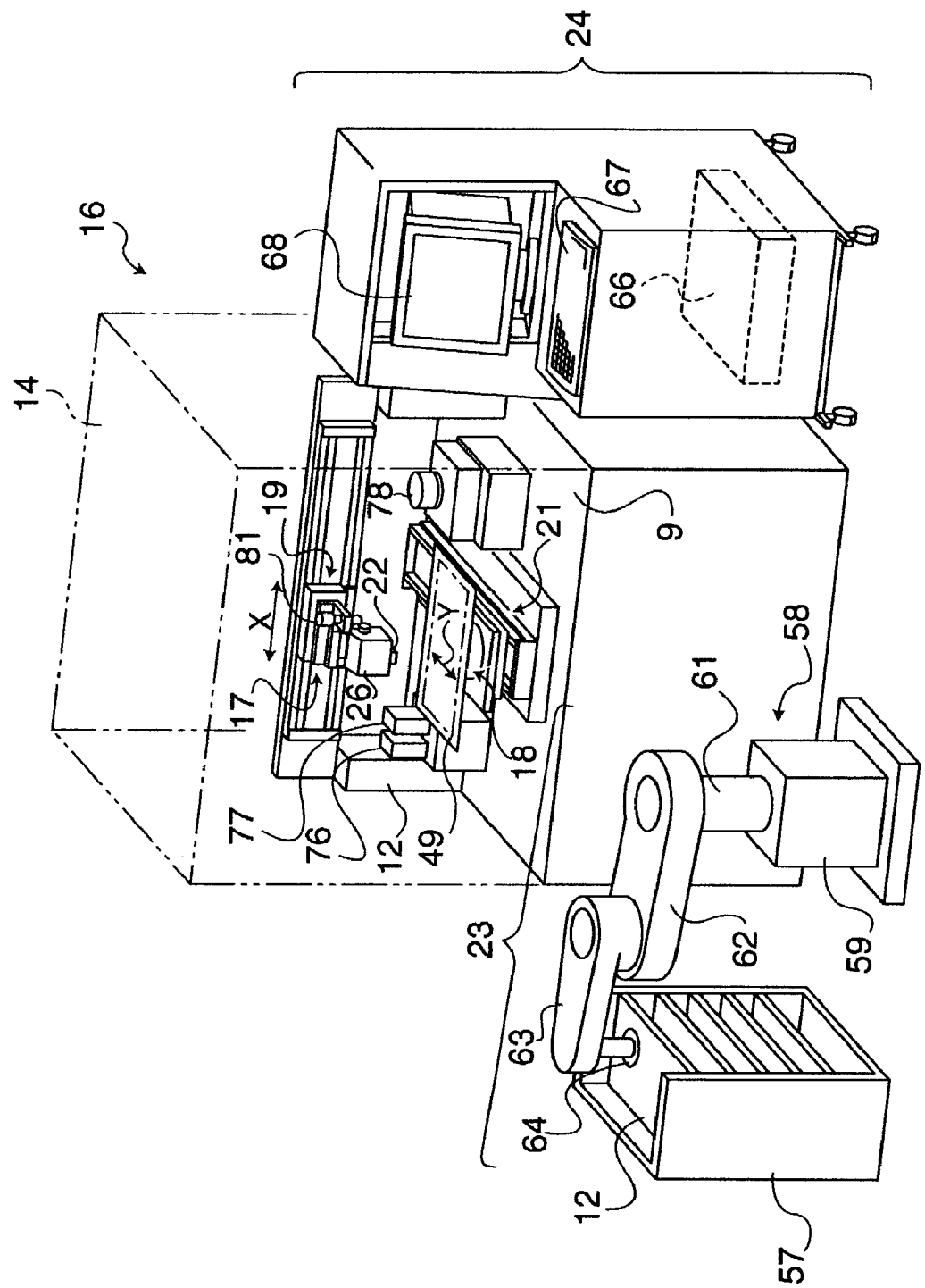
FIG. 14 is a perspective view showing a droplet ejecting apparatus of the present invention or one embodiment of a droplet ejecting apparatus as an important portion of manufacturing equipment for display devices (manufacturing equipment for color filters, liquid crystal devices, EL devices, and the like)
Figure 15:
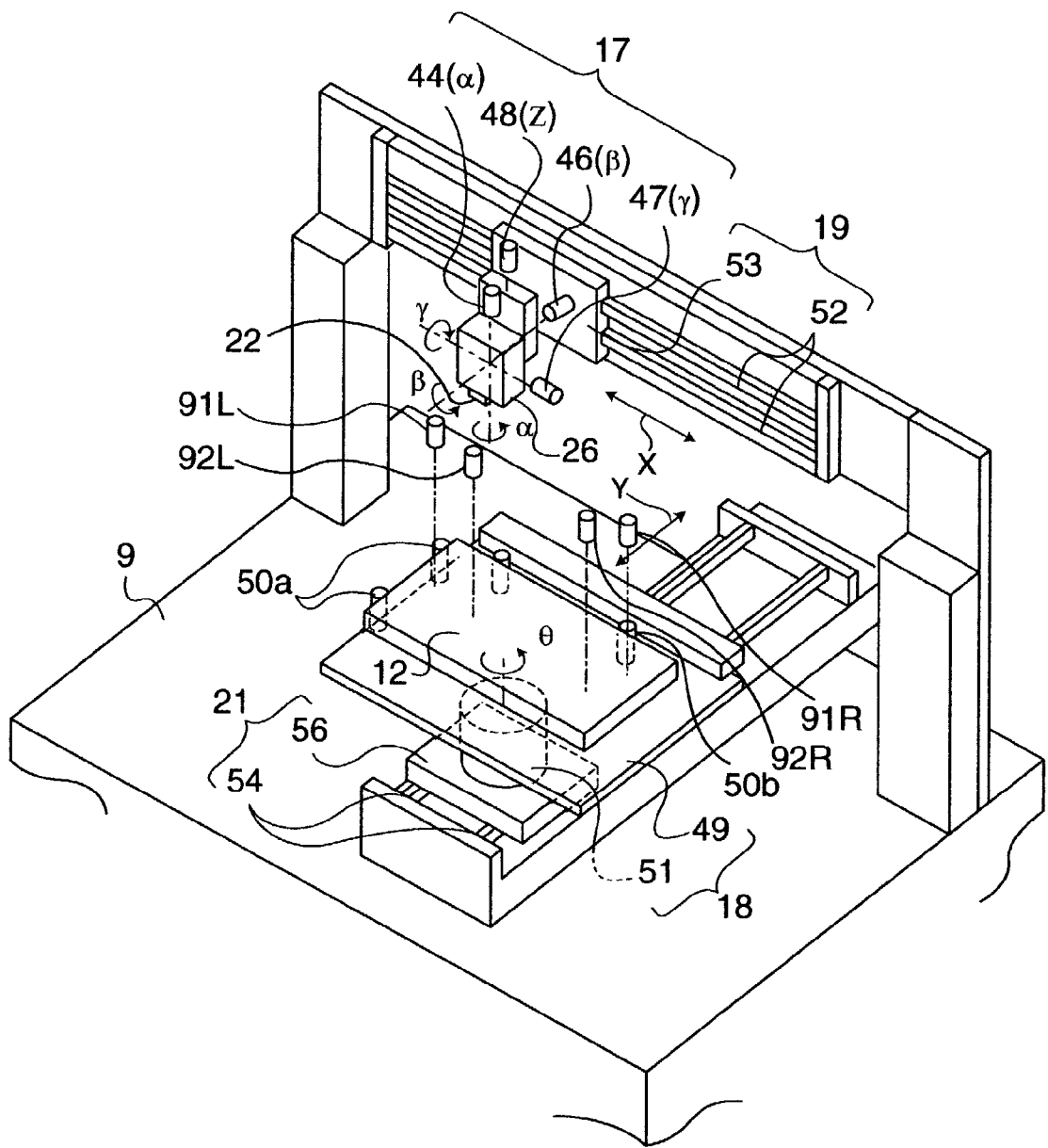
FIG. 15 is an enlarged perspective view of an important portion of the apparatus shown in FIG. 14.

Next, the structure of a liquid ejecting device usable in the embodiments described above will be described. FIG. 14 is a schematic perspective view showing the entire structure of a liquid ejecting device, and FIG. 15 is a partial perspective view showing important portions of the liquid ejecting device.

A droplet ejecting device 16 is, as shown in FIG. 14, can include a head unit 26 incorporating a head 22, which is an example of a liquid ejecting head for use in a printer or the like; a head position control device 17 for controlling a head position, i.e., a head 22 position, a substrate position control device 18 for controlling a substrate 12 position, a scanning drive device 19 as scanning drive device for scanning the head 22 in the scanning direction X with respect to the substrate 12, a travel drive device 21 for traveling the head 22 in the traveling direction Y perpendicular to the scanning direction with respect to the substrate 12, a substrate supply device 23 for supplying the substrate 12 to a predetermined operation position in the droplet ejecting device 16, and a control device 24 responsible for controlling the entire droplet ejecting device 16.

The individual devices, that is, the head position control device 17, the substrate position control device 18, the scanning drive device 19, and the travel drive device 21, are installed on a base 9. In addition, these devices are covered with a cover 14 whenever necessary.

Figure 16:
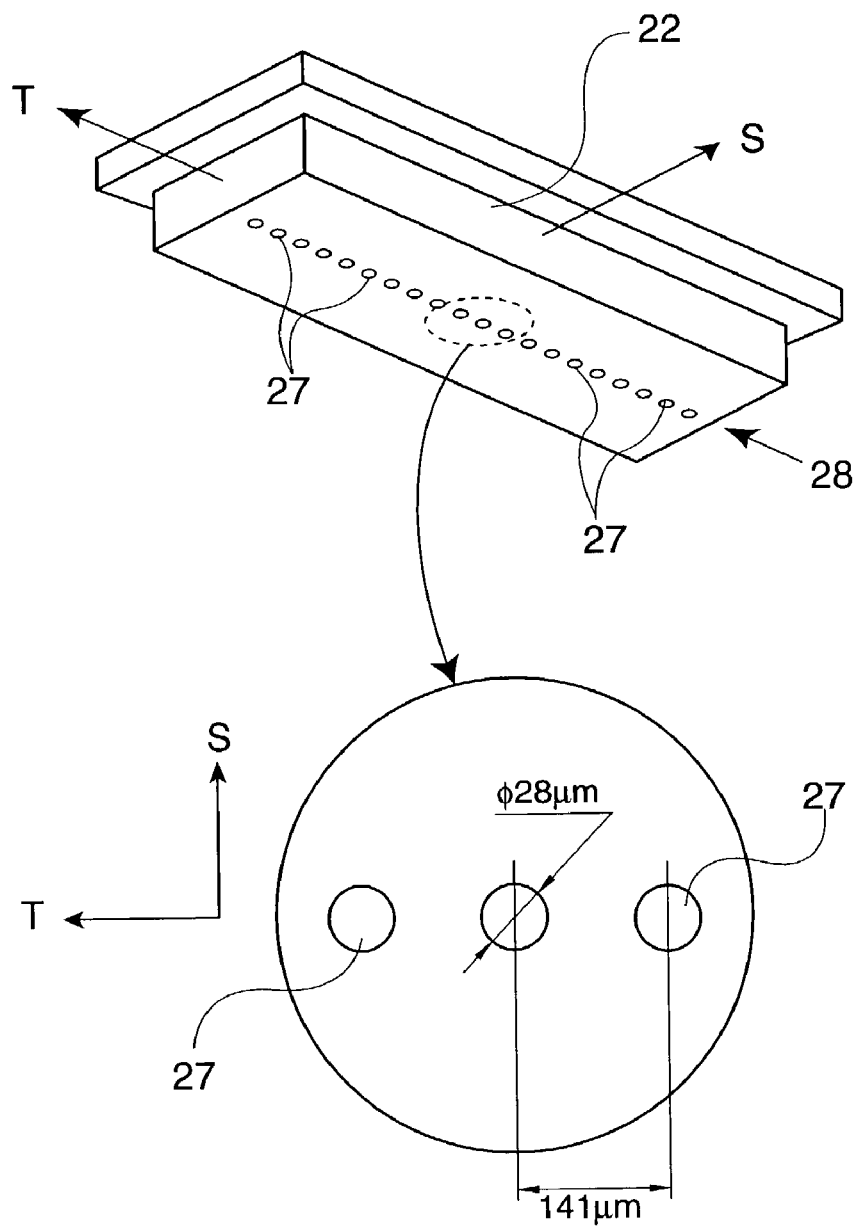
FIG. 16 is an enlarged perspective view of a head that is an important portion of the apparatus shown in FIG. 15.

As shown in FIG. 16, for example, the head 22 has a nozzle line 28 on which a plurality of nozzles 27 are provided. The number of the nozzles 27 is, for example, 180, the diameter of the nozzle 27 is, for example, 28 µm, and pitch T between the nozzles 27 is, for example, 141 µm. Standard direction S shown in FIG. 16 shows the standard scanning direction, and arranging direction T shows an arrangement direction of the nozzles 27 on the nozzle line 28.

Figure 17:
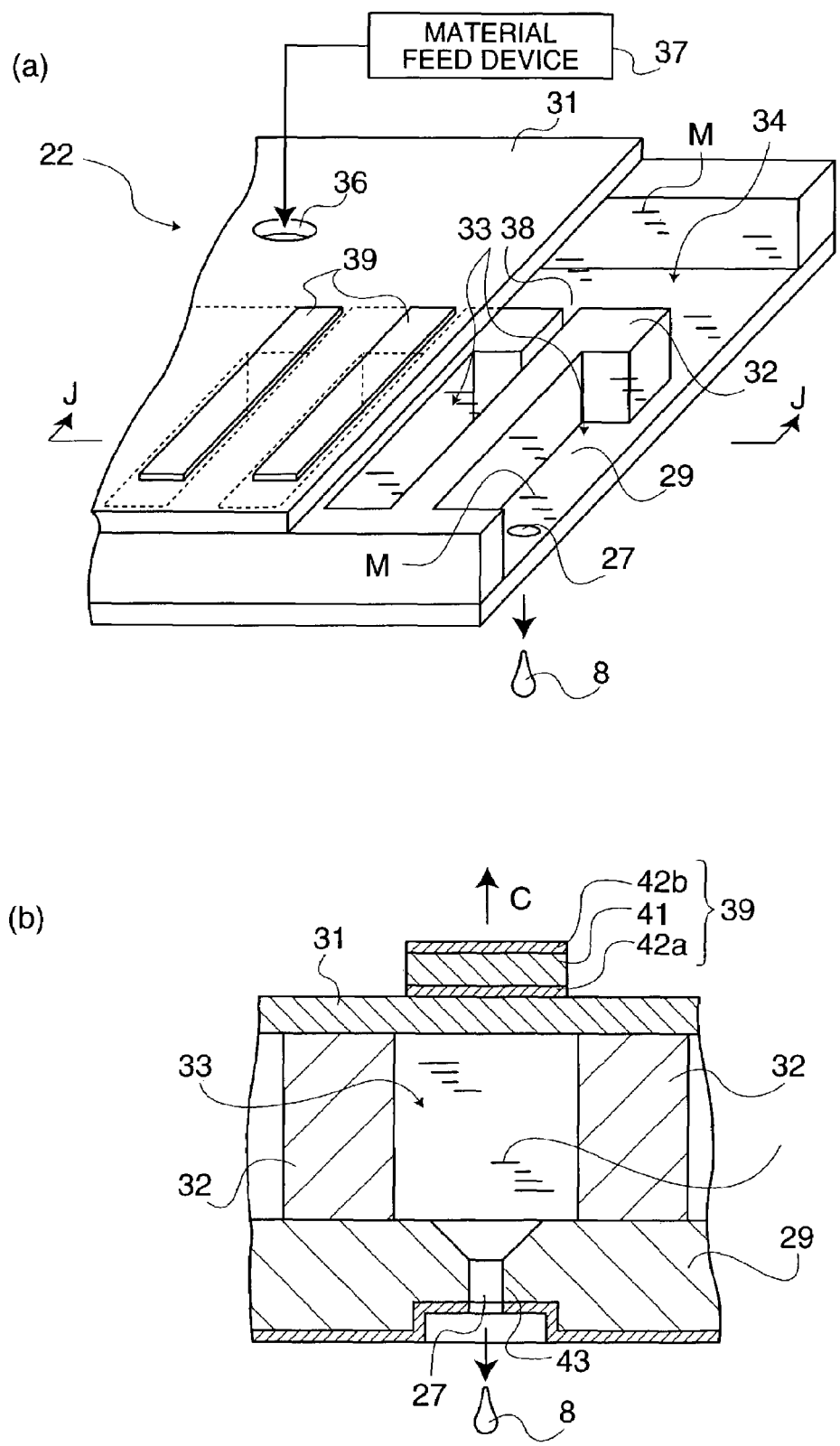
FIG. 17 includes views showing the internal structure of a head, (a) is a partly exploded perspective view, and (b) shows the cross-sectional structure taken along the line J-J in (a)

As shown in FIGS. 17(a) and (b), for example, the head 22 comprises a nozzle plate 29 made of a stainless steel or the like, a diaphragm 31 opposing thereto, and a plurality of partition members 32 bonded to both of them. Between the nozzle plate 29 and the diaphragm 31, a plurality of material rooms 33 and a liquid pool 34 are formed by the partition members 32. These material rooms 33 are communicated with the liquid pool 34 via paths 38.

A material feed opening 36 is provided at an appropriate position in the diaphragm 31. A material container 37 is communicated with this material feed opening 36. The material container 37 supplies a material M composed, for example, of a filter element material having R color selected from R, G, and B colors to the material feed opening 36. The material M thus supplied is filled in the liquid pool 34 and is further filled in the material rooms 33 after passing through the paths 38.

The nozzles 27 for jetting the material M from the material rooms 33 are provided in the nozzle plate 29. In addition, on the rear side of a surface of the diaphragm 31 facing the material rooms 33, material pressure plates 39 are provided for the respective material rooms 33. This pressure plate 39 has, as shown in FIG. 17(b), a pair of electrodes 42a and 42b and a piezoelectric element 41 provided therebetween. The piezoelectric element 41 is deformed so as to project outside as indicated by the arrow C when electricity is applied between the electrodes 42a and 42b, thereby increasing the volume of the material room 33. Consequently, the material M in an amount corresponding to the increased volume mentioned above is fed into the material room 33 from the liquid pool 34 through the path 38.

Subsequently, when application of electricity to the piezoelectric element 41 is stopped, this piezoelectric element 41 and the diaphragm 31 are both returned to the original shapes, and since the volume of the material room 33 is also returned to the original one, a pressure of the material M in the material room 33 is increased, thereby ejecting the material M in a droplet 8 form from the nozzle 27. Related to this, in order to prevent the trajectory deviation of the droplet 8 or clogging of the nozzle 27, a repellent material layer 43 formed, for example, of a Ni-tetrafluoroethylene eutectoid plating layer 43 is provided in the vicinity of the nozzles 27.

Next, referring to FIG. 15, the head position control device 17, the substrate position control device 18, the scanning drive device 19, the travel drive device 21, and other means disposed in the vicinity of the head 22 will be described. The head position control device 17 has an α motor for rotating the head 22 fixed to the head unit 26 in a plane surface (horizontal surface), a β motor 46 for rotating the head 22 in an oscillating manner around an axis line parallel with the traveling direction Y, a γ motor 47 for rotating the head 22 in an oscillating manner around an axis line parallel to the scanning direction X, and a Z motor 48 moving the head 22 parallel with the longitudinal direction.

In addition, the substrate position control device 18 has a table 49 for receiving the substrate 12 thereon, and a θ motor 51 for rotating this table 49 in a plane surface (horizontal surface). In addition, the scanning drive device 19 has an X guide rail 52 extending in the scanning direction X and an X slider 53 incorporating a linear motor operated, for example, by pulse drive. This X slider 53 is moved parallel with the scanning direction X along the X guide rail 52 by an operation, for example, of the embedded linear motor.

Furthermore, the travel drive device 21 has a Y guide rail 54 extending in the traveling direction Y and a Y slider 56 incorporating a linear motor operated, for example, by pulse drive. This Y slider 56 is moved parallel with the traveling direction Y along the Y guide rail 54 by an operation, for example, of the embedded linear motor.

The linear motors operated by pulse drive in the X slider 53 and the Y slider 56 can precisely perform the control of a rotation angle of an output shaft in accordance with pulse signals supplied to the motors. Accordingly, the position of the head 22 supported by the X slider 53 in the scanning direction X and the position of the table 49 in the traveling direction Y can be precisely controlled. Related to this, the position control of the head 22 or the table 49 is not limited to the position control performed by the pulse motors and may also be performed by feedback control using a servo motor or another optional method.

Locating pins 50a and 50b for defining a plane position of the substrate 12 are provided for the table 49. The substrate 12 is held at a predetermined position while being brought into contact with the locating pins 50a and 50b at the edge surfaces of the substrate 12 at the scanning direction X side and traveling direction Y side by a substrate supply device 23 described later. In order to fix the substrate 12 thus held in the predetermined position, for example, known fixing means, such as air suction means (vacuum chuck), is preferably provided for the table 49.

In the droplet ejecting device 16 of this embodiment, as shown in FIG. 15, plural sets (two sets are shown in the figure by way of example) of image devices, 91R and 91L and 92R and 92L, are disposed above the table 49. In this embodiment, only tubes of the image devices 91R, 91L, 92R, and 92L are shown in FIG. 15, and other parts and the supporting structure thereof are omitted.

As the image devices functioning as observing means, CCD cameras or the like may be used. In FIG. 14, the illustration of these image devices is omitted.

The substrate supply device 23 shown in FIG. 14 has a substrate receiving portion 57 for receiving the substrates 12 and a substrate transfer mechanism 58 such as a robot for transferring the substrates 12. The substrate transfer mechanism 58 has a base substrate 59, an elevation shaft 61 moving up and down with respect to the base substrate 59, a first arm 62 which swings around the elevation shaft 61, a second arm 63 which swings around a shaft connected to the first arm 62, and a suction pad 64 provided on the bottom surface of the front end of the second arm 63. This suction pad 64 is formed to adsorb and hold the substrate 12 by air suction (vacuum chuck).

In addition, as shown in FIG. 14, a capping device 76 and a cleaning device 77 are disposed under the scanning track of the head 22 and at one side of the travel drive device 21. Furthermore, at the other side of the travel drive device 21, an electronic balance 78 is disposed. The capping device 76 serves to prevent the nozzles 27 (see FIG. 16) from being dried while the head 22 is in standby mode. The cleaning device 77 is a device for cleaning the head 22. The electronic balance is a device for measuring weight of the droplet 8 of a material ejected from each nozzle 27 formed in the head 22. In addition, in the vicinity of the head 22, a head camera 81 that is moved along with the head 22 is provided.

The control device 24 shown in FIG. 14 has a main computer body 66 including a processor, an input device 67 such as a keyboard, and a display device 68 such as a CRT. In the main computer body 66 shown in FIG. 14, a CPU (central processing unit) 69 and an information recording medium 71 which is a memory storing various information.

The head position control device 17, the substrate position control device 18, the scanning drive device 19, the travel drive device 21, and a head drive circuit 72 for driving the piezoelectric elements 41 (see FIG. 17(b)) in the head 22 are connected to the CPU 69 via an input/output interface 73 and a bus 74. In addition, the substrate supply device 23, the input device 67, the display device 68, the capping device 76, the cleaning device 77, and the electronic balance 78 are also connected to the CPU 69 via the input/output interface 73 and the bus 74 as in the case described above.

The memory as the information recording medium 71 is a concept including a semiconductor memory such as a RAM (random access memory) or a ROM (read only memory), and an external recording device such as a hard disc, a CD-ROM reading device, or a disc type recording medium. In addition, in view of the functionality, the information recording medium 71 can include a recording region for recording a program software in which control procedure for operation of the droplet ejecting device 16 is saved a recording region for recording ejection position on the substrate 12 to which a material is ejected by the head 22 as coordinate data, a recording region for recording a moving distance of the substrate 12 in the traveling direction Y shown in FIG. 15, a region functioning as a work area or a temporary file for the CPU 69, and other various recording regions.

Figure 18:
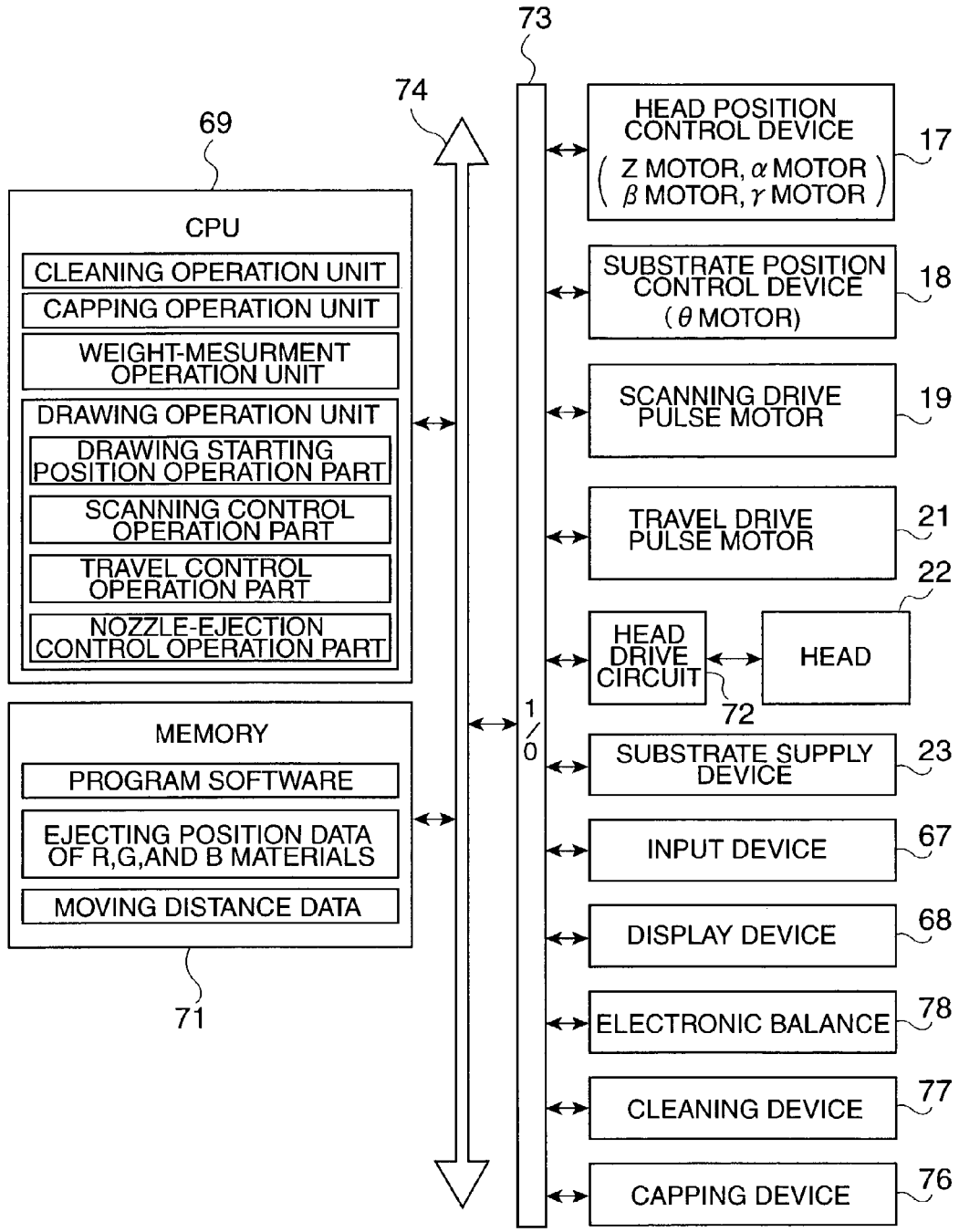
FIG. 18 is a block diagram showing an electrical control system used for a droplet ejecting device.

The CPU 69 performs control for ejecting a material at predetermined positions on the surface of the substrate 12 in accordance with program software stored in the memory functioning as the information recording medium 71. As particular function-executing units, there are provided a cleaning operation unit operating for executing cleaning treatment, as shown in FIG. 18, a capping operation unit operating for executing capping treatment, a weight-measurement operation unit operating for executing weight measurement using the electronic balance 78, and a drawing operation unit for drawing a predetermined pattern by hitting the surface of the substrate 12 with a material by droplet ejection.

The drawing operation unit described above can include various function operation parts, such as a drawing starting position operation part for disposing the head 22 at a starting position for drawing, a scanning control operation part operating control for scanning the head 22 in the scanning direction X at a predetermined speed, a travel control operation part operating control for moving the substrate 12 in the traveling direction Y by a predetermined moving distance, and a nozzle-ejection control operation part operating control for selecting one of nozzles 27 in the head 22 to eject a material.

In this embodiment, the various functions described above are executed by the program software stored in the CPU 69. However, when the various functions described above are executed by an electronic circuit without CPUs, an electronic circuit as mentioned above may be used instead.

Next, operation of the droplet ejecting device 16 having the structure described above will be described with reference to a flow chart shown in FIG. 19. When the droplet ejecting device 16 is turned on by electric power application performed by an operator, the initial setting is first executed in Step S1. In particular, the head unit 26, the substrate supply device 23, the control device 24, and the like are set in predetermined initial states.

Next, when weight measurement timing comes (Step S2), the head unit 26 shown in FIG. 15 is moved to the electronic balance 78 shown in FIG. 14 by the scanning drive device 19 (Step S3). Next, the amount of a material ejected from the nozzle 27 is measured by the electronic balance 78 (Step S4). Furthermore, in accordance with the material ejecting properties of the nozzle 27 thus measured, a voltage applied to the piezoelectric element 41 of each nozzle 27 is adjusted (Step S5).

Subsequently, when cleaning timing comes (Step S6), the head unit 26 shown in FIG. 15 is moved to the cleaning device 77 by the scanning drive device 19 (Step S7), and this cleaning device 77 cleans the head 22 (Step S8).

When the weight measurement timing and cleaning timing do not come, or the weight measurement and cleaning are complete, the substrate 12 is supplied to the table 49 in Step S9 by operating the substrate supply device 23 shown in FIG. 14. In particular, the substrate 12 in the substrate receiving portion 57 is adsorbed and chucked by the suction pad 64, is moved to the table 49 by operating the elevation shaft 61, the first arm 62, and the second arm 63, and is then pressed to the locating pins 50a and 50b (see FIG. 15) which are appropriately provided on the table 49. Related to this, in order to avoid the displacement of the substrate 12 on the table 49, the substrate 12 is preferably fixed on the table 49 by air suction (vacuum chucking) means or the like.

Next, by rotating an output shaft of the θ motor 51 by a minute angle unit while the substrate 12 is observed by the image devices 91R and 91L, the table 49 is rotated in a plane surface (horizontal surface) and is located (Step S1). In more particular, the pair of image devices 91R and 91L or that of 92R and 92L photographs alignment marks formed on both right and left ends of the substrate 12, respectively, the plane position of the substrate 12 is determined by operation using the image positions of these alignment marks, and angle θ is adjusted by rotating the table 49 in accordance with the plane position described above.

Subsequently, while the head camera 81 shown in FIG. 14 observes the substrate 12, the position at which drawing is started by the head 22 is determined by operation (Step S111). Next, by optionally operating the scanning drive device 19 and the travel drive device 21, the head 22 is moved to the drawing starting position (Step 12).

In this step, the head 22 may be positioned so that standard direction S shown in FIG. 16 coincides with the scanning direction X or so that the standard direction S is inclined by a predetermined angle with respect to the scanning direction. Since the pitches between the nozzles 27 and the pitches between the positions on the surface of the substrate 12 at which a material is to hit are different in many cases, a dimensional component in the traveling direction Y of the pitches between the nozzles 27 aligned in the direction T is necessary to be geometrically equal to the pitches between the hitting positions on the substrate 12 in the traveling direction Y, and hence this predetermined angle is provided.

Figure 19:
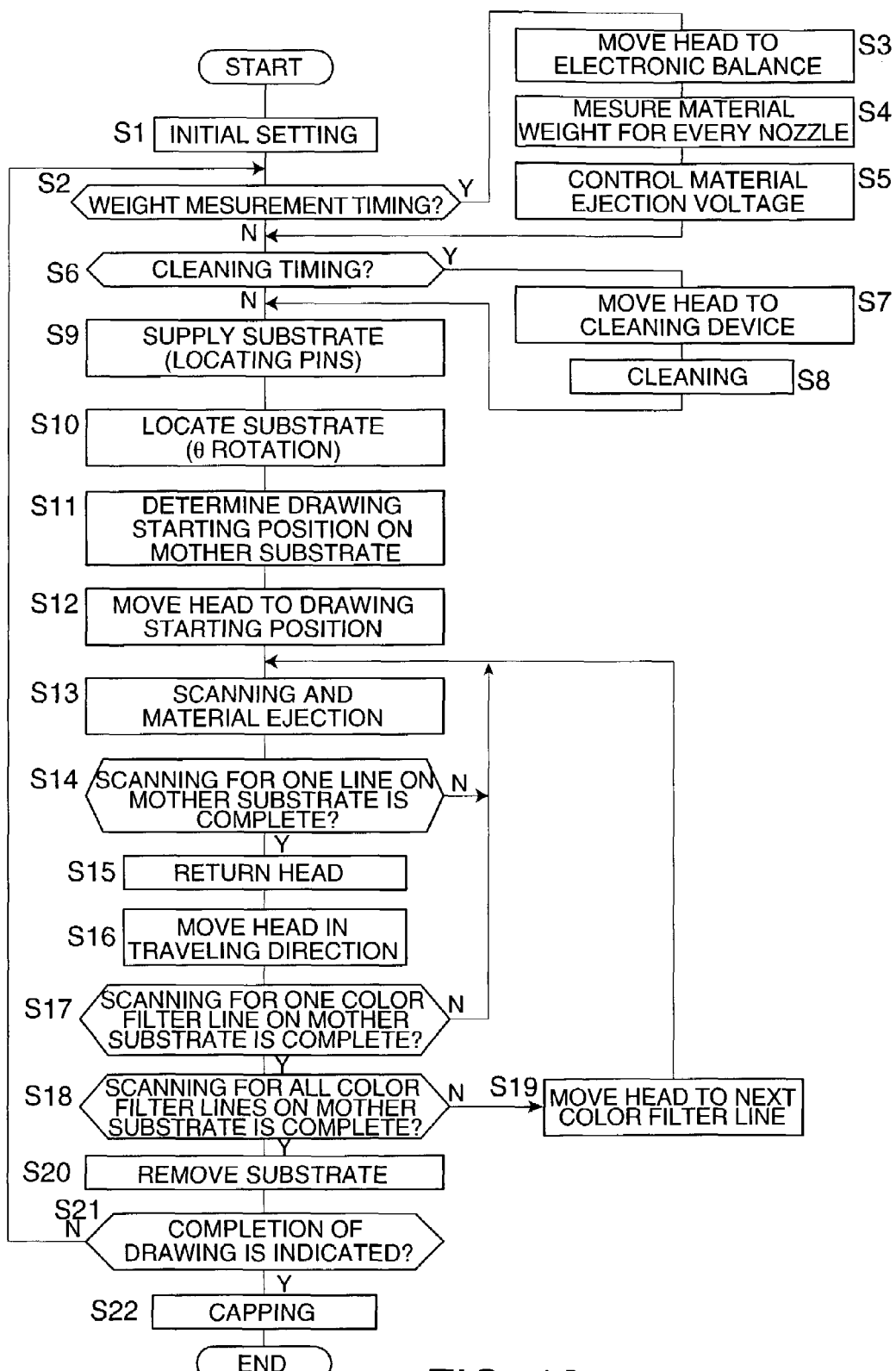
FIG. 19 is a flowchart showing control flow executed by the control system shown in FIG. 18.

After being placed at the drawing starting position in Step S12 shown in FIG. 19, the head 22 is linearly scanned in the scanning direction X at a constant speed in Step S13. During this scanning, droplets of ink are sequentially ejected from the nozzles 27 of the head 22 to the surface of the substrate 12.

When the required amount of ink is within the range in which the head 22 can supply by one scanning, the ejection amount of the ink in this step may be set so that the total required amount is ejected by one scanning. On the other hand, for example, when at most approximately one-tenth to one-half (for example, one-fourth) of the required amount is ejected by one scanning, and when the head 22 is scanned at least two times, scanning ranges in the traveling direction Y may overlap each other so that the ejection of the material is performed several times (for example, four times) over the entire region.

After finishing scanning for one line on the substrate 12 (Step S14), the head 22 is returned to the initial position by inverse movement (Step S15) and is moved in the traveling direction Y by a predetermined amount (equivalent to a predetermined moving distance) (Step S16). Next, scanning in Step S13 is again performed, the material is ejected, and hereinafter the operations described above are repeatedly performed, thereby performing scanning for a plurality of lines. When scanning for one line is complete, the head 22 may then be scanned by alternately changing the scanning direction, that is, the head 22 may be moved from that complete position in the traveling direction Y by a predetermined amount and then be scanned in the inverse direction.

The case in which a plurality of color filters are formed will be described below. When the ejection of the material is complete for one line of the color filter region on the substrate 12 (Step S17), the head 22 is moved in the traveling direction Y by a predetermined travel amount, and again Steps S13 to S16 are repeated as described above. Next, when the ejection of the material is finally complete on all lines in the color filter region on the substrate 12 (Step S18), the substrate 12 thus processed is removed outside in Step S20 by the substrate supply device 23 or another transfer mechanism. Next, unless an operator indicates the completion of the operation, the supply of the substrate 12 and the ejection of the material are repeatedly performed as described above.

When an operator indicates the completion of the operation (Step S21), the head 22 is transferred by the CPU 69 to the capping device 76 shown in FIG. 14, and the capping treatment is performed for the head 22 by the capping device 76 (Step S22).

The droplet ejecting device described above can be used for the disposition method and the manufacturing method of the present invention. However, it should be understood that the present invention is not limited thereto, and any device capable of ejecting droplets and hitting predetermined hitting positions therewith can be used.

In the present invention, a droplet ejecting head such as the head used in the droplet ejecting device described above preferably ejects a plurality of droplets sequentially while scanning in the longitudinal direction of the region or the opening portion described above (for example, when substantially rectangular regions or opening portions are provided, scanning is performed in the direction in which the long side thereof extends, and when substantially strip regions or opening portions are provided, scanning is performed in the direction in which the band shape extends). In more particular, in the first to eighth embodiments, the X direction shown in FIGS. 1 to 4 and 9 to 12 is preferably set to the scanning direction of the droplet ejecting head since the material can be efficiently disposed.

Figure 20:
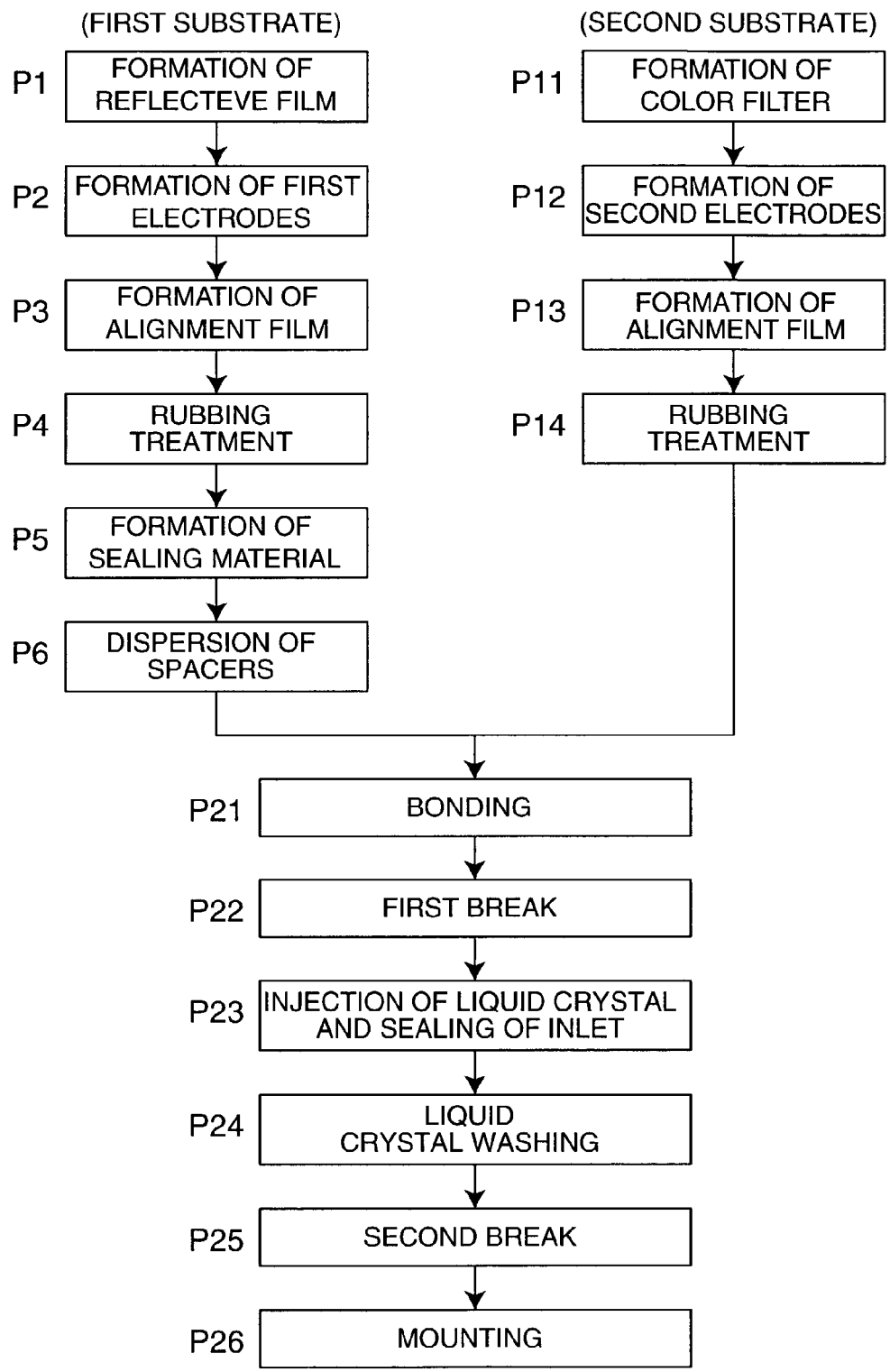
FIG. 20 is a flow chart showing one embodiment of a manufacturing method for a liquid crystal device of the present invention.
Figure 21:
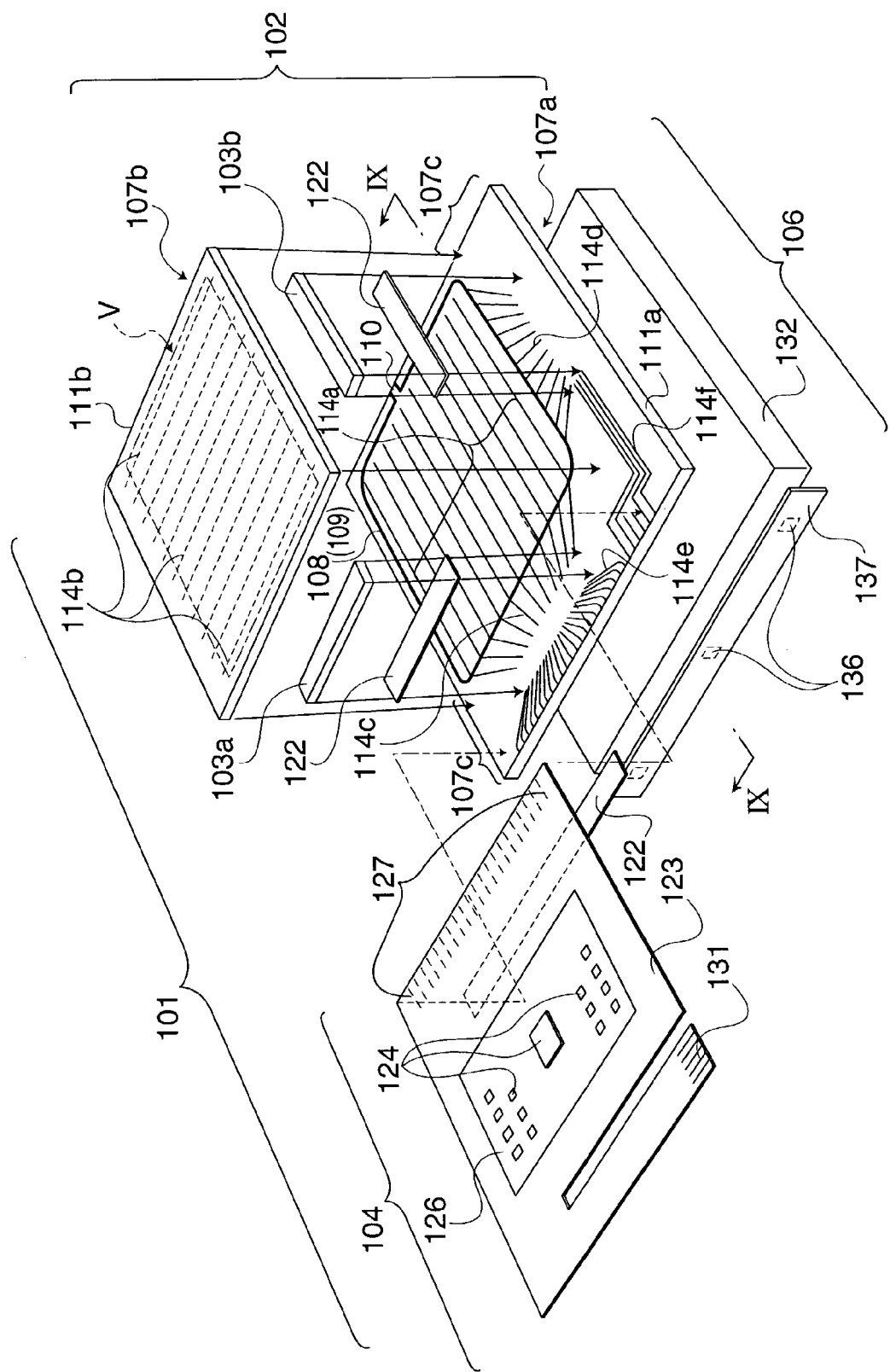
FIG. 21 is a perspective view of an example of a liquid crystal device in an exploded state, manufactured by a manufacturing method for a liquid crystal device of the present invention.
Figure 22:
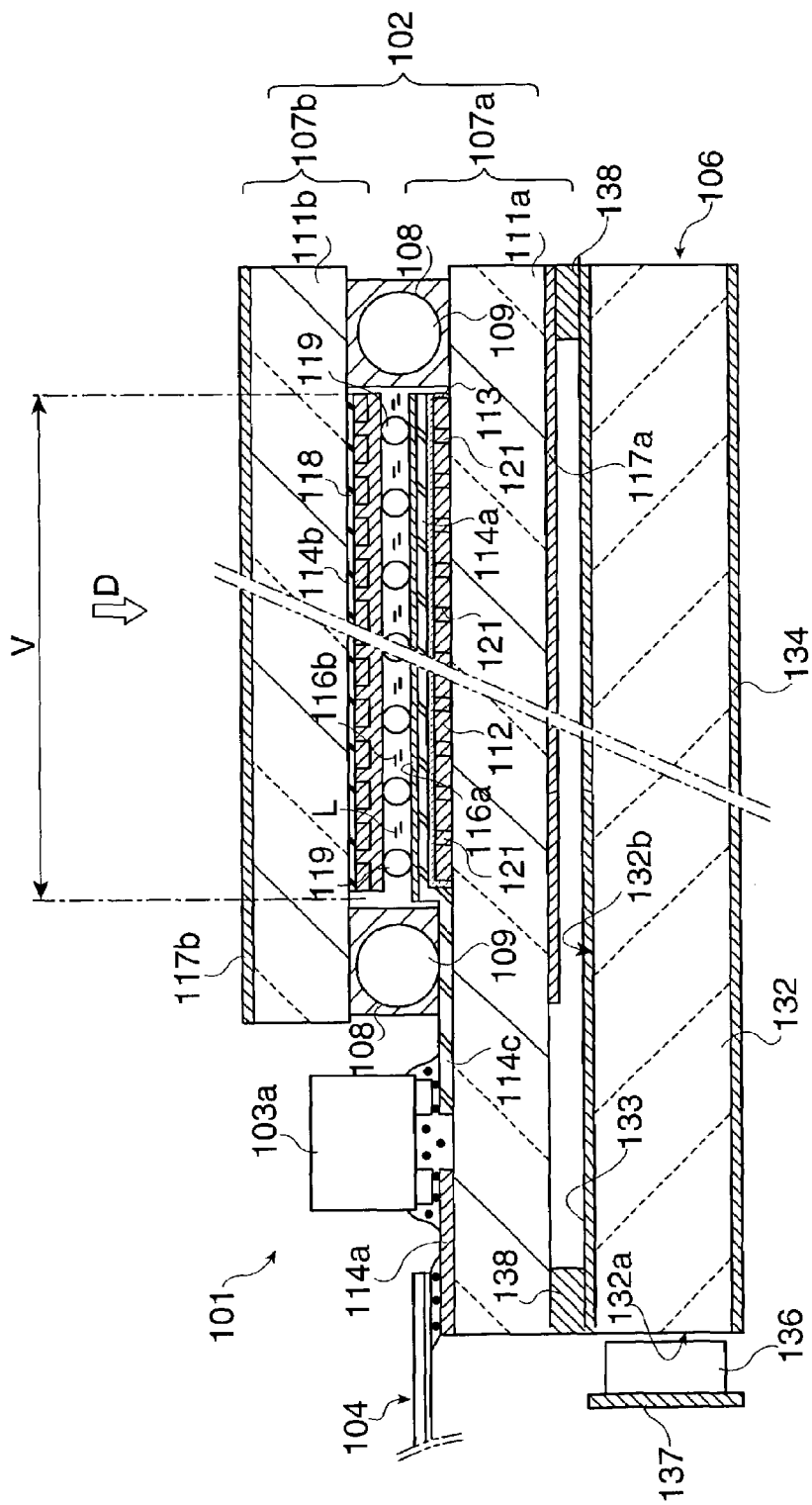
FIG. 22 is a cross-sectional view of the structure of the liquid crystal device taken along the line IX-IX shown in FIG. 21.

Next, embodiments of a display device (electrooptic device) and a manufacturing method therefor of the present invention will be described. FIG. 20 shows an embodiment of a manufacturing method for a liquid crystal device, which is an example of a manufacturing method for a display device (electrooptic device) of the present invention. In addition, FIG. 21 shows an embodiment of a liquid crystal device, which is an example of a display device (electrooptic device) manufactured by the manufacturing method described above. FIG. 22 is a cross-sectional view showing the structure of the liquid crystal device taken along the line IX-IX in FIG. 21. The structure of the liquid crystal device shown as the example will first be described with reference to FIGS. 21 and 22. Related to this, this liquid crystal device shown as the example is a transflective liquid crystal device performing full color display by a passive matrix configuration.

As shown in FIG. 21, a liquid crystal device 101 has a liquid crystal panel 102, liquid crystal driver ICs 103 a and 103b in the form of a semiconductor chip mounted on the liquid crystal panel 102, and an FPC (flexible printed circuit) 104 as a wire connection component connected to the liquid crystal panel 102. The liquid crystal device 101 is formed by providing a lighting device 106 as a backlight on the rear side of the liquid crystal panel 102.

The liquid crystal panel 102 is formed by bonding a first substrate 107a and a second substrate 107b to each other with a sealing material 108. The sealing material 108 is formed by applying an epoxy resin by screen printing or the like to the internal surface of the first substrate 107a or the second substrate 107b to form an annular shape (along the periphery thereof). In addition, in the sealing material 108, spherical or cylindrical conductors 109 composed of a conductive material are dispersed as shown in FIG. 22.

As shown in FIG. 22, the first substrate 107a has a base plate 111a composed of transparent glass or plastic. This base plate 11a is provided with a reflective film 112 on the internal surface thereof (upper side surface in FIG. 22). In addition, on the reflective film 112, an insulating film 113 is formed, and first electrodes 114a are formed thereon having a stripe pattern (see FIG. 21) when viewed as indicated by the arrow D. Furthermore, on those described above, an alignment film 116a is formed. In addition, on the external surface of the base plate 11a (lower side surface in FIG. 22), a polarizer 117a is provided by adhesion or the like.

In FIG. 21, to facilitate understanding of the arrangement of the first electrodes 114a, the gaps therebetween are significantly increased than the actual ones. Accordingly, the actual number of the first electrodes 114a formed on the base plate 111a is larger than that shown in the figure.

As shown in FIG. 22, the second substrate 107b has a base plate 111b composed of transparent glass or plastic. This base plate 111b is provided with a color filter 118 on the internal surface thereof (lower side surface in FIG. 22), and second electrodes 114 are formed thereon to be perpendicular to the first electrodes 114a and to have a stripe pattern (see FIG. 21) when viewed as indicated by the arrow D. Furthermore, on those described above, an alignment film 116b is formed. In addition, on the external surface of the base plate 111b (upper side surface in FIG. 22), a polarizer 117b is provided by adhesion or the like.

In FIG. 21, to facilitate understanding of the arrangement of the second electrodes 114b, the gaps therebetween are significantly increased than the actual ones as in the case of the first electrodes. Accordingly, the actual number of the second electrodes 114b formed on the base plate 111b is larger than that shown in the figure.

As shown in FIG. 22, in the space formed of the first substrate 107a, the second substrate 107b, and the sealing material 108, that is, in a so-called cell gap, liquid crystal L such as STN (super twisted nematic) liquid crystal is enclosed. On the internal surface of the first substrate 107a or the second substrate 107b, a great number of very small spherical spacers 119 are dispersed, and since these spacers 119 are present in the cell gap, the cell gap can be maintained to be constant.

The first electrodes 114a and the second electrodes 114b are disposed so as to extend in the directions perpendicularly intersecting each other, and the intersections thereof form a dot matrix in plan view when viewed in the direction indicated by the arrow D. Each intersection of the dot matrix described above constitutes one display dot. The color filter 118 is formed of color elements (filter elements), R (red), G (green), and B (blue), which are disposed in a predetermined pattern, such as a stripe pattern, a delta pattern, or a mosaic pattern, when being viewed in the direction indicated by the arrow D. One display dot described above corresponds to one of R, G, and B, and three display dots having R, G, and B form one pixel.

When the display dots arranged in a matrix are selectively placed in an On state, images such as letters or numerals are displayed on the external side of the second substrate 107b of the liquid crystal panel 102. The region in which images are displayed as described above is an effective display region and is indicated by the arrow V in FIGS. 21 and 22.

As shown in FIG. 22, the reflective film 112 is composed of a light reflective material such as an APC alloy or aluminum. In addition, this reflective film 112 has openings 121 disposed at positions corresponding to the display dots, which are the intersections of the first electrodes 114a and the second electrodes 114b. Hence, the openings 121 are arranged in a matrix when viewed along the arrow D in FIG. 22 as in the case of the display dots.

The first electrodes 114a and the second electrodes 114b are formed, for example, of ITO (indium tin oxide), which is a transparent electrode material. In addition, the alignment films 116a and 116b are formed by depositing a polyimide resin so as to have a uniform thickness. When rubbing treatment processes these alignment films 116a and 116b, the initial orientation of liquid crystal molecules on the surfaces of the first substrate 107a and the second substrate 107b are determined.

As shown in FIG. 21, the first substrate 107a has a large area as compared to that of the second substrate 107b, and when these substrates are bonded to each other with the sealing material 108, the first substrate 107a has a substrate protruding portion 107c protruding outside from the second substrate 107b. On this substrate protruding portion 107c, various wires such as lead wires 114c extending from the first electrodes 114a; lead wires 114d connected to the second electrodes 114b on the second substrate 107b via the conductors 109 (see FIG. 22) present in the sealing material 108; metal wires 114e connected to input bumps, i.e., input terminals, for the liquid crystal driver IC 103a; and metal wires 114f connected to input bumps of the liquid crystal driver IC 103b; are formed in predetermined patterns.

Related to this, the lead wires 114c extending from the first electrodes 114a and the lead wires 114d electrically connected to the second electrodes I 14b are formed of ITO, which is the same material as that for those electrodes described above. In addition, the metal wires 114e and 114f, which are the wires for the liquid crystal driver ICs 103a and 103b at the input side, are formed of a metal material having low electrical resistance, such as an APC alloy. This APC alloy is an alloy composed of Ag as a primary component, Pd, and Cu, and the composition thereof is 98 wt % of Ag, 1 wt % of Pd, and 1 wt % of Cu.

The liquid crystal driver ICs 103a and 103b are mounted on the surface of the substrate protruding portion 107c by adhesion thereto with ACFs (anisotropic conductive film) 122. That is, in this embodiment, the semiconductor chips are directly mounted on the substrate, that is, a so-called COG (chip on glass) type liquid crystal panel is formed. In this COG type mounting structure, with conductive particles contained in the ACFs 122, the input bumps for the liquid crystal driver ICs 103a and 103b and the metal wires 114e and 114f are electrically connected, and output bumps for the liquid crystal driver ICs 103a and 103b are electrically connected to the lead wires 114c and the 114d.

As shown in FIG. 21, the FPC 104 has a flexible resin film 123, a circuit 126 containing chip parts 124, and metal wire terminals 127. The circuit 126 is directly mounted on the surface of the resin film 123 by soldering or another electrical connection method. In addition, the metal wire terminals 127 are formed of an APC alloy, Cr, Cu, or another conductive material. A part of the FPC 104 at which the metal wire terminals 127 are formed is connected to a part of the first substrate 107a at which the metal wires 114e and 114f are formed via an ACF 122. By the conductive particles contained in the ACF 122, the metal wires 114e and 114f provided at the substrate side are electrically connected to the metal wire terminals 127 provided at the FPC side.

An external connection terminals 131 are formed at the other edge side portion of the FPC 104 and are connected to an external circuit not shown in the figure. In accordance with signals supplied from this external circuit, the liquid crystal driver ICs 103a and 103b are driven, scanning signals are supplied to one of the first electrodes 114a and the second electrodes 114b, and data signals are supplied to the other electrodes. Hence, voltage control is performed independently for the display dots arranged in the effective display region V, and as a result, the orientation of the liquid crystal L in each dot is controlled.

As shown in FIG. 22, the lighting device 106 has a light guide 132 formed of an acrylic resin or the like, a diffusion sheet provided on a light-emitting surface 132b of this light guide 132, a reflective sheet 134 provided on the light guide 132 at the side opposite to the light-emitting surface 132b, and an LED (light-emitting diode) 136 functioning as a light source.

The LED 136 is supported with an LED substrate 137, and the LED substrate 137 is held, for example, by a supporting portion (not shown) integrally formed with the light guide 132. Since the LED substrate 137 is held at a predetermined position of the supporting portion, the LED 136 is placed at a position opposing a light-introducing surface 132a which is a side surface of the light guide 132. Reference numeral 138 indicates a buffer member for reducing impact applied to the liquid crystal panel 102.

When the LED 136 emits light, the light is incident on the light-introducing surface 132a and is then guided inside the light guide 132, and after being reflected from the reflective sheet 134 and the wall of the light guide 132 and passing through the light guide, the light is finally emitted as plane light outside from the light emitting surface 132b through the diffusion sheet 133.

In the liquid crystal device 101 described above, when outside light, such as sunlight or interior light, is sufficiently bright, the outside light from the second substrate 107b side enters the liquid crystal panel 102, and after passing through the liquid crystal L, the light is reflected from the reflective film 112 and again enters the liquid crystal L. The orientation of the liquid crystal L provided between the electrodes 114a and 114b is controlled thereby for each of R, G, and B display dots. Accordingly, light passing through the liquid crystal L is modulated at each dot, and due to this modulation, letters and numerals are displayed outside the liquid crystal panel 102 by light passing through the polarizer 117b and light being unable to pass therethrough, thereby performing reflective display.

On the other hand, when the amount of outside light cannot be sufficiently obtained, after the LED 136 emits light, plane light is emitted from the light-emitting surface 132b of the light guide 132 and is then supplied to the liquid crystal L through the openings 121 formed in the reflective film 112. In this step, as in the case of the reflective display, light thus supplied is modulated at each dot by the liquid crystal L, the orientation thereof being controlled. As a result, images are displayed outside, thereby performing transmissive display.

The liquid crystal device 101 having the structure described above can be manufactured by the manufacturing method shown in FIG. 20. In this manufacturing method, sequential steps from Step P1 to P6 are steps for forming the first substrate 107a, sequential steps from Step P11 to P14 are steps for forming the second substrate 107b, and the formation of the first substrate and the formation of the second substrate are generally performed separately.

In the steps of forming the first substrate, the reflective film 112 corresponding to a plurality of liquid crystal panels 102 in size is formed by a photolithographic method or the like on a large mother base plate formed of transparent glass or plastic. In addition, on that described above, the insulating film 113 is formed by a known film-forming method (Step P1). Next, the first electrodes 114a, the lead wires 114c and 114d, and metal wires 114e and 114f are formed by a photolithographic method or the like (Step P2).

Subsequently, the alignment film 116a is formed on the first electrodes 114a by coating, printing, or the like (Step P3), and the initial orientation of the liquid crystal is determined by performing rubbing treatment for the alignment film 116a (Step P4). Next, the sealing material 108 in an annular shape is formed by screen printing or the like (Step P5), and spherical spacers 119 are dispersed thereon (Step P6), thereby forming a large first mother substrate having an area equivalent to that of a plurality of panel patterns each forming the first substrate 107a of the liquid crystal panel 102.

In addition to the steps of forming the first substrate, the steps of forming the second substrate are performed (Steps P11 to P14 in FIG. 20). A large mother base plate formed of transparent glass or plastic is prepared, and on the surface thereof, the color filter 118 equivalent to a plurality of the liquid crystal panels 102 in size is formed (Step P11). The step of forming the color filter 118 is performed by the manufacturing method shown in FIGS. 5 and 6, and after the formation of the partition or the shading layer, the filter elements R, G, and B are formed by ejecting droplets of materials for the filter elements from the nozzles 27 of the head 22 using the droplet ejecting device 16 shown in FIG. 14.

After the color filter 18 is formed on a mother substrate 12, that is, the mother base plate, the second electrodes 114b are formed by a photolithographic method. (Step P12). In addition, the alignment film 116b is formed by coating, printing, or the like. Next, rubbing treatment is performed for this alignment film 116b, so that the initial orientation of the liquid crystal is determined (Step P14). As a result, a large second mother substrate having an area equivalent to that of a plurality of panel patterns each forming the second substrate 107b of the liquid crystal panel 102.

After the large first mother substrate and second mother substrates are formed as described above, these mother substrates are aligned with each other, that is, positioning is performed, with the sealing material 108 provided between the substrates and are then bonded to each other (Step P21). As a result, a panel structure is formed which includes a plurality of the liquid crystal panels in an empty state, that is, in the state in which liquid crystal is not enclosed.

Next, at predetermined positions of this empty panel structure thus formed, scribe grooves, that is, break grooves, are formed, and in addition, break of the substrate is performed by applying stress or heat to the panel structure using the scribe grooves as a positional reference or by irradiation with light, thereby dividing the substrate (Step P22). As a result, strip empty panel structures are formed in which each liquid crystal inlet 10 (see FIG. 21) formed in the sealing material 108 of the liquid crystal panel is exposed to the outside.

Subsequently, the liquid crystal L is injected in each liquid crystal panel via the exposed liquid crystal inlet 110, and each liquid crystal inlet 110 is then sealed with a resin or the like (Step P23). In general liquid crystal injection, the inside of the liquid crystal panel is first evacuated, and liquid crystal is then injected therein using the pressure difference between an internal and an external atmosphere. For example, liquid crystal is stored in a tank, the strip empty panel and the tank in which the liquid crystal is stored are placed in a chamber, and after the chamber is evacuated, the strip empty panel is immersed into the liquid crystal placed in the chamber. Next, when the chamber is open to the atmosphere, since the inside of the empty panel is evacuated, the liquid crystal pressurized by an atmospheric pressure is injected inside the panel via the liquid crystal inlet. Subsequently, since the liquid crystal adheres to the periphery of the liquid crystal panel structure in which the liquid crystal is enclosed, cleaning treatment is performed in Step P24 for the strip panel after the liquid crystal is injected therein.

Next, after liquid crystal injection and cleaning are performed, scribe grooves are again formed at predetermined positions of the strip panel. The strip panel is then divided using the grooves as a positional reference. As a result, a plurality of the liquid crystal panels 102 are separately obtained (Step P25). As shown in FIG. 21, the liquid crystal driver ICs 103a and 103b are mounted on, the lighting device 106 is provided for, and in addition, the FPC 104 is connected to each liquid crystal panel 102 thus formed, thereby forming a targeted liquid crystal device 101 (Step P26).

The individual filter elements 3 may not be formed by one scanning of the head 22 and may be formed to have a predetermined thickness by performing material ejection N times (for example, according to the examples shown in the figures of the first to eighth embodiments, three to four times) repeatedly through a plurality of scanning operations. In this case, even when the amount of ejection material varies between the nozzles 27, variation of film thickness between the plurality of filter elements 3 can be prevented, strip color irregularities can be reduced, and as a result, optical transmission properties of the color filter can be uniform in plan view.

In addition, in the liquid crystal device of this embodiment and the manufacturing method therefor, since the filter elements 3 are formed by material ejection using the head 22 incorporated in the droplet ejecting device 16 shown in FIG. 14, a complicated step such as a step using a photolithographic method is not necessary, and the material is not unnecessarily used.

In this embodiment, as the display device, the liquid crystal device incorporating the liquid crystal panel is described. However, it should be understood that the present invention may also be applied to other electrooptic devices provided with a color filter similar to the above liquid crystal devices, such as EL devices or plasma display devices each provided with a color filter. That is, for example, in the case of EL devices, by providing a color filter having filter elements on a plane surface so as to correspond to a plurality of display dots having EL functions, the same advantages as those in the above embodiment can be obtained.

As described above, the present invention is described with reference to the preferred embodiments. However, it should be understood that the present invention is not limited to the above embodiments and may include the following modifications, and without departing from the spirit and the scope of the present invention, any other particular structures and shapes may be formed.

That is, for example, in the manufacturing device (droplet ejecting device) for the color filter shown in FIGS. 14 and 15, the mother substrate 12 is scanned by moving the head 22 in the scanning direction X, and travel operation of the head 22 for the mother substrate 12 is performed by moving the mother substrate 12 using the travel drive device 21. However, on the contrary, scanning can be performed by moving the mother substrate 12, and the travel operation can be performed by moving the head 22. In addition, the structure may also be formed in which at least one of the head 22 and the mother substrate 12 is relatively moved so that the head 22 is relatively moved along the surface of the mother substrate 12, and in the structure described above, for example, the mother substrate 12 is moved while the head 22 is not moved, or both of them are relatively moved in the directions opposite to each other.

In addition, in the embodiments described above, the head having the structure in which the material is ejected by using bending deformation of the piezoelectric element is used. However, a head having another optional structure, such as a head ejecting a material by using bubbles generated by heat, may also be used.

The droplet ejecting device 16 is not only used for the production of the color filters, liquid crystal devices, and EL devices described above but is also used for the production of various display devices having a substrate (base plate) and being formed by a step of forming a predetermined layer on a region above the substrate. As the display devices described above, for example, there may be mentioned electron emission devices such as FEDs (Field Emission Display), PDP devices (Plasma Display Devices), electrophoretic devices in which display in each pixel is performed by providing a functional liquid material containing charged particles in recess portions surrounded by walls of pixels, and applying a voltage across electrodes disposed to hold each pixel therebetween in the vertical direction for gathering the charged particles at one of the electrodes, thin Brown tubes, and CRT displays (Cathode-Ray Tubes).

The devices of the present invention are devices having substrates (base plates), such as color filters and display devices (electrooptic devices), and the methods of the present invention can be used for manufacturing processes of various devices, in which a step of ejecting the droplets 8 to the substrate (base plate) is used. For example, the present invention may be used for the following structures. As the structures, for example, there may be mentioned the structure in which metal wiring is performed by ejecting a liquid metal, conductive material, paint containing metal, or the like for forming metal wires on a printed circuit board; the structure in which optical members such as very small microlenses are formed on a substrate by material ejection; the structure in which a resist is applied only to necessary positions on a substrate; the structure in which light diffusers are formed by ejecting materials, which form convex parts or small white patterns having light diffusing properties, to a light transparent substrate such as a plastic; and the structure in which biochips are formed by ejecting specimens, antibodies, DNAs (deoxyribonucleic acids), and the like to dot-shaped positions defined on a substrate, that is, for example, hybridization is performed using fluorescent labeled probes by ejecting RNAs (ribonucleic acids) to spike spots arranged in a matrix on a DNA (deoxyribonucleic acid) chip.

In addition, the present invention may also be applied to any structures of electrooptic systems of the liquid crystal described above. As the structures, for example, there may be mentioned the structure in which the partition 6 surrounding pixel electrodes is formed, and the color filter 1 is formed by ejecting a material to recesses formed by this partition 6, such as an active matrix liquid crystal panel provided with active elements, i.e., transistors such as TFT or diodes such as TFD, in each pixel; the structure in which a material composed of a coloring material mixed with a conductive material is ejected on pixel electrodes to form the color filter 1 thereon as a conductive color filter; and the structure in which spacers are formed by ejecting particles for maintaining the gap between substrates.

In addition to the color filter 1, the present invention may be applied to any other electrooptic devices such as EL devices, and as the EL devices, a stripe type in which EL layers corresponding to three colors R, G, and B are arranged in a stripe pattern, an active matrix type in which transistors for controlling current supplied to light-emitting layers are provided in respective pixels, and a passive matrix type may also be formed.

Figure 23:
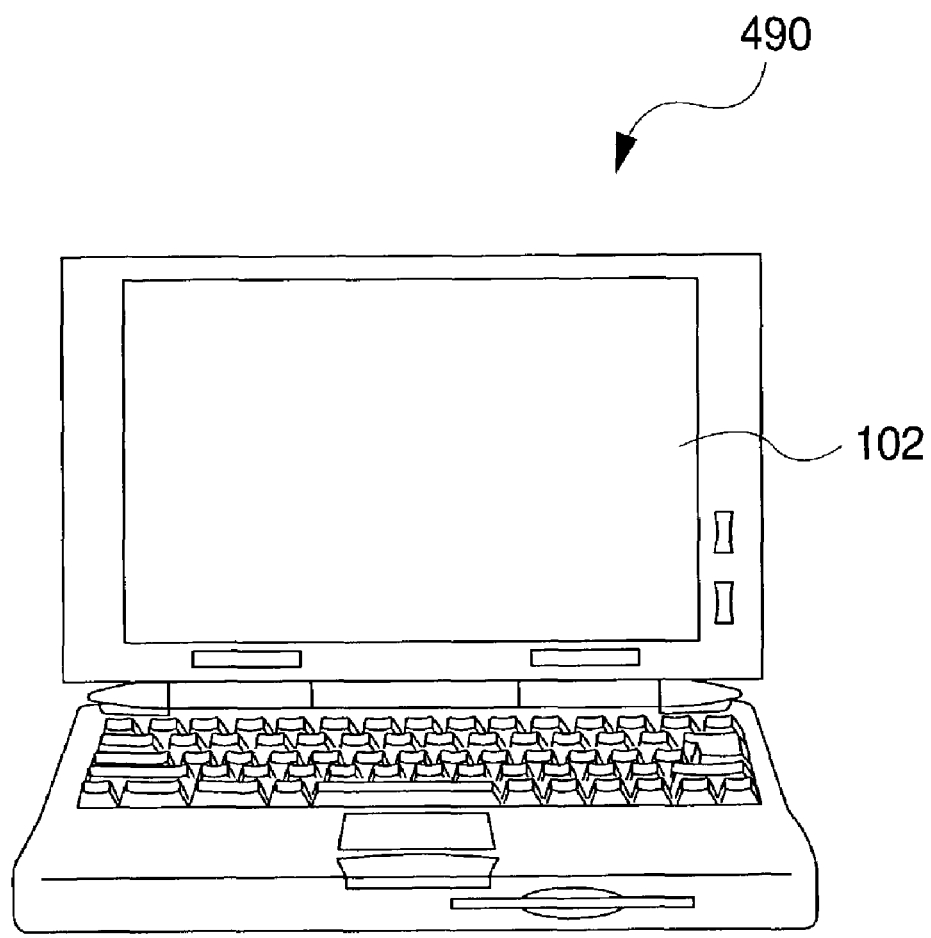
FIG. 23 is a perspective view of a personal computer which is an electronic apparatus incorporating a display device (electrooptic device)
Figure 24:
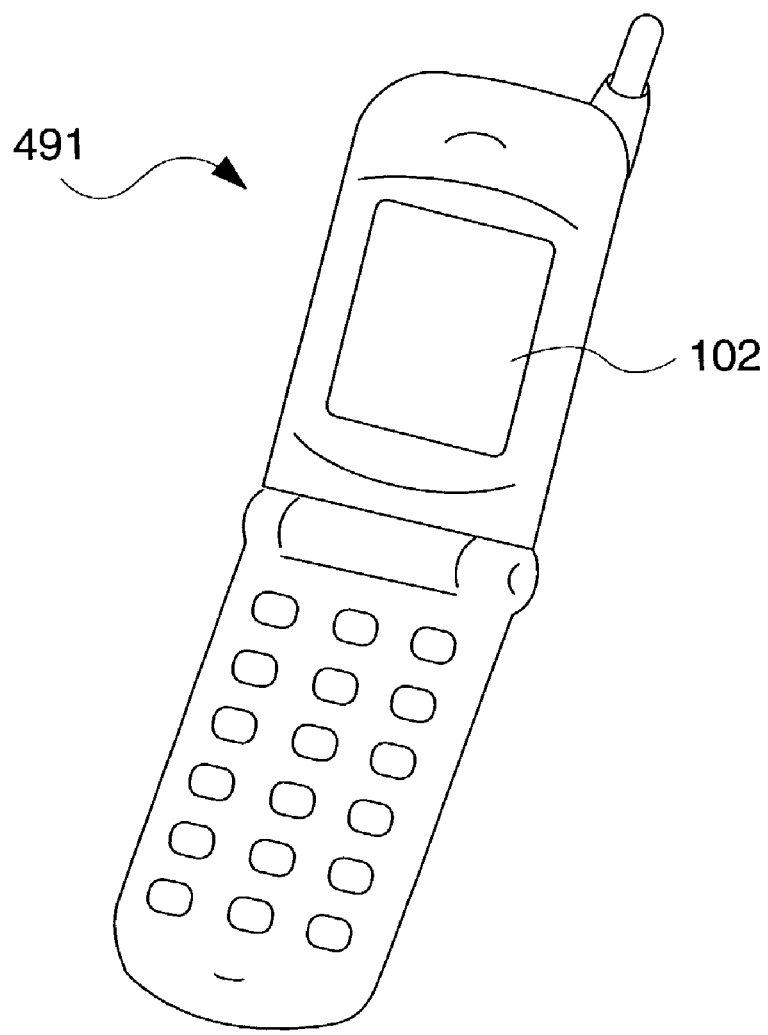
FIG. 24 is a perspective view of a mobile phone which is an electronic apparatus incorporating a display device (electrooptic device).

In addition, as electronic apparatuses incorporating the electrooptic devices of the above embodiments, in addition to a personal computer 490 shown in FIG. 23, for example, there may be mentioned portable phones, such as a mobile phone 491, as shown in FIG. 24 and a PHS (Personal Handy System), electronic notebooks, pagers, POS (Point Of Sales) terminals, IC cards, mini-disc players, liquid crystal projectors, engineering workstations (EWS), word processors, televisions, viewfinder or direct viewing type video tape recorder, electronic desk calculators, car navigation apparatuses, apparatuses provided with touch panels, watches, and game apparatuses.

As described above, according to the present invention, defects of mixing of materials and insufficient spread can be reduced. In addition, in the display device, color mixture and formation of non-colored portions can be prevented. Hence, a high quality product can be manufactured, and the structure having high density can be realized.

What is claimed is:

1. A display device, comprising:
   a substrate;
   a shade portion on the substrate and partition on the shade portion
   display elements disposed in substantially square or strip opening portions at which the shade portion is not provided, the opening portions being lined in a first direction and a second direction, the first direction being substantially perpendicular to the second direction;
   a distance between parts of the shade portion opposing each other with each of the opening portions provided therebetween being increased and decreased along an extending direction of the shade portion,
   the partition having a height, the display element having a thickness extending in a direction along the height, the thickness of the display element being lower than the height of the partition, the thickness being substantially uniform and the display element being substantially flat in the region, and
   the shade portion having properties of a liquid-repelling material, the shade portion being formed between the partition and the substrate as viewed from a cross-sectional direction perpendicular to the first direction and parallel to the second direction, and each of the partition and shade portion completely surrounding each region, wherein the display element is electroluminescent element.

2. The display device according to claim 1, the opening portions being substantially rectangular, and the distance between the parts of the shade portion being increased and decreased along a long side of said each of the opening portions.

3. The display device according to claim 1, a width of a part of the shade portion surrounding each of the opening portions being substantially constant along the extending direction of the shade portion.

4. The display device according to claim 1, a width of a part of the shade portion surrounding each of the opening portions being increased and decreased along the extending direction of the shade portion.

5. A display device comprising:
   a substrate;
   a shade portion on the substrate and partition on the shade portion
   display elements disposed in substantially square or strip opening portions at which the shade portion is not provided, the opening portions being lined in a first direction and a second direction, the first direction being substantially perpendicular to the second direction;
   a width of a part of the shade portion surrounding each of the opening portions being increased and decreased along an extending direction of the shade portion,
   the partition having a height, the display element having a thickness extending in a direction along the height, the thickness of the display element being lower than the height of the partition, the thickness being substantially uniform and the display element being substantially flat in the region, and
   the shade portion having properties of a liquid-repelling material, the shade portion being formed between the partition and the substrate as viewed from a cross-sectional direction perpendicular to the first direction and parallel to the second direction, and each of the partition and shade portion completely surrounding each region, wherein the display element is electroluminescent element.

6. The display device according to claim 4, the opening portions being substantially rectangular, and the width of the part of the shade portion being increased and decreased along a long side of said each of the opening portions.

* * * * *